US012740386B2

(12) United States Patent
Dash et al.

(10) Patent No.: US 12,740,386 B2
(45) Date of Patent: Sep. 15, 2026

(54) SEMICONDUCTOR DEVICE AND METHOD FOR FABRICATING THE SAME

(71) Applicant: TAIWAN SEMICONDUCTOR MANUFACTURING COMPANY, LTD., Hsinchu (TW)

(72) Inventors: Satyabrata Dash, Hsinchu City (TW); Jian-Sing Li, Hsinchu City (TW); Hui-Zhong Zhuang, Kaohsiung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 737 days.

(21) Appl. No.: 18/152,385

(22) Filed: Jan. 10, 2023

(65) Prior Publication Data

US 2024/0105555 A1 Mar. 28, 2024

Related U.S. Application Data

(60) Provisional application No. 63/377,197, filed on Sep. 27, 2022.

(51) Int. Cl.

| | |
|---|---|
| ***H10W 20/20*** | (2026.01) |
| ***H10D 30/01*** | (2025.01) |
| ***H10D 30/62*** | (2025.01) |
| ***H10D 84/01*** | (2025.01) |
| ***H10D 84/03*** | (2025.01) |
| ***H10D 84/83*** | (2025.01) |

(52) U.S. Cl.

CPC .......... *H10W 20/20* (2026.01); *H10D 30/024* (2025.01); *H10D 30/6211* (2025.01); *H10D 84/0149* (2025.01); *H10D 84/0151* (2025.01); *H10D 84/0158* (2025.01); *H10D 84/038* (2025.01); *H10D 84/834* (2025.01)

(58) Field of Classification Search

CPC ........... H10D 84/0158; H10D 84/0193; H10D 84/834; H10D 30/024; H10D 30/62; H10D 30/6211; H10W 20/20; H10W 20/423; H10W 20/43

See application file for complete search history.

(56) References Cited

U.S. PATENT DOCUMENTS 9,105,490 B2 8/2015 Wang et al.
9,236,267 B2 1/2016 De et al.
9,236,300 B2 1/2016 Liaw (Continued)

*Primary Examiner* — Tuan A Hoang

(74) *Attorney, Agent, or Firm* — Birch, Stewart, Kolasch & Birch, LLP

(57) ABSTRACT

A semiconductor device includes first and second gate structures, a metallization layer, and first and second tie-off contacts. The first and second gate structures extend substantially along a first direction and are aligned with each other substantially along the first direction. The metallization layer includes a Vdd line, a Vss line, metal lines between the Vdd line and the Vss line and extending substantially along a second direction different from the first direction. The first tie-off contact overlaps an intersection of the first gate structure and a first one of the Vdd line and the Vss line from a top view. The second tie-off contact overlaps an intersection of the second gate structure and a first one of the metal lines from the top view, wherein said first one of the metal lines is adjacent to a second one of the Vdd line and the Vss line.

20 Claims, 62 Drawing Sheets

(56) References Cited

U.S. PATENT DOCUMENTS

| | | | | |
|---|---|---|---|---|
| 9,406,804 | B2 | 8/2016 | Huang et al. | |
| 9,443,769 | B2 | 9/2016 | Wang et al. | |
| 9,520,482 | B1 | 12/2016 | Chang et al. | |
| 9,548,366 | B1 | 1/2017 | Ho et al. | |
| 9,576,814 | B2 | 2/2017 | Wu et al. | |
| 9,831,183 | B2 | 11/2017 | Lin et al. | |
| 9,859,386 | B2 | 1/2018 | Ho et al. | |
| 2019/0296126 | A1* | 9/2019 | Song | H10D 64/017 |
| 2020/0105671 | A1* | 4/2020 | Lai | H10W 20/427 |

* cited by examiner 100P
180
190
153
PB
171
172
112
112
110
152
104
174
134
E4
133
168E'
132
154
E3
131
173
161
162
163
164
151
165
166
167
168

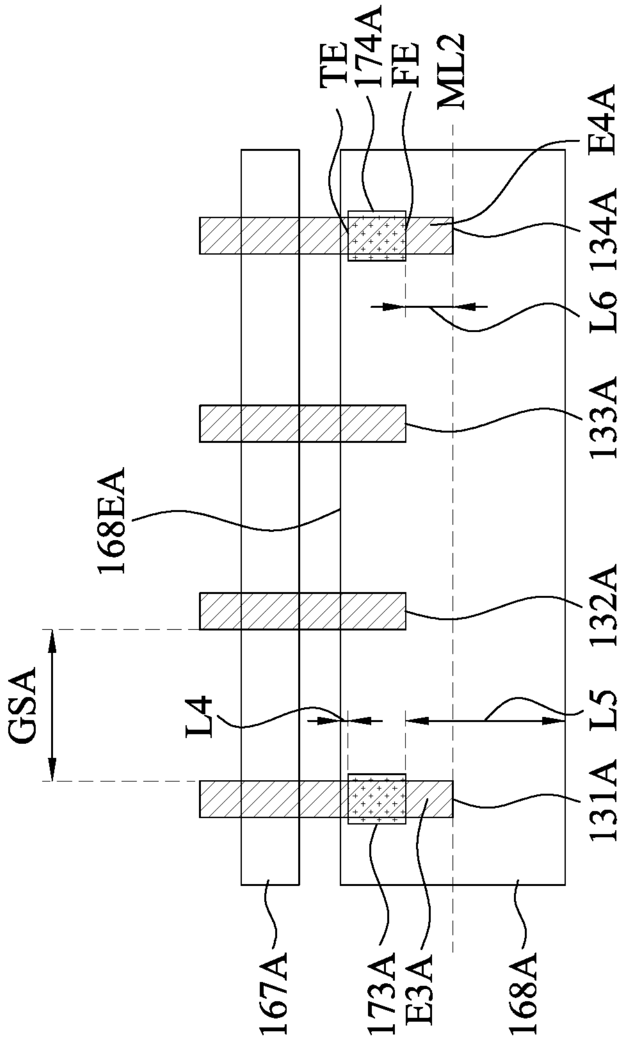
Fig. 4F
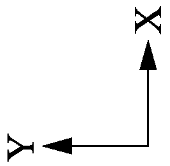

400N2

W2'
W3'
110
110
112
190
220
172
180
174
134
210
133
150
132
DB
230
171
131
173
161 162 163 164 165 166 167 168
160

110A
110A
W3A
172A
240A
250A
252A
179A
112A
174A
133A
210A
230A
132A
173A
Y1
Y1
Y2
Y2
161A
162A
163A
164A
165A
166A
167A
168A
131A
W2A
500N1A
160A

500N1A
160A
161A
162A
163A
164A
165A
166A
167A
168A
179A
112A
131A
104A
102A
500N1A
160A
161A
162A
163A
164A
165A
166A
167A
168A
171A
112A
173A
131A
104A
102A

M0
POLY
prBndry
Tie-off Contact
MD
VD
VIA
fin
M1

500N2A
110A
110A
172A
179A
112A
174A
W3A
210A
133A
132A
230A
171A
173A
W2A
161A
162A
163A
164A
165A
166A
167A
168A
131A
160A

SEMICONDUCTOR DEVICE AND METHOD FOR FABRICATING THE SAME

PRIORITY CLAIM AND CROSS-REFERENCE

This application claims priority to U.S. Provisional Application Ser. No. 63/377,197, filed Sep. 27, 2022, which is herein incorporated by reference.

BACKGROUND

As integrated circuits become smaller, layouts for the integrated circuits are changed to decrease the overall area occupied by an integrated circuit. Decreasing the area of the layout is accomplished by substituting structures of integrated circuit elements that are smaller than previous versions of integrated circuit elements. Decreasing the area of the layout is also accomplished by reducing the distance between circuit elements in a layer of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4F illustrates an enlarged view of a portion of FIG. 4A.

DETAILED DESCRIPTION

Figure 1A:
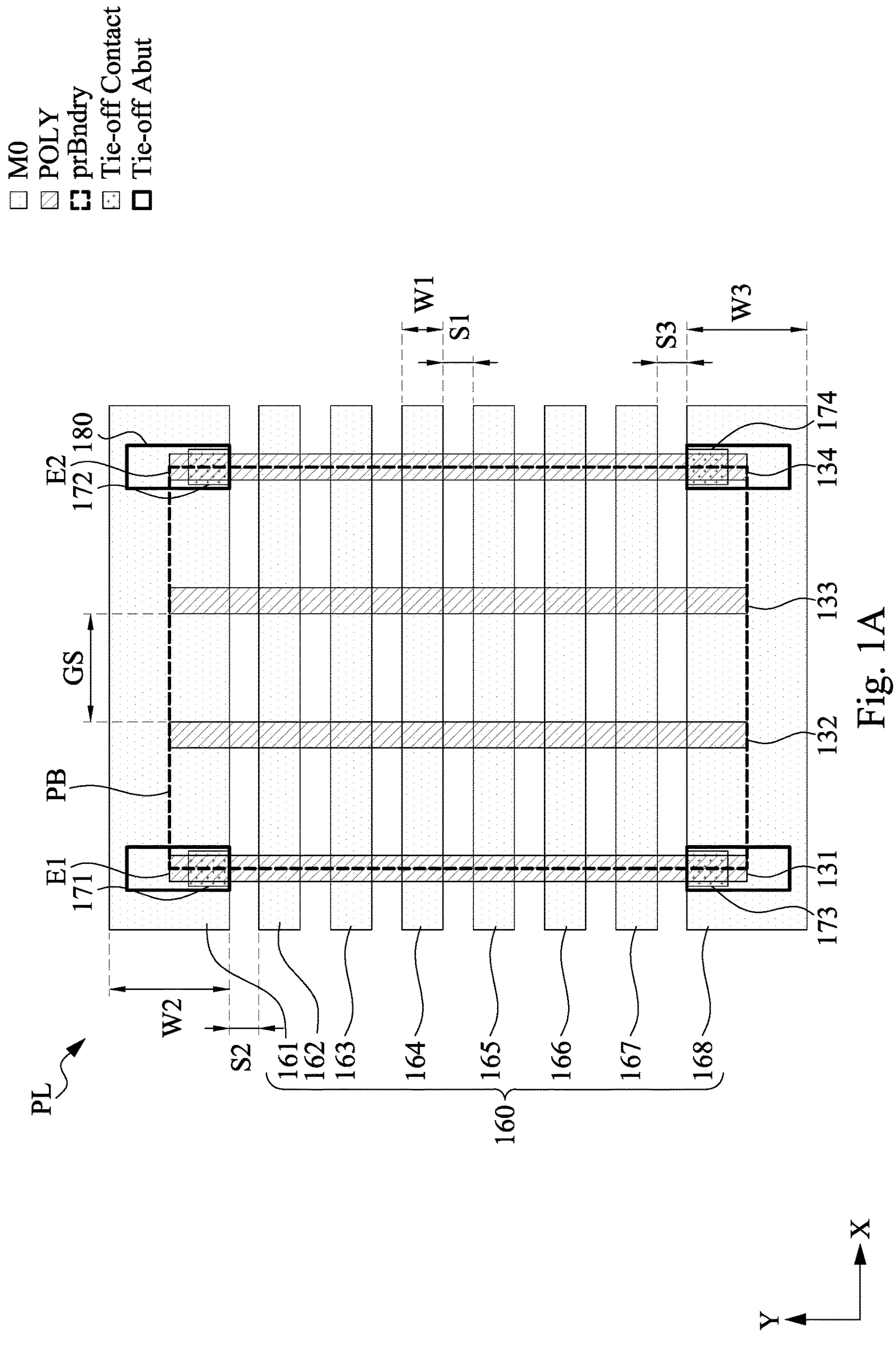
FIGS. 1A-1D illustrate a method of drawing a layout of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in various examples. This repetition is for the purpose of simplicity and clarity and does not in itself dictate a relationship between various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. Source/drain region(s) may refer to a source or a drain, individually or collectively dependent upon the context.

Standard cell layout sizes are scalably reduced and the continuous decrease in cell heights of standard cell layouts has strained the manufacturing process, especially the reduction in sizes of power rails which impact the connectivity between dummy transistors and power rails (e.g., gate tie-off structures). In order to provide better connectivity and larger power resource with smaller cell heights, an effective dummy gate tie-off structure in middle-end-of-line (MEOL) process is designed for efficient standard cell layout design.

FIGS. 1A-1D illustrate a method of drawing a layout of a semiconductor device, in accordance with some embodiments. The method of drawing the layout in FIGS. 1A-1D attempts to increase the Vdd line width and decrease the Vss line width. It is understood that additional steps may be provided before, during, and after the steps shown in FIGS. 1A-1D, and some of the steps described below can be replaced or eliminated for additional embodiments of the method. The order of the operations/processes may be interchangeable.

Reference is made to FIG. 1A. A primary layout PL of a semiconductor device is provided in accordance with some embodiments. The layout PL is depicted with a Place and Route (PR) boundary PB, which is a dummy layer for placing a standard cell, and is identified in the legend in the drawings with label "prBndry." The boundary PB may also be referred to as a cell boundary in some embodiments. The PR tools may use the boundary PB for placing the standard cells next to each other. The primary layout PL may include gate layout patterns 131, 132, 133 and 134, a metallization layout pattern 160 including metal line layout patterns 161-168, tie-off contact layout patterns 171-174, and tie-off abut layout patterns 180 in the boundary PB.

Each of the gate layout patterns 131-134 may extend substantially along the Y direction and may be separated from an adjacent one of the gate layout patterns 131-134 in the X direction by a gate-to-gate spacing GS. In some embodiments, the gate layout patterns 131-134 are also referred to as POLY layout patterns and are identified in the legend in the drawings with label "POLY." In some embodiments, the gate layout patterns 131 and 134 are dummy gates at left and right sides of the boundary PB of the layout PL. In some embodiments, the gate layout patterns 132 and 133 are active gates between the dummy gate layout patterns 131 and 134.

The metal line layout patterns 161, 162, 163, 164, 165, 166 and 168 of the metallization layout pattern 160 may extend substantially along the X direction and be spaced apart from each other along the Y direction. The metallization layout pattern 160 are identified in the legend in the drawing with label "M0." In some embodiments, the metal line layout pattern 161 at an upper side of the boundary PB of the layout PL is a Vdd line layout pattern, and the metal line layout pattern 168 at a lower side of the boundary PB of the layout PL is a Vss line layout pattern. The metal line layout patterns 162-167 are arranged between the Vdd line layout pattern 161 and the Vss line layout pattern 167.

In some embodiments, each of the metal line layout patterns 162-167 has a line width W1 measured in the Y direction. The Vdd line layout pattern 161 has a Vdd line width W2 and the Vss line layout pattern 168 has a Vss line width W3 in the Y direction. The line width W2 and the line width W3 are greater than the line width W1 in some embodiments. In the primary layout PL in FIG. 1A, the Vdd line width W2 may be substantially equal to the Vss line width W3.

In some embodiments, each of the metal line layout patterns 162-167 is separated from an adjacent one of the metal line layout patterns 162-167 in the Y direction by a line-to-line spacing S1. The Vdd line layout pattern 161 is separated from the neighboring metal line layout pattern 162 by a line-to-line spacing S2. The Vss line layout pattern 168 is separated from the neighboring metal line layout pattern 167 by a line-to-line spacing S3. The line-to-line spacings S1, S2, and S3 may be substantially the same. In some embodiments, the line-to-line spacing S1 is less than the line-to-line spacing S2/S3, which in turn allows for a close arrangement of the metal line layout patterns 162-167.

The tie-off abut layout patterns 180 are dummy layers that the PR tools will use for placing the tie-off contact layout patterns 171-174. In some embodiments, the tie-off abut layout patterns 180 are marker layers that is used to merge two tie-off contact layout patterns. The tie-off abut layout patterns 180 are identified in the legend in the drawings with label "Tie-off Abut."

The tie-off contact layout pattern 171 overlaps an intersection of the gate layout pattern 131 and the Vdd line layout pattern 161, thus providing an electrical connection between the gate layout pattern 131 and the Vdd line layout pattern 161. The tie-off contact layout pattern 172 overlaps an intersection of the gate layout pattern 134 and the Vdd line layout pattern 161, thus providing an electrical connection between the gate layout pattern 134 and the Vdd line layout pattern 161. The tie-off contact layout pattern 173 overlaps an intersection of the gate layout pattern 131 and the Vss line layout pattern 168, thus providing an electrical connection between the gate layout pattern 131 and the Vss line layout pattern 168. The tie-off contact layout pattern 174 overlaps an intersection of the gate layout pattern 134 and the Vss line layout pattern 168, thus providing an electrical connection between the gate layout pattern 134 and the Vss line layout pattern 168. Thus, stable Vdd and Vss voltage levels are provided to the gate layout patterns 131 and 134, respectively. In some embodiments, the tie-off contact layout patterns 171, 172, 173, and 174 are identified in the legend in the drawings with label "Tie-off Contact."

The gate layout pattern 131 may have a portion E1 extending beyond an edge of the tie-off contact layout pattern 171 away from the tie-off contact layout pattern 173, and the gate layout pattern 134 may have a portion E2 extending beyond an edge of the tie-off contact layout pattern 172 away from the tie-off contact layout pattern 174.

Figure 1B:
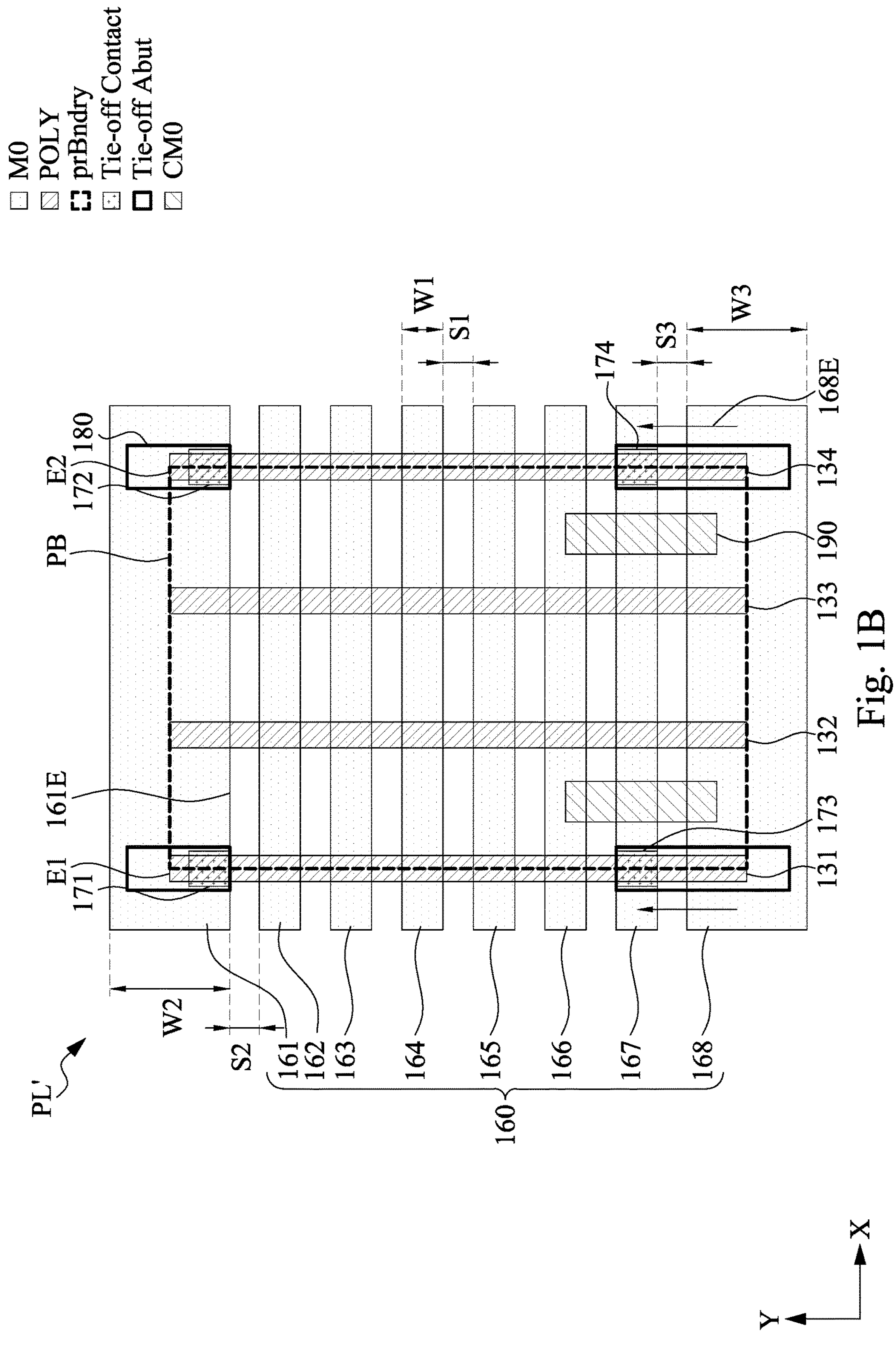

Reference is made to FIG. 1B. A first layout modification step is performed to the primary layout PL in FIG. 1A. The first layout modification step may include shifting/moving the tie-off contact layout pattern 173 and 174 from the Vss line layout pattern 168 to the metal line layout pattern 167. Arrows in FIG. 1B indicate the movement of the tie-off contact layout pattern 173 and 174. After the movement of the tie-off contact layout pattern 173 and 174, the tie-off contact layout pattern 173 overlaps an intersection of the gate layout pattern 131 and the metal line layout pattern 167, thus providing an electrical connection between the gate layout pattern 131 and the metal line layout pattern 167. The tie-off contact layout pattern 174 overlaps an intersection of the gate layout pattern 134 and the metal line layout pattern 167, thus providing an electrical connection between the gate layout pattern 134 and the metal line layout pattern 167.

In some embodiments, the first layout modification step may further include adding cut-metal-line layout patterns 190 into the layout. The cut-metal-line layout patterns 190 may extend substantially along the Y direction across one or more the metal line layout patterns 161-168. The cut-metal-line layout patterns 190 represent cut sections or patterning area where the metal line layout patterns 161-168 are removed for electrical disconnections according to the integrated circuit design. In some embodiments, the cut-metal-line layout patterns 190 extend substantially along the Y direction, and thus the cut-metal-line layout patterns 190 and the gate layout patterns 131-134 are parallel with each other. In some embodiments, the cut-metal-line layout patterns 190 are used to indicate cut sections of M0 lines and are identified in the legend in the drawings with label "CM0." In the present embodiments, the cut-metal-line layout patterns 190 may break a metal line of a semiconductor device (e.g., the metal line 167A in FIG. 2A) into discontinuous metal lines (e.g., the metal lines 167A1, 167A2, and 167A3 in FIG. 2A). After the first layout modification step, the primary layout PL may be referred to as layout PL'.

Figure 1C:
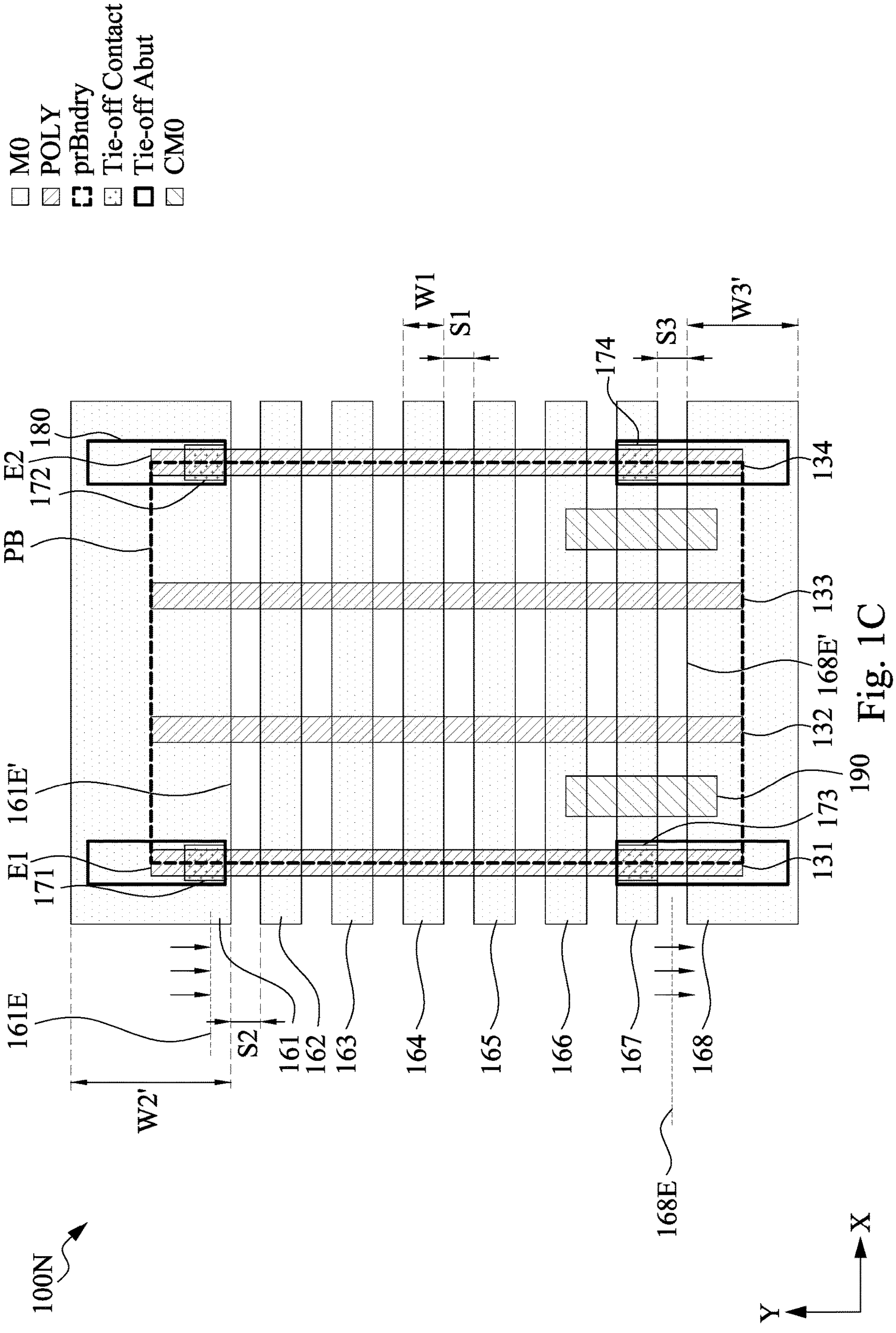

Reference is made to FIG. 1C. A second layout modification step is performed to the layout PL' in FIG. 1B. The second layout modification step includes increasing the width of the Vdd line layout pattern 161, decreasing the width of Vss line layout pattern 168, and shifting/moving the metal line layout pattern 162-167 toward the Vss line layout pattern 168 away from the Vdd line layout pattern 161. Arrows in FIG. 1C indicate the direction and amount of the increase in width of the Vdd line layout pattern 161 and the width decrease of Vss line layout pattern 168. The dashed lines at start point of the arrows indicate the positions of the edges 161E and 168E of the Vdd line layout pattern 161 and the Vss line layout pattern 168 in FIG. 1B. The second layout modification step is performed to move both the edge 161E of the Vdd line layout pattern 161 and the edge 168E of the Vss line layout pattern 168 downwards to be edges 161E' and 168E' as indicated by the arrows.

In FIG. 1C, the amount of increase in the width of the Vdd line layout pattern 161 is substantially the same as the amount of decrease in the width of the Vss line layout pattern 168. Thus, the second layout modification step is performed such that line-to-line spacing S1-S3 and the width of the metal line layout pattern 162-167 may remain substantially the same after the modifications. Through the second layout modification step, the width of the Vdd line layout pattern 161 is increased from the width W2 to the width W2', and the width of the Vss line layout pattern 168 is decreased from the width W3 to the width W3'. As a result, the Vdd line width W2' is greater than the Vss line width W3'.

The second layout modification step may also include moving/shifting the tie-off contact layout patterns 171 and 172 downward, thereby enlarging the areas of the portions E1 and E2 extending beyond the edges of the tie-off contact layout patterns 171 and 172. After moving the tie-off contact layout patterns 171 and 172, the tie-off contact layout patterns 171 and 172 may have a minimal enclosure from the Vdd edge 161E'. The layout PL' may be referred to as layout 100N after the second layout modification step.

The layout 100N is used to manufacture a semiconductor device 100NA in FIGS. 2A-2E. In the present embodiments, the gate layout patterns 131-134 of the layout 100N define corresponding gate structures 131A, 132A, 133A and 134A of the semiconductor device 100NA (referring to FIGS. 2A-2E). The metallization layout pattern 160 (e.g., metal line layout patterns 161-168) of the layout 100N define corresponding metallization layer 160 (e.g., metal lines 161A-168A) of the semiconductor device 100NA (referring to FIGS. 2A-2E). The tie-off contact layout patterns 171, 172, 173, and 174 of the layout 100N define corresponding tie-off contacts 171A, 172A, 173A, and 174A of the semiconductor device 100NA (referring to FIGS. 2A-2E).

Figure 1D:
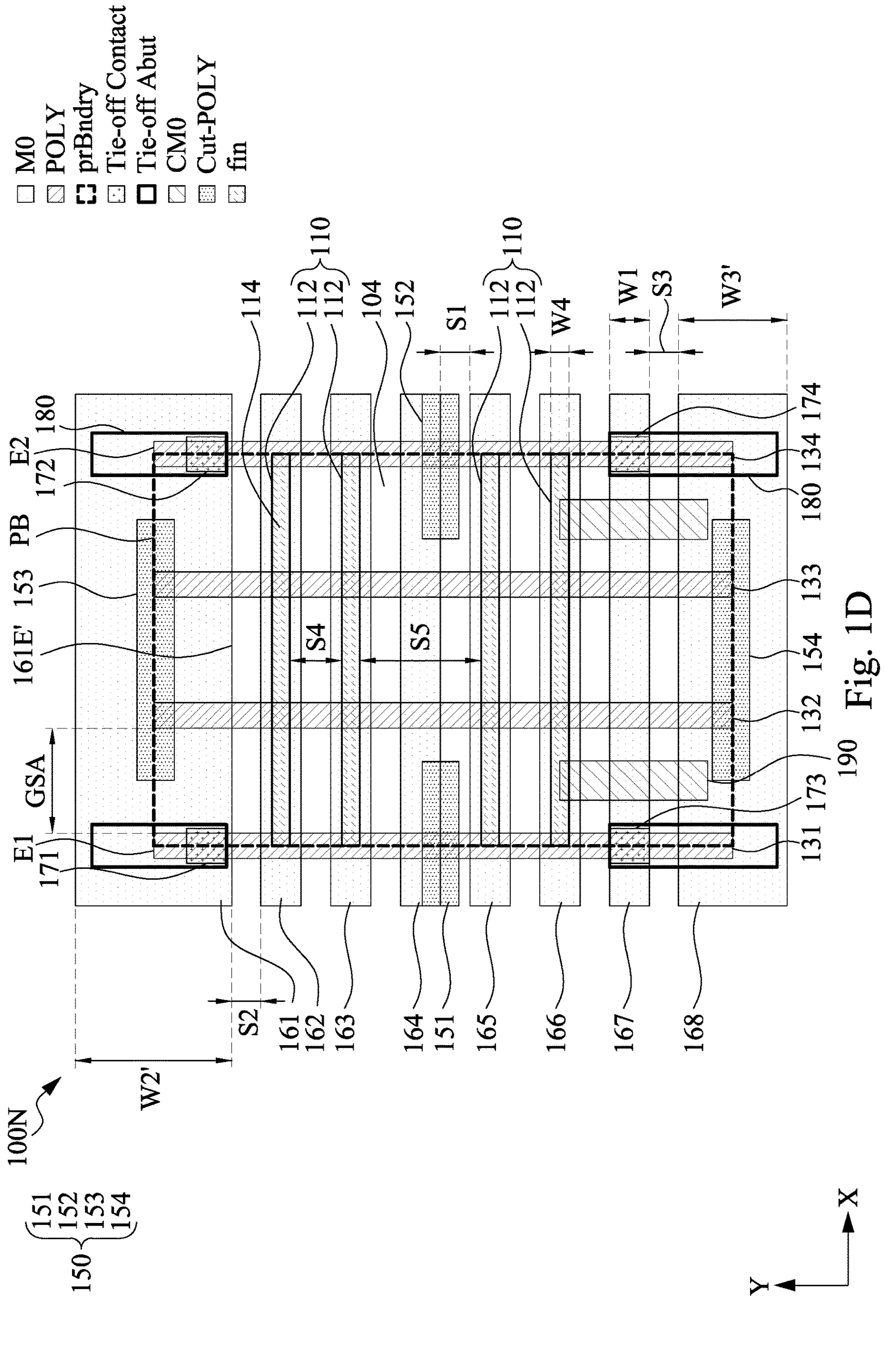

The layout 100N may further include fin group layout patterns 110 and cut-gate layout patterns 150 (e.g., cut-gate layout patterns 151-154), as shown in FIG. 1D. The fin group layout patterns 110 define corresponding fin group regions 110A of the semiconductor device 100NA (referring to FIGS. 2A-2E). The fin group layout patterns 110 extend substantially along a first direction of the layout 100N, e.g., the direction X, and spaced from each other substantially along a second direction of the layout 100N, e.g., the direction Y. In some embodiments, the direction Y is perpendicular to the direction X.

Each of the fin group layout patterns 110 may include plural fin layout patterns 112 (for example, two first fin layout patterns) extending substantially along the X direction and spaced apart from each other by a fin-to-fin spacing S4 substantially along the Y direction, and each fin layout pattern 112 has a fin width W4 measured in the Y direction. In some embodiments, the fin width W4 may be less than the line width W1 of the metal line layout patterns 162-167. The fin group layout patterns 110 are separated from each other in the Y direction by a fin-free region S5, which is larger than the fin-to-fin spacings S4. The fin layout patterns 112 define corresponding fins 112A of the semiconductor device 100NA (referring to FIGS. 2A-2E). The fin layout patterns 112 are identified in the legend in the drawings with label "fin." The fin layout patterns 112 each include source region layout patterns and drain region layout patterns (collectively referred to as source/drain region layout patterns 114) that define corresponding first source/drain regions 114A of the semiconductor device 100NA (referring to FIGS. 2A-2E).

In some embodiments, the fin layout patterns 112 are separated from each other and other components of the layout 100N on the same layout level by an isolation structure layout pattern 104. The isolation structure layout pattern 104 defines a corresponding isolation structure 104A of the semiconductor device 100NA (referring to FIGS. 2A-2E).

In some embodiments, each of the gate layout patterns 131-134 extends substantially along the Y direction across the fin group layout patterns 110 (e.g., fin layout patterns 112). In the present embodiments, the gate layout patterns 131 and 134 are placed at the end of the fin group layout patterns 110 (e.g., fin layout patterns 112), and thus form dummy devices. The gate layout patterns 132 and 133 between the gate layout patterns 131 and 134 form active devices. For example, the gate layout patterns 132 and 133 and corresponding source/drain region layout patterns 114 on opposite sides of the gate layout patterns 131-134 form a plurality of FETs.

The cut-gate layout patterns 151-154 may extend substantially along the X direction across the gate layout patterns 131-134. The cut-gate layout patterns 151-154 represent cut sections or patterning area where the gate layout patterns 131-134 are removed for electrical disconnections according to the integrated circuit design. The cut-gate layout patterns 151-154 extend substantially along the X direction, and thus the cut-gate layout patterns 151-154 and the fin layout patterns 112 are parallel with each other. In some embodiments, the cut-gate layout patterns 151-154 are used to indicate cut sections of the gate layout patterns 131-134 and are identified in the legend in the drawings with label "Cut-POLY."

In the present embodiments, the cut-gate layout pattern 151 cuts the gate layout pattern 131 into two separate portions, and the Vdd and Vss voltage levels are provided to these separate portions of the gate layout pattern 131, respectively. Similarly, the cut-gate layout pattern 152 cuts the gate layout pattern 134 into two separate portions, and the Vdd and Vss voltage levels are provided to these separate portions of the gate layout pattern 134, respectively.

Figure 2A:
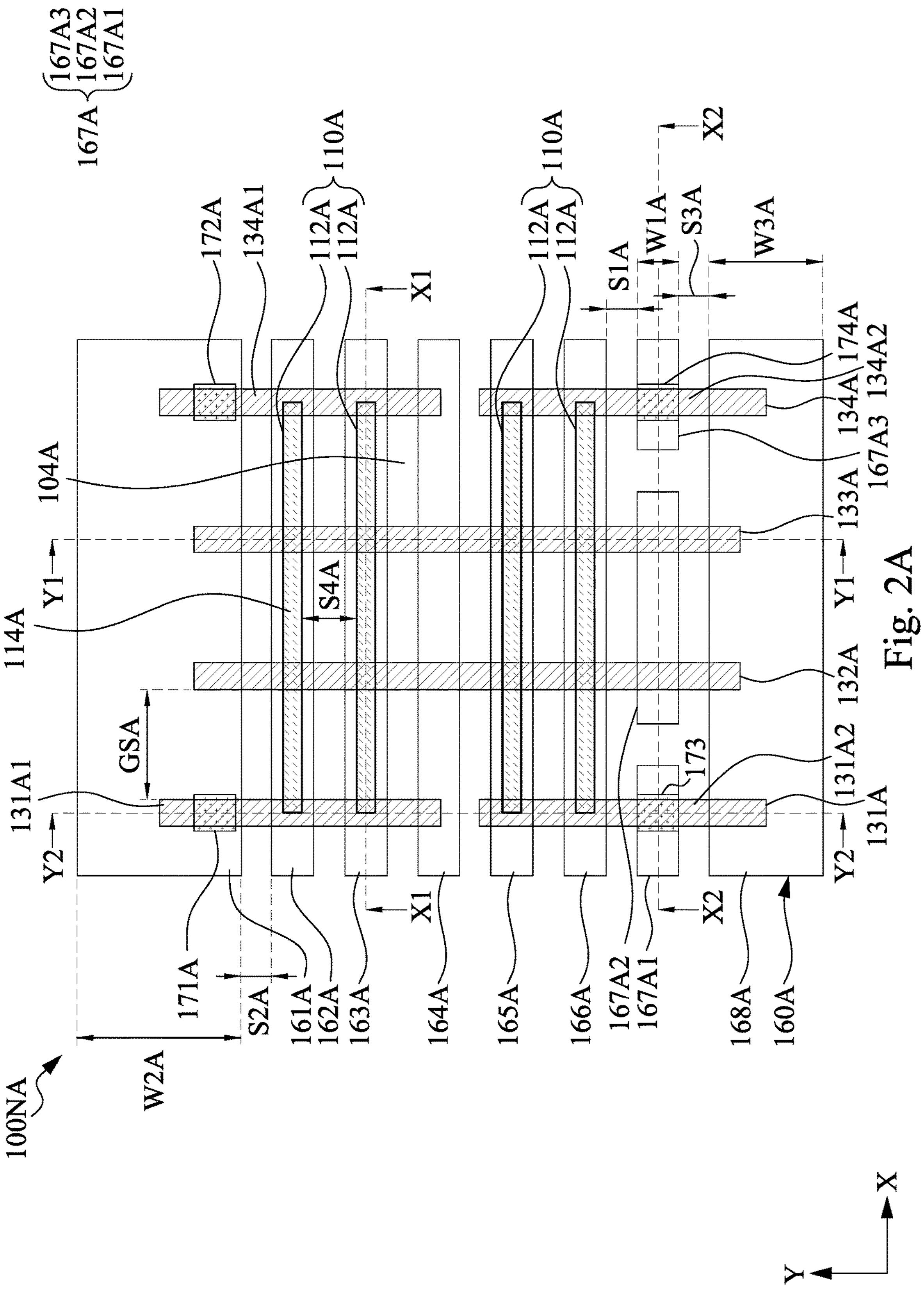
FIGS. 2A-2E represent views of a semiconductor device fabricated using the layout of FIG. 1D, in accordance with some embodiments.
Figure 2B:
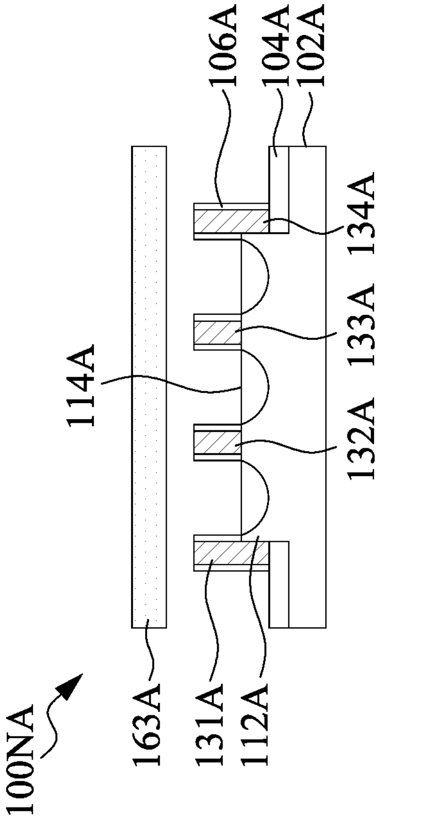
Figure 2C:
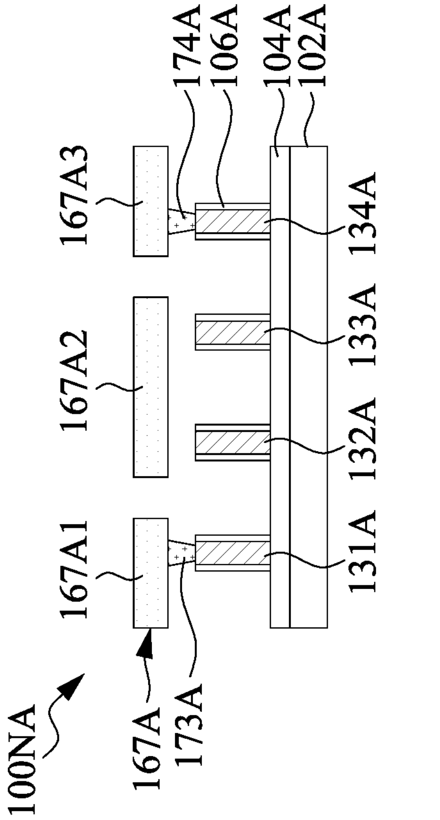
Figure 2D:
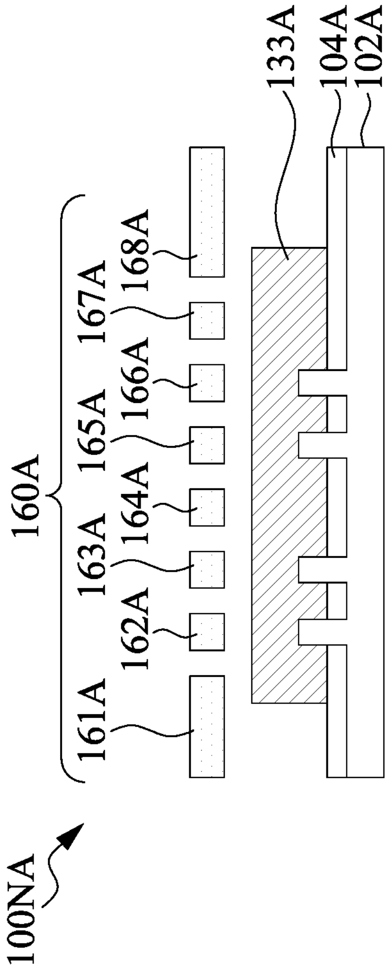
Figure 2E:
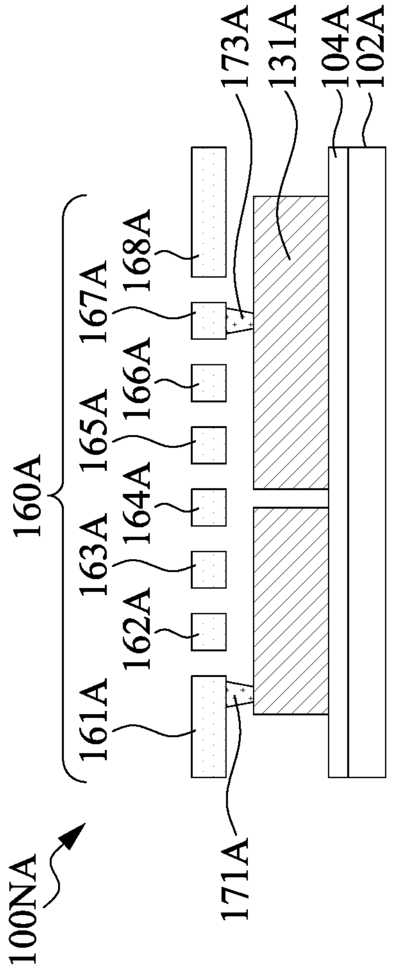

FIGS. 2A-2E represent views of a semiconductor device 100NA fabricated using the layout 100N in accordance with some embodiments, and thus the semiconductor device 100NA inherits geometry of all patterns in the layout 100N, as described. FIG. 2A is a top view of the semiconductor device 100NA. FIG. 2B is a cross-sectional view of the semiconductor device 100NA in FIG. 2A taken along line X1-X1. FIG. 2C is a cross-sectional view of the semiconductor device 100NA in FIG. 2A taken along line X2-X2. FIG. 2D is a cross-sectional view of the semiconductor device 100NA in FIG. 2A taken along line Y1-Y1. FIG. 2E is a cross-sectional view of the semiconductor device 100NA in FIG. 2A taken along line Y2-Y2. The semiconductor device 100NA is a non-limiting example for facilitating the illustration of the present disclosure.

Referring to FIGS. 2A-2E, the semiconductor device 100NA includes a substrate 102A over which various elements of the semiconductor device 100NA are formed. The substrate 102A includes, but is not limited to, a bulk silicon substrate, a silicon-on-insulator (SOI) substrate, or a silicon geranium substrate. Other semiconductor materials including group III, group IV, and group V elements are within the scope of various embodiments.

The semiconductor device 100NA further includes fin groups 110A extending upwardly from the substrate 102A, and gate structures 131A, 132A, 133A and 134A extending substantially along the Y direction across the fin groups 110A. Each of the fin groups 110A may include two fins 112A arranged at a fin-to-fin spacing S4. In some embodiments, the fin-to-fin spacing S4A is comparable to the fin-to-fin spacing S4 of the first fin layout patterns 112 in the layout 100N.

The fins 112A may be formed by patterning the semiconductor substrate 102A using photolithography and etching techniques, and thus the resulting fins 112A are formed of semiconductor materials as well. Therefore, these fins can be interchangeably referred to as semiconductor fins in the present disclosure. For example, a spacer image transfer (SIT) patterning technique may be applied/employed to form the semiconductor fins. In this method, a sacrificial layer is formed over the substrate 102A and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fins 112A by etching trenches into the substrate 102A using, for example, reactive ion etching (RIE).

The fins 112A are electrically isolated from each other by an isolation structure 104A. In some embodiments, the isolation structure 104A is a shallow trench isolation (STI) structure including a trench filled with one or more dielectric material. In some embodiments, the STI structure includes silicon dioxide, silicon nitride, silicon oxynitride, or any other suitable insulating materials.

The STI structure 104A may be formed by depositing one or more dielectric materials (e.g., silicon oxide) to completely fill the trenches around the fins 112A and then recessing the top surface of the dielectric materials to fall below tops (or edges) of the fins 112A. The dielectric materials of the STI structure 104A may be deposited using a high-density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI structures 104A may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI structure 104A such that upper portions of the fins 112A protrude from surrounding insulating STI structure 104A. In some cases, the patterned hard mask that is used to form the fins 112A may also be removed by a suitable planarization process.

The fins 112A each include a plurality of source/drain regions 114A. In some embodiments, the source/drain regions 114A may be doped semiconductor regions located on opposite sides of the corresponding gate structures 131A-134A. In some embodiments, the source/drain regions 114A include p-type dopants, such as boron for formation of p-type FETs. In other embodiments, the source/drain regions 114A include n-type dopants, such as phosphorus for formation of n-type FETs.

In some embodiments, the source/drain regions 114A may be epitaxially grown regions. For example, gate spacers 106A may be formed alongside dummy gate structures (which will be replaced with the final gate structures 131A-134A) by depositing a spacer material and anisotropically etching the spacer material. Subsequently, the source/drain regions 114A may be formed self-aligned to the gate spacers 106A by etching the fins 112A to form recesses at first, and then depositing a crystalline semiconductor material in the recess by a selective epitaxial growth (SEG) process that may fill the recesses in the fins 112A, which may extend further beyond the original surface of the fins 112A to form raised source/drain epitaxy structures in some embodiments. The crystalline semiconductor material may be an element (e.g., Si, or Ge, or the like), or an alloy (e.g., $Si_{1-x}C_x$, or $Si_{1-x}Ge_x$, or the like). The SEG process may use any suitable epitaxial growth method, e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into source/drain regions 114A either in situ during SEG, or by an ion implantation process performed after the SEG, or by a combination thereof.

The gate structures 131A-134A extend substantially along the Y direction across the fins 112A. One of the gate structures 131A-134A is spaced apart from an adjacent gate structure 131A-134A in the X direction by a gate-to-gate spacing GSA. The gate-to-gate spacing GSA is greater than the fin-to-fin spacings S4A. The gate-to-gate spacing GSA is comparable to the gate-to-gate spacing GS of the gate layout patterns 131-134 in the layout 100N. In some embodiments, the gate structures 131A-134A are high-k metal gate (HKMG) structures that may be formed using a gate-last process flow (interchangeably referred to as gate replacement flow). In a gate-last process flow, a sacrificial dummy gate structure (e.g., polysilicon gate, not shown) is formed after forming the STI structure 104A. The dummy gate structure may comprise a dummy gate dielectric, a dummy gate electrode (e.g., polysilicon gate), and a hard mask. First a dummy gate dielectric material (e.g., silicon oxide, silicon nitride, or the like) may be deposited. Next a dummy gate material (e.g., polysilicon) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask layer and transferring that pattern to the dummy gate dielectric and dummy gate material using suitable photolithography and etching techniques. The dummy gate structure may extend along multiple sides of the protruding fins 112A and extend between the fins 112A over the surface of the STI structure 104A. After forming the source/drain regions 114A, the dummy gate structure is replaced by the HKMG gate structures 131A-134A as illustrated in FIGS. 2A-2E. In some embodiments, the high-k/metal gate structures 131A and 134A may be referred to as dummy high-k/metal gate structure. The materials used to form the dummy gate structure and hard mask may be deposited using on of the suitable methods, such as CVD, plasma-enhanced CVD (PECVD), atomic layer deposition (ALD), plasma-enhanced ALD (PEALD) or the like, or by thermal oxidation of the semiconductor surface, or combinations thereof.

In some embodiments, each of the HKMG gate structures 131A-134A includes a high-k gate dielectric material and one or more gate metals. Exemplary high-k gate dielectric materials include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, and/or combinations thereof. In some embodiments, the gate dielectric includes a stack of an interfacial dielectric material and a high-k dielectric material. In some embodiments, the interfacial dielectric material includes silicon dioxide. The gate metal(s) is formed over the gate dielectric. Exemplary gate metal(s) includes, for example, copper (Cu), aluminum (Al), titanium (Ti), titanium nitride (TiN), tantalum (Ta), tantalum nitride (TaN), tantalum carbide (TaC), tantalum silicon nitride (TaSiN), tungsten (W), tungsten nitride (WN), or molybdenum nitride (MoN).

In the present embodiments, the gate structure 131A includes separated gate structures 131A1 and 131A2, and the gate structure 134A includes separated gate structures 134A1 and 134A2. The gate structures 131A1 and the gate structures 134A1 are at opposite sides of an upper fin group 110A (e.g., the upper three fins 112A). The gate structures 131A2 and the gate structures 134A2 are at opposite sides of a lower fin group 110A (e.g., the lower three fins 112A). In some embodiments, the isolation structure 104A has first and second portions respectively at opposite sides of the upper fin group 110A (e.g., the upper three fins 112A), and the gate structures 131A1 and the gate structures 134A1 are in contact with the first and second portions of the isolation structure 104A. In some embodiments, the isolation structure 104A has third and fourth portions respectively at opposite sides of the lower fin group 110A (e.g., the lower three fins 112A), and the gate structures 131A2 and the gate structures 134A2 are in contact with the third and fourth portions of the isolation structure 104A.

Figure 2F:
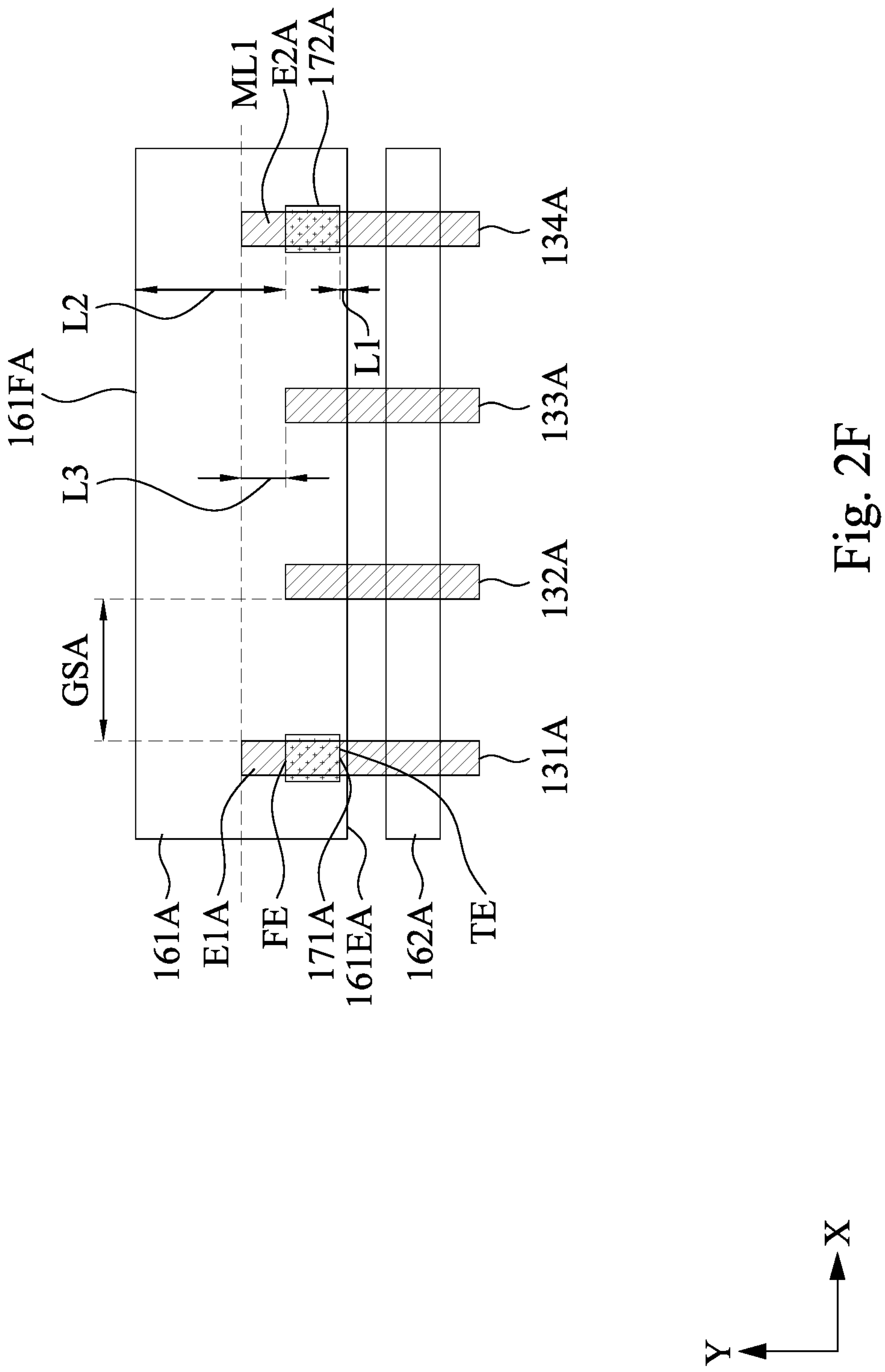
FIG. 2F illustrates an enlarged view of a portion of FIG. 2A.

The semiconductor device 100NA further includes tie-off contacts 171A, 172A, 173A, and 174A over the gate structures 131A1, 134A1, 131A2, and 134A2. In some embodiments, tie-off contacts 171A-174A include a conductive material, such as cobalt (Co), Cu, W or other suitable metals. FIG. 2F illustrates an enlarged view of a portion of FIG. 2A. Reference is made to FIGS. 2A and 2F. As the layout 100N, the gate structure 131A1 may have a portion E1A extending beyond an edge of the tie-off contact 171A away from the tie-off contact 173A, and the gate structure 134A1 may have a portion E2A extending beyond an edge of the tie-off contact 172A away from the tie-off contact 174A.

The Vdd line 161A has a line edge 161EA adjacent to the metal lines 162A-167A and a line edge 161FA away from the metal lines 162A-167A. The line edge 161EA may correspond to the line edge 161E' in the layout 100N. The tie-off contacts 171A and 172A have an edge TE adjacent to the line edge 161EA of the Vdd line 161A and an edge FE adjacent to the line edge 161FA of the Vdd line 161A. A distance L1 between the edge TE of the tie-off contacts 171A and 172A and the line edge 161EA is less than a distance L2 between the edge FE of the tie-off contacts 171A and 172A and the line edge 161FA. The distance L1 between the edge TE of the tie-off contacts 171A and 172A and the line edge 161EA is less than a distance L3 between the edge FE of the tie-off contacts 171A and 172A and an end side of the gate structure 131A/134A over the Vdd line 161A. For example, the tie-off contacts 171A and 172A are between a middle line ML1 of the Vdd line 161A and the edge 161EA of the Vdd line 161A. As the tie-off contact 171A and 172A may have a minimal enclosure (e.g., several nanometers) from the Vdd edge 161EA, the distance L1 may be in a range from about 2 nanometers to about 10 nanometers.

Reference is made back to FIGS. 2A-2D. The semiconductor device 100NA further includes a metallization layer 160A on a next level above the tie-off contacts 171A-174A. The metallization layer 160A may include metal lines 161A, 162A, 163A, 164A, 165A, 166A, 167A, and 168A. The metal lines 161A-168A extend substantially along the X direction perpendicular to the Y direction along which the gate structures 131A-134A extend. The uppermost metal line 161A shown in FIG. 2A is a Vdd line, and the lowermost metal line 168A as shown in FIG. 2A is a Vss line. The Vdd line 161A is electrically connected to a Vdd power supply (e.g., positive voltage supply), and the Vss line 168A is electrically connected to a Vss power supply (e.g., electrical ground or a negative voltage supply). The Vdd line 161A and the Vss line 168A may also be referred to as power rails or lines in the context.

In some embodiments, metal lines 161A-168A include a conductive material such as, for example, cobalt (Co), Cu, W or other suitable metals. Formation of the metal lines 161A-168A includes, for example, etching trenches in a third interlayer dielectric (ILD) layer (which is formed over the second ILD layer, not shown) over the tie-off contacts 171A-174A, depositing one or more conductive materials in the trenches, and performing a CMP process to planarize the one or more conductive materials. In some embodiments, according to the cut-metal-line layout patterns 190 in the layout 100, the metal line 167A is broken into discontinuous metal lines 167A1, 167A2, and 167A3, as illustrated in FIG. 2A.

In some embodiments, the metal lines 167A1 and 167A3 can be electrically connected to the Vss power supply (e.g., electrical ground or a negative voltage supply), for example, through Vss line 168A by suitable metal routing. The metal line 167A2 between the metal lines 167A1 and 167A3 and the metal lines 162A-166A can be used for internal routing and are biased with different voltages than the Vdd line 161A, the Vss line 168A, and the metal lines 167A1 and 167A3.

In FIG. 2A, the tie-off contact 171A overlaps an intersection of the gate structure 131A1 and the Vdd line 161A, thus providing an electrical connection between the gate structure 131A1 and the Vdd line 161A. The tie-off contact 172A overlaps an intersection of the gate structure 134A1 and the Vdd line 161A, thus providing an electrical connection between the gate structure 134A1 and the Vdd line 161A. The tie-off contact 173A overlaps an intersection of the gate structure 131A2 and the metal line 167A1, thus providing an electrical connection between the gate structure 131A2 and the metal line 167A1. The tie-off contact 174A overlaps an intersection of the gate structure 134A2 and the metal line 167A3. This provides an electrical connection between the gate structure 134A2 and the metal line 167A3. Therefore, a stable Vdd voltage level is provided to the gate structures 131A1 and 134A1, and a stable Vss voltage level is provided to the gate structures 131A2 and 134A2. Through the configuration, each of the tie-off contacts 171A, 172A, 173A, and 174A may be used with a dummy gate/transistor (e.g., one of the gate structures 131A1, 131A2, 134A1, and 134A2) to provide isolation between cells. By providing such tie-off contacts 171A, 172A, 173A, and 174A, the dummy gate/transistors (e.g., the gate structures 131A1, 131A2, 134A1, and 134A2) may remain a dummy gate instead of floating or acting as active gates.

In the present embodiments, each of the metal lines 162A-167A may have a line width W1A, and the line width W1A is comparable to the line width W1 in the layout 100N. Each of the metal lines 162A-167A may be separated from an adjacent metal line 162A-167A in the Y direction by a line-to-line spacing S1A, and the line-to-line spacing S1A is comparable to the line-to-line spacing Si in the layout 100N. The Vdd line 161A has a Vdd line width W2A and the Vss line 168A has a Vss line width W3A in the Y direction. The Vdd line width W2A is comparable to the Vdd line width W2' in the layout 100N, and the Vss line width W3A is comparable to the Vss line width W3' in the layout 100N. The Vdd line width W2A and the Vss line width W3A are greater than the line width W1A. In the depicted embodiments in FIG. 2A, the Vdd line width W2A is greater than the Vss line width W3A. In some embodiments, a line-to-line spacing S2A between the Vdd line 161A and the neighboring metal line 162A may be comparable to the line-to-line spacing S2 in the layout 100N, and a line-to-line spacing S3A between the Vss line 168A and the neighboring metal line 167A may be comparable to the line-to-line spacing S3 in the layout 100N. The line-to-line spacings S1A, S2A, S3A may be substantially equivalent. In some embodiments, the line-to-line spacings S1A, S2A, S3A may be slightly different from each other as a result of the nature of photolithography and etching processes used to fabricate the metal lines 161A-168A.

Figure 3A:
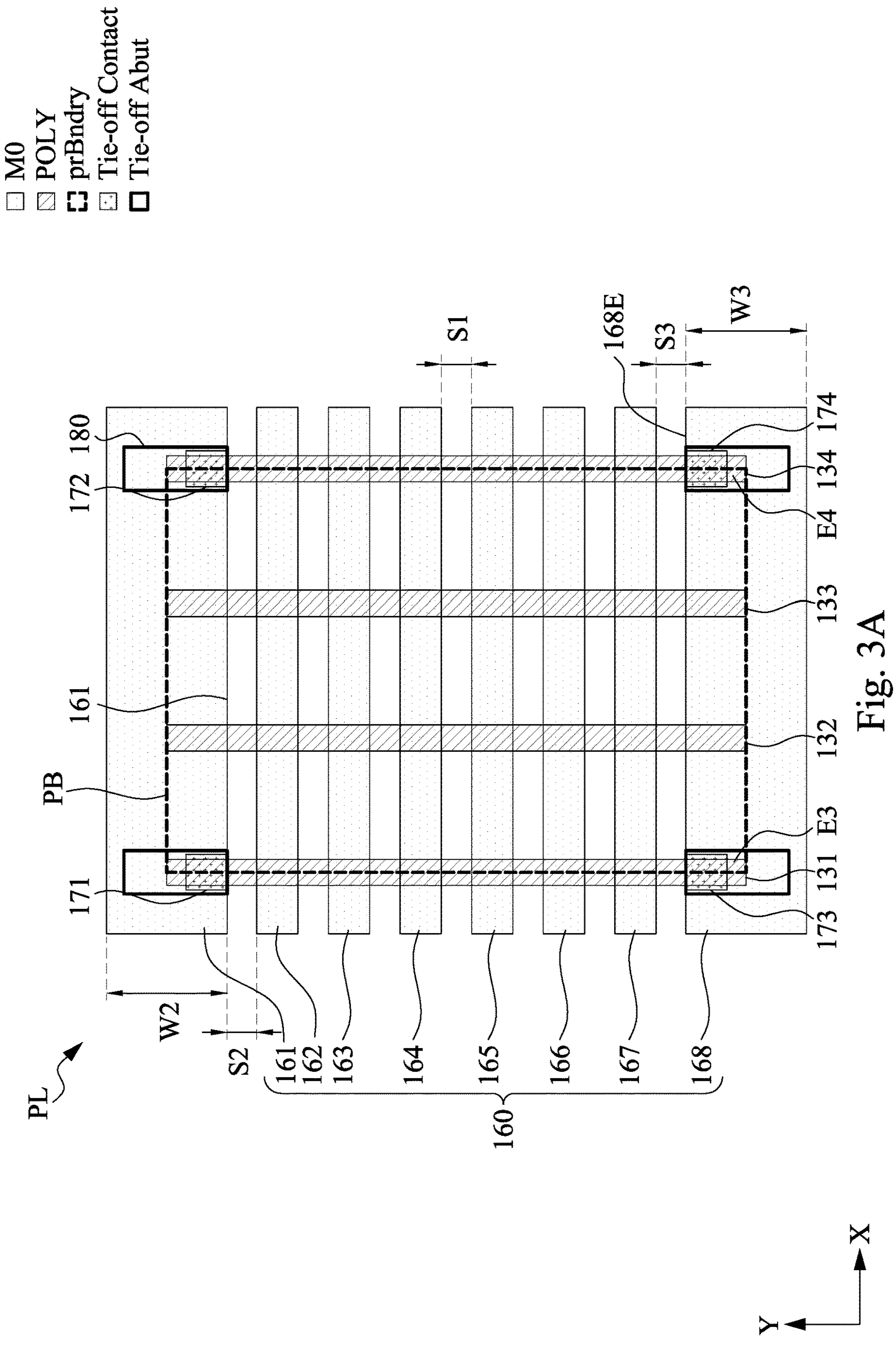
FIGS. 3A-3D illustrate a method of drawing a layout of a semiconductor device, in accordance with some embodiments.
Figure 3B:
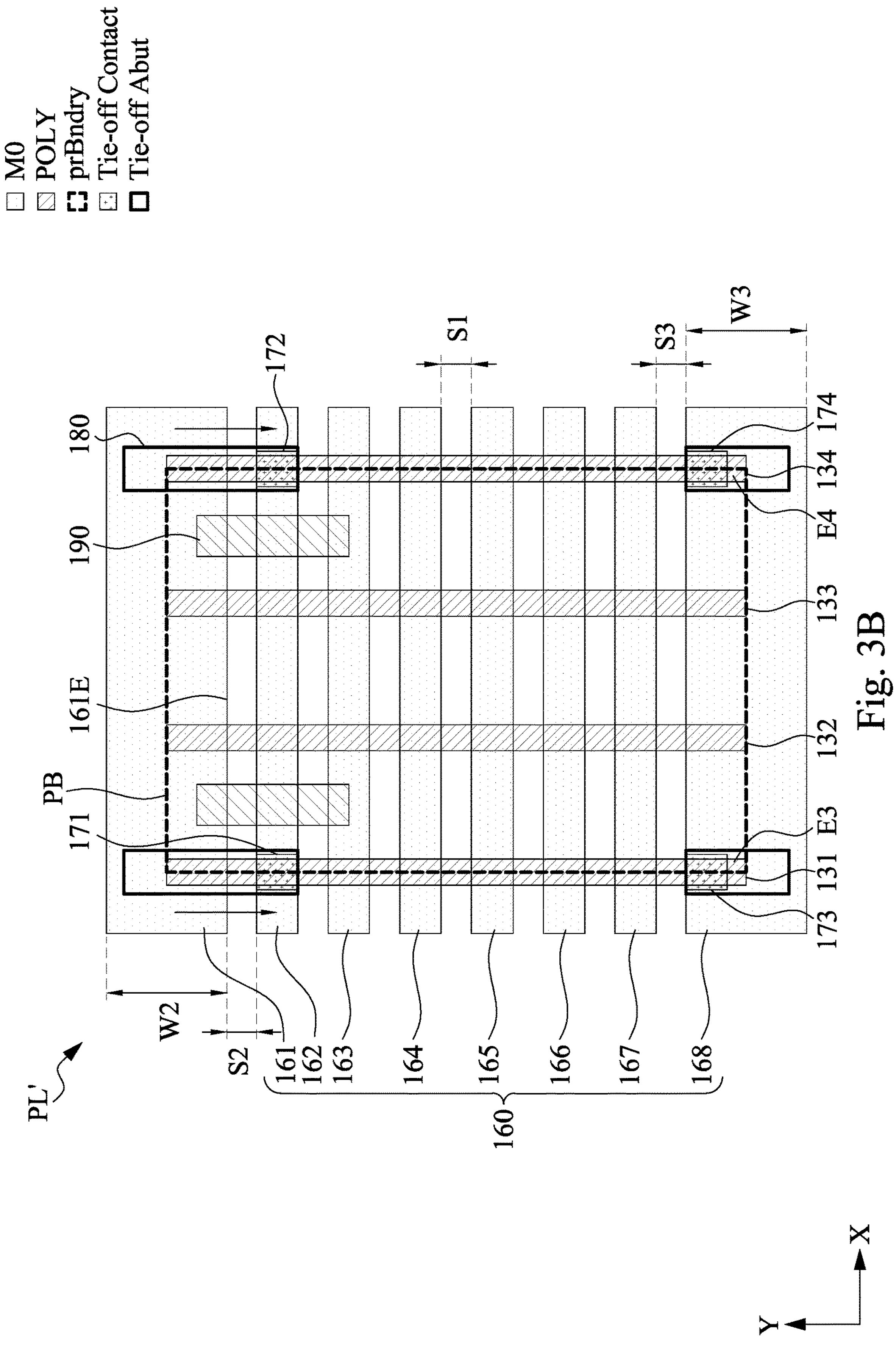
Figure 3C:
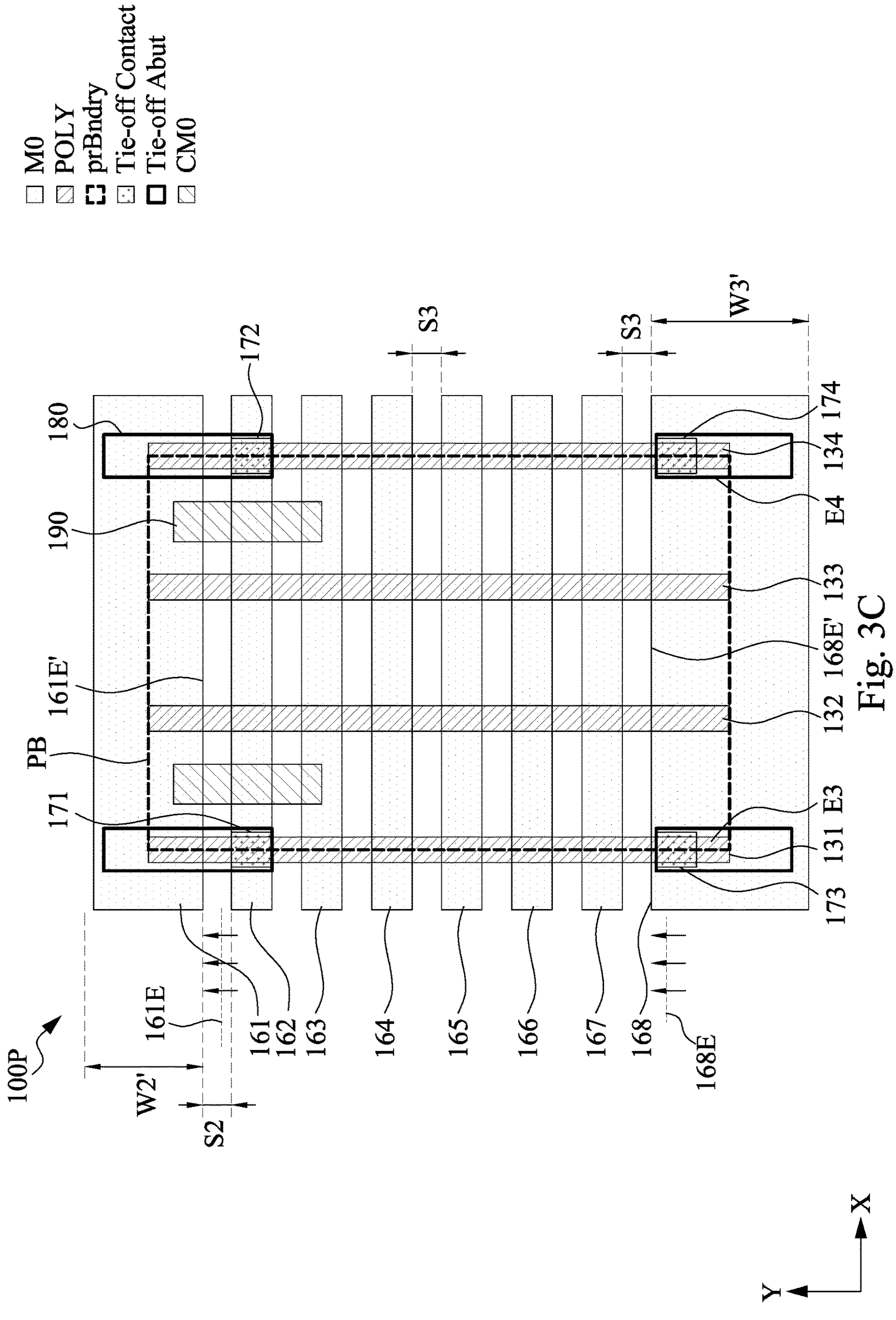

FIGS. 3A-3C illustrate a method of drawing a layout of a semiconductor device in accordance with some embodiments. The method of drawing the layout in FIGS. 3A-3C attempts to increase the Vss line width and decrease the Vdd line width. It is understood that additional steps may be provided before, during, and after the steps shown in FIGS. 3A-3C, and some of the steps described below can be replaced or eliminated for additional embodiments of the method. The order of the operations/processes may be interchangeable.

Reference is made to FIG. 3A. A primary layout PL of a semiconductor device is provided in accordance with some embodiments. The primary layout PL may include gate layout patterns 131, 132, 133 and 134, a metallization layout pattern 160 including metal line layout patterns 161-168, tie-off contact layout patterns 171-174, and tie-off abut layout patterns 180. Details of the primary layout PL are similar to those of the primary layout PL in FIG. 1A, and thus not repeated herein.

The gate layout pattern 131 may have a portion E3 extending beyond an edge of the tie-off contact layout pattern 173 away from the tie-off contact layout pattern 171, and the gate layout pattern 134 may have a portion E4 extending beyond an edge of the tie-off contact layout pattern 174 away from the tie-off contact layout pattern 172.

Reference is made to FIG. 3B. A first layout modification step is performed to the primary layout PL in FIG. 3A. The first layout modification step may include moving the tie-off contact layout pattern 171 and 172 from the Vdd line layout pattern 161 to the metal line layout pattern 162. Arrows in FIG. 3B indicate the movement of the tie-off contact layout pattern 171 and 172. After the movement of the tie-off contact layout pattern 171 and 172, the tie-off contact layout pattern 171 overlaps an intersection of the gate layout pattern 131 and the metal line layout pattern 162, thus providing an electrical connection between the gate layout pattern 131 and the metal line layout pattern 162. The tie-off contact layout pattern 172 overlaps an intersection of the gate layout pattern 134 and the metal line layout pattern 162, thus providing an electrical connection between the gate layout pattern 134 and the metal line layout pattern 162.

The first layout modification step may further include adding cut-metal-line layout patterns 190 to the layout PL presented in FIG. 3A. In the present embodiments, the cut-metal-line layout patterns 190 may break a metal line of a semiconductor device (e.g., the metal line 162A in FIG. 4A) into several metal lines (e.g., the metal lines 164A1, 164A2, and 164A3 in FIG. 4A). Other details of the cut-metal-line layout patterns 190 are similar to the cut-metal-line layout patterns 190 illustrated in FIG. 1B, and thereto not repeated herein. After the first layout modification step, the primary layout PL may be referred to as layout PL'.

Reference is made to FIG. 3C. A second layout modification step is performed to the layout PL' in FIG. 3B. The second layout modification step includes increasing the width of the Vss line layout pattern 168, decreasing the width of Vdd line layout pattern 161, and shifting/moving the metal line layout pattern 162-167 toward the Vdd line layout pattern 161 away from the Vss line layout pattern 168. Arrows in FIG. 3C indicate the direction and amount of the increase in width of the Vss line layout pattern 168 and the decrease in width of Vdd line layout pattern 161. The dashed lines at start point of the arrows indicate the positions of the edges 161E and 168E of Vdd line layout pattern 161 and Vss line layout pattern 168 respectively in FIG. 3B. The second layout modification step is performed to move both the edge 161E of Vdd line layout pattern 161 and the edge 168E of Vss line layout pattern 168 upwards to edges 161E' and 168E' respectively as indicated by the arrows.

In FIG. 3C, the amount of increase in the width of the Vss line layout pattern 168 is substantially equivalent to the amount of decrease in the width of the Vdd line layout pattern 161. In addition to this, the second layout modification step is performed such that line-to-line spacing S1-S3 and the width of the metal line layout pattern 162-167 may remain substantially unchanged after the modifications. In the second layout modification step, the width of the Vdd line layout pattern 161 is decreased from width W2 to width W2' and the width of the Vdd line layout pattern 168 is increased from width W3 to width W3'. In view of this, the Vdd line width W2' is less than the Vss line width W3'. The second layout modification step may also include moving/shifting the tie-off contact layout patterns 173 and 174 upward, thereby enlarging the area of portions E3 and E4, which extend beyond the edges of the tie-off contact layout patterns 173 and 174, respectively. After moving the tie-off contact layout patterns 173 and 174, the tie-off contact layout patterns 173 and 174 may have a minimal enclosure from Vss edge 168E'. The layout LP' may be referred to as layout 100P after the second layout modification step.

The layout 100P is used to manufacture a semiconductor device 100PA in FIGS. 4A-4E. In the present embodiments, the gate layout patterns 131-134 of the layout 100P define corresponding gate structures 131A, 132A, 133A and 134A of the semiconductor device 100PA (referring to FIGS. 4A-4E). The metallization layout pattern 160 (e.g., metal line layout patterns 161-168) of the layout 100P defines corresponding metallization layer 160A (e.g., metal lines 161A-168A) of the semiconductor device 100PA (referring to FIGS. 4A-4E). The tie-off contact layout patterns 171, 172, 173, and 174 of the layout 100P define corresponding tie-off contacts 171A, 172A, 173A, and 174A of the semiconductor device 100PA (referring to FIGS. 4A-4E).

Figure 3D:
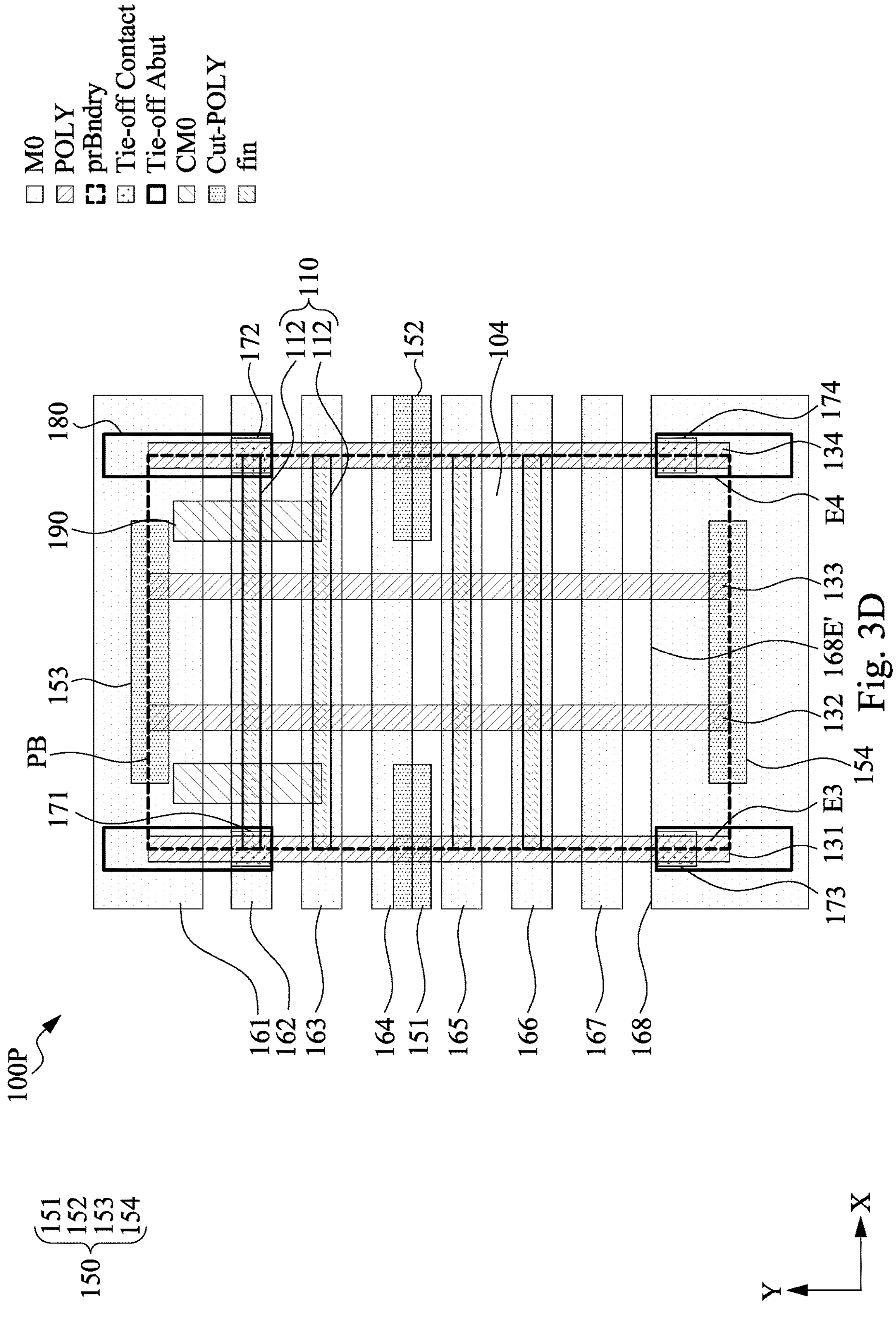

The layout 100P may further include fin group layout patterns 110 and cut-gate layout patterns 150 (e.g., cut-gate layout patterns 151-154), as shown in FIG. 3D. The fin group layout patterns 110 define corresponding fin group regions 110A of the semiconductor device 100NA (referring to FIGS. 4A-4E). The fin group layout patterns 110 extend substantially along a first direction of the layout 100P, e.g., the direction X, and spaced from each other along a second direction of the layout 100P, e.g., the direction Y. In some embodiments, the direction Y is perpendicular to the direction X. In some embodiments, the fin layout patterns 112 are separated from each other and other components of the layout 100P on the same layout level by an isolation structure layout pattern 104. The isolation structure layout pattern 104 defines a corresponding isolation structure 104A of the semiconductor device 100NA (referring to FIGS. 2A-2E). In some embodiments, each of the gate layout patterns 131-134 extends substantially along the Y direction across the fin group layout patterns 110. The gate layout patterns 131-134 and corresponding source/drain region layout patterns 114 on opposite sides of the gate layout patterns 131-134 form a plurality of FETs.

The cut-gate layout patterns 151-154 may extend substantially along the X direction across the gate layout patterns 131-134. The cut-gate layout patterns 151-154 represent cut sections or patterning area where the gate layout patterns 131-134 are removed for electrical disconnections according to the integrated circuit design. In the present embodiments, the cut-gate layout patterns 151 cut the gate layout pattern 131 into two separate portions. In view of this, the Vdd and Vss voltage levels are provided to respective portions of the gate layout pattern 131. In addition, the cut-gate layout patterns 152 cut the gate layout pattern 134 into two separate portions. In view of this, the Vdd and Vss voltage levels are provided to respective portions of the gate layout pattern 134. Other details of the present embodiments are similar to those illustrated above, and thereto not repeated herein.

Figure 4A:
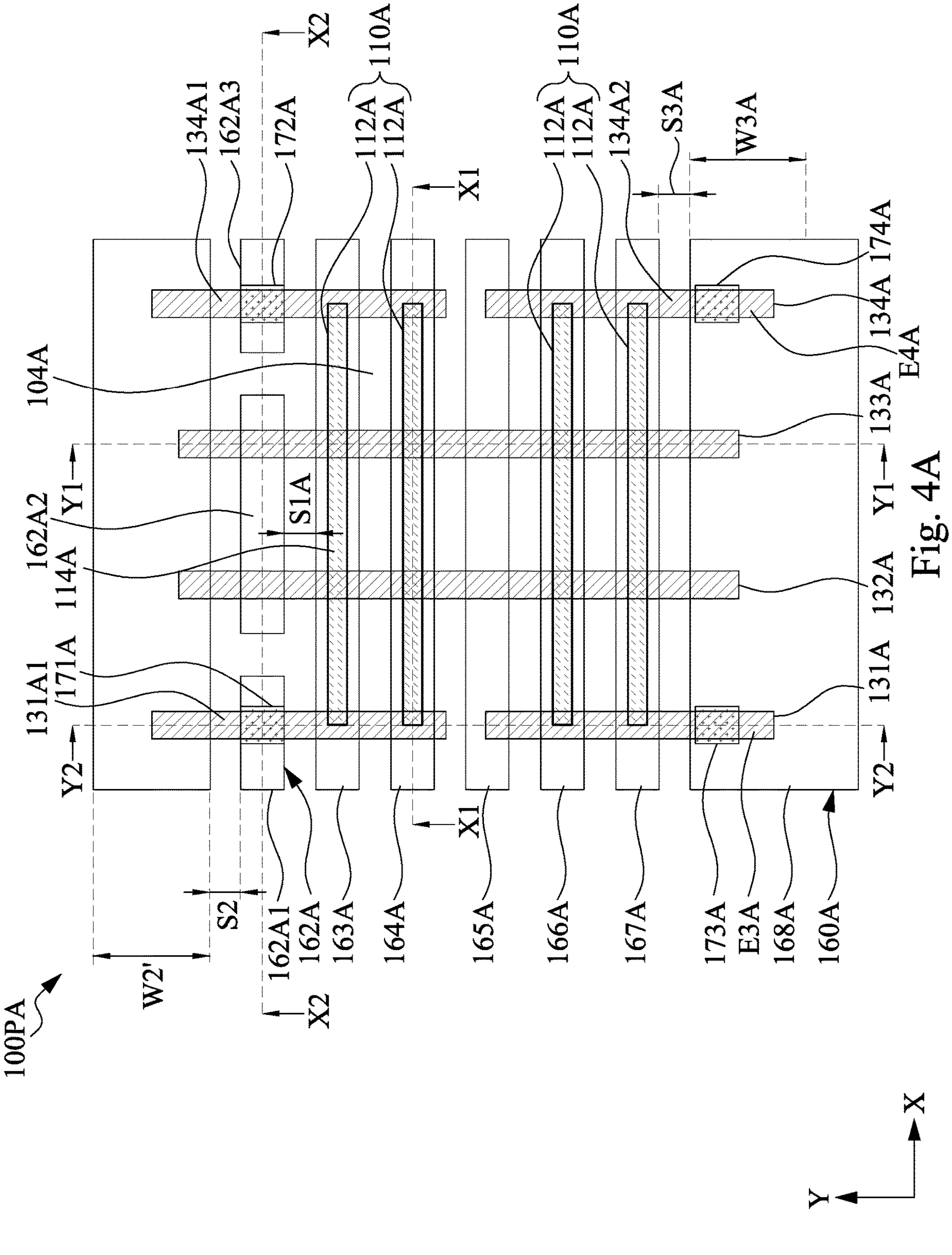
FIGS. 4A-4E represent views of a semiconductor device fabricated using the layout of FIG. 3D, in accordance with some embodiments.
Figure 4B:
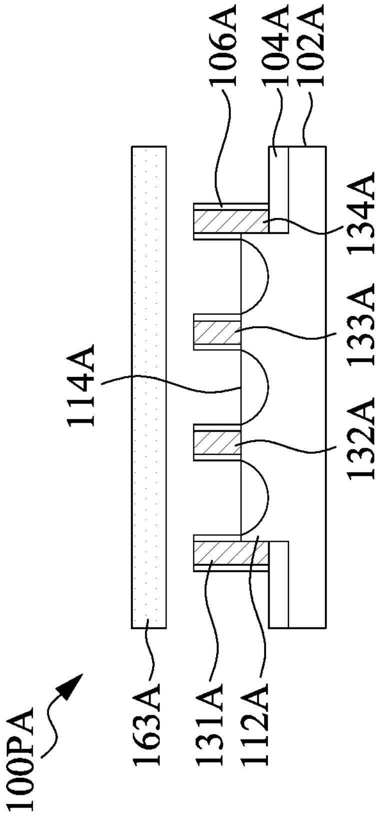
Figure 4C:
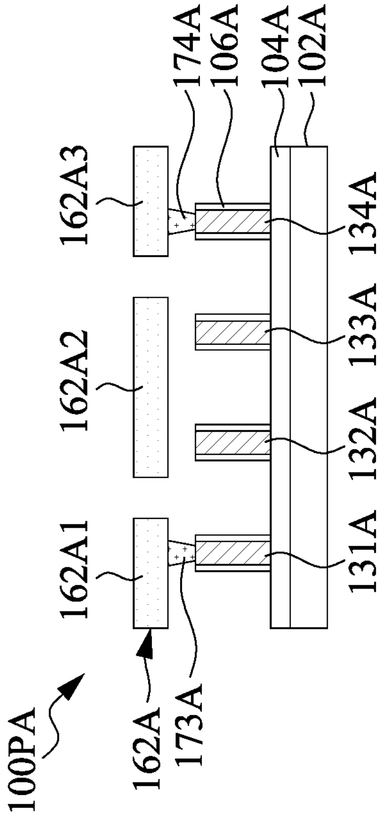
Figure 4D:
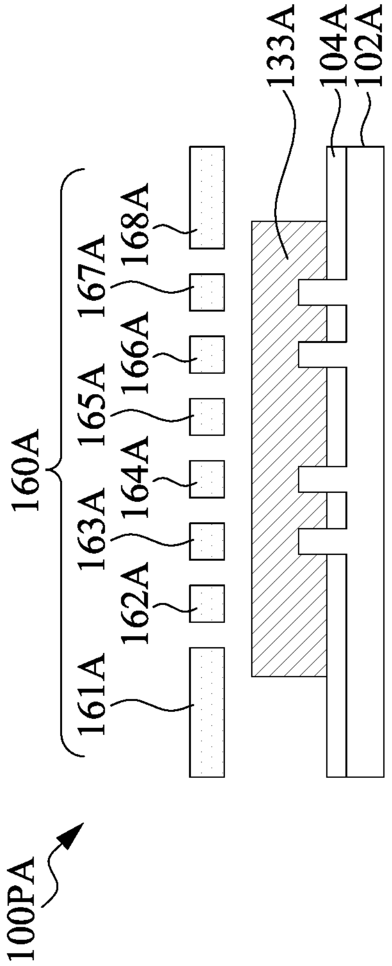
Figure 4E:
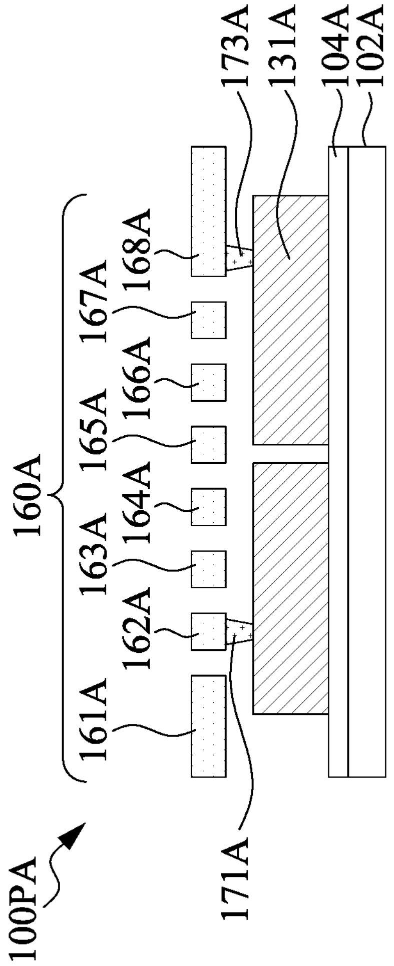

FIGS. 4A-4E represent views of a semiconductor device 100PA fabricated using the layout 100P, in accordance with some embodiments, and therefore the semiconductor device 100PA inherits geometry of all patterns in the layout 100P, as described in greater detail below. FIG. 4A is a top view of the semiconductor device 100PA. FIG. 4B is a cross-sectional view of the semiconductor device 100PA of FIG. 4A taken along line X1-X1. FIG. 4C is a cross-sectional view of the semiconductor device 100PA of FIG. 4A taken along line X2-X2. FIG. 4D is a cross-sectional view of the semiconductor device 100PA of FIG. 4A taken along line Y1-Y1. FIG. 4E is a cross-sectional view of the semiconductor device 100PA of FIG. 4A taken along line Y2-Y2. The semiconductor device 100PA is a non-limiting example for facilitating the illustration of the present disclosure.

Reference is made to FIGS. 4A-4E. The semiconductor device 100PA includes a substrate 102A, fin groups 110A, gate structures 131A-134A, tie-off contacts 171A-174A, and a metallization layer 160A. The fin groups 110A extend upwardly from the substrate 102A. Each of the fin group 110A may include a number of fins 112A (here two) aligned with a fin-to-fin spacing S4. In some embodiments, the fin-to-fin spacing S4A is comparable to the fin-to-fin spacing S4 of the first fin layout patterns 112 in the layout 100P. The fins 112A may be electrically isolated from each other by an isolation structure 104A. The fins 112A each include a plurality of source/drain regions 114A.

The gate structures 131A, 132A, 133A and 134A extend substantially along the Y direction across the fin groups 110A. In some embodiments, the gate structures 131A-134A are high-k metal gate (HKMG) structures that may be formed using a gate-last process flow (interchangeably referred to as gate replacement flow). The tie-off contacts 171A, 172A, 173A, and 174A are above the corresponding gate structures 131A and 134A.

FIG. 4F illustrates an enlarged view of a portion of FIG. 4A. Reference is made to FIGS. 4A and 4F. The gate structure 131A1 may have a portion E3A extending beyond an edge of the tie-off contact 173A away from the tie-off contact 171A, and the gate structure 134A1 may have a portion E4A extending beyond an edge of the tie-off contact 174A away from the tie-off contact 172A.

The Vss line 168A has a line edge 168EA adjacent to the metal lines 162A-167A and a line edge 168FA away from the metal lines 162A-167A. The line edge 168EA may correspond to the line edge 168E' in the layout 100P. The tie-off contacts 173A and 174A have an edge TE adjacent to the line edge 168EA of the Vss line 168A and an edge FE adjacent to the line edge 168FA of the Vss line 168A. A distance L4 between the edge TE of the tie-off contacts 173A and 174A and the line edge 168EA is less than a distance L5 between the edge FE of the tie-off contacts 173A and 174A and the line edge 168FA. The distance L4 between the edge TE of the tie-off contacts 173A and 174A and the line edge 168EA is less than a distance L6 between the edge FE of the tie-off contacts 173A and 174A and an end side of the gate structure 131A/134A over the Vss line 168A. For example, the tie-off contacts 173A and 174A are between a middle line ML2 of the Vss line 168A and the edge 168EA of the Vss line 168A. As the tie-off contact 173A and 174A may have a minimal enclosure (e.g., several nanometers) from the Vss edge 168EA, the distance L4 may be in a range from about 2 nanometers to about 10 nanometers.

Reference is made back to FIGS. 4A-4D. The metallization layer 160A is on a next level above the tie-off contacts 171A-174A. The metallization layer 160A may include metal lines 161A, 162A, 163A, 164A, 165A, 166A, 167A, and 168A. The metal lines 161A-168A extend substantially along the X direction perpendicular to the Y direction along which the gate structures 131A-134A extend. The uppermost metal line 161A shown in FIG. 4A is a Vdd line, and the lowermost metal line 168A as shown in FIG. 4A is a Vss line. The Vdd line 161A is electrically connected to a Vdd power supply (e.g., positive voltage supply), and the Vss line 168A is electrically connected to a Vss power supply (e.g., electrical ground or a negative voltage supply). In some embodiments, according to the cut-metal-line layout patterns 190 in the layout 100, the metal line 162A is broken into several metal lines 162A1, 162A2, and 162A3, as illustrated in FIG. 4A.

In some embodiments, the metal lines 162A1 and 162A3 can be electrically connected to the Vdd power supply (e.g., a positive voltage supply), for example, connected to Vdd line 161A by suitable metal routing. The metal line 162A2 between the metal lines 162A1 and 162A3 and the metal lines 163A-167A can be used for internal routing and are biased with different voltages than the Vdd line 161A, the Vss line 168A, and the metal lines 162A1 and 162A3.

In FIG. 4A, the tie-off contact 171A overlaps an intersection of the gate structure 131A1 and the metal line 162A1, thus providing an electrical connection between the gate structure 131A1 and the metal line 162A1. The tie-off contact 172A overlaps an intersection of the gate structure 134A1 and the metal line 162A3, thus providing an electrical connection between the gate structure 134A1 and the metal line 162A3. The tie-off contact 173A overlaps an intersection of the gate structure 131A2 and the Vss line 168A, thus providing an electrical connection between the gate structure 131A2 and the Vss line 168A. The tie-off contact 174A overlaps an intersection of the gate structure 134A2 and the Vss line 168A, thus providing an electrical connection between the gate structure 134A2 and the Vss line 168A. Thus, the stable Vdd voltage level is provided to the gate structures 131A1 and 134A1, and the stable Vss voltage level is provided to the gate structures 131A2 and 134A2. Through the configuration, each of the tie-off contacts 171A, 172A, 173A, and 174A may be used with a dummy gate/transistor (e.g., one of the gate structures 131A1, 131A2, 134A1, and 134A2) to provide isolation between cells. By providing such tie-off contacts 171A, 172A, 173A, and 174A, the dummy gate/transistors (e.g., the gate structures 131A1, 131A2, 134A1, and 134A2) may remain a dummy gate instead of floating or acting as an active gate.

The Vdd line 161A has a Vdd line width W2A and the Vss line 168A has a Vss line width W3A in the Y direction. The Vdd line width W2A is comparable to the Vdd line width W2' in the layout 100P, and the Vss line width W3A is comparable to the Vss line width W3' in the layout 100P. In the depicted embodiments in FIG. 4A, the Vdd line width W2A is less than the Vss line width W3A. Other details of the present embodiments are similar to those illustrated above, and thereto not repeated herein.

Figure 5A:
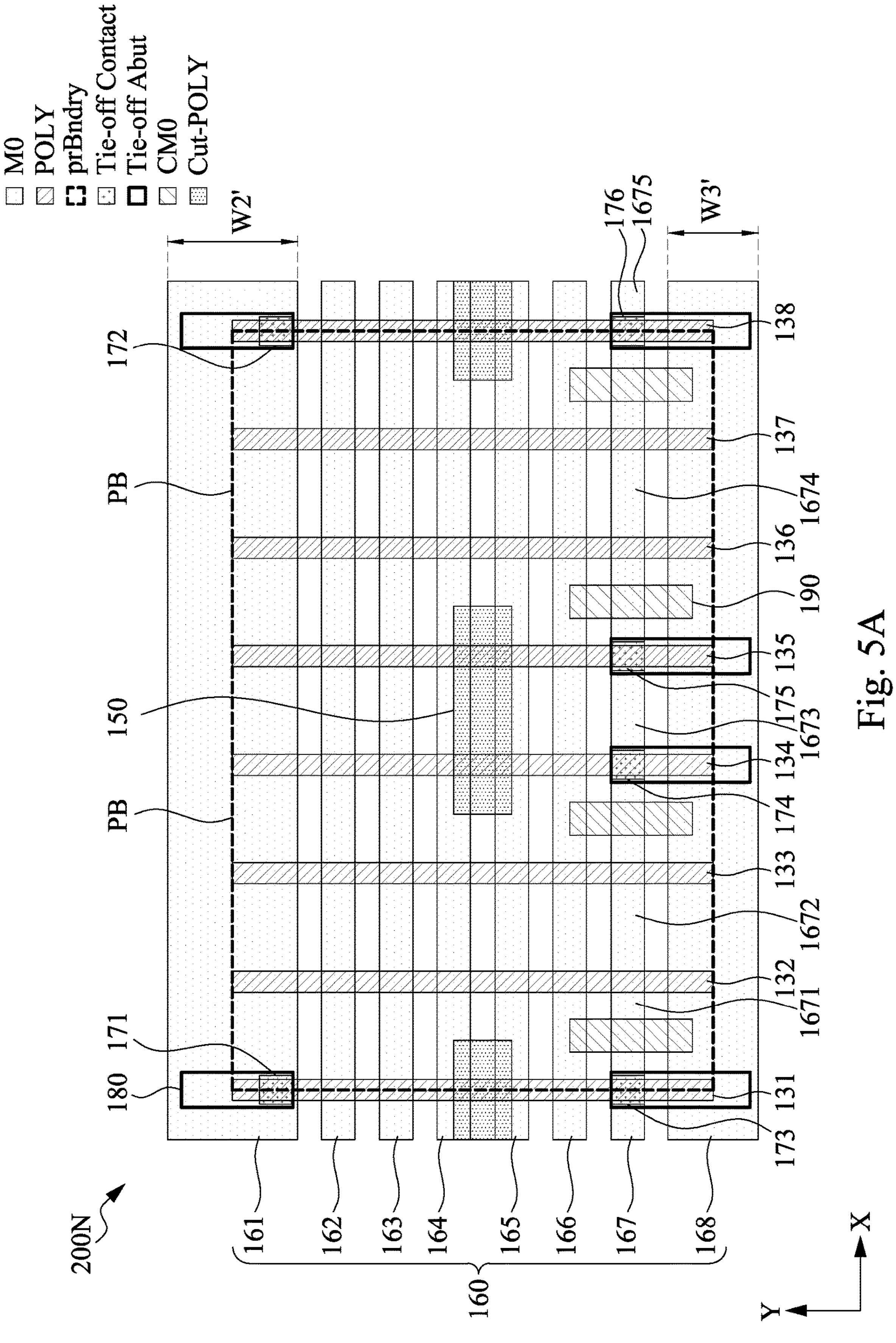
FIG. 5A represents a layout of a semiconductor device, in accordance with some embodiments.

FIG. 5A represents a layout 200N of a semiconductor device, in accordance with some embodiments. The layout 200N may be similar to the layout 100N in FIG. 1C, for example, the layout 200N have been processed through the aforementioned first and second modification steps, such that the Vdd line width W2' is greater than the Vss line width W3'. One of the differences between the layout 200N and the layout 100N of FIG. 1C is that the layout 200N includes dummy gate layout patterns 134 and 135 and tie-off contact layout pattern 174 and 175 overlapping the dummy gate layout patterns 134 and 135 inside the cell boundary PB.

The layout 200N includes gate layout patterns 131-138. In some embodiments, the gate layout patterns 131 and 138 are dummy gates at left and right sides of the boundary PB of the layout 100N, and the gate layout patterns 134 and 135 are dummy gates between the dummy gate layout patterns 131 and 138. In some embodiments, the gate layout patterns 132 and 133 are active gates between the dummy gate layout patterns 131 and 134, and the gate layout patterns 136 and 137 are active gates between the dummy gate layout patterns 135 and 138.

The layout 200N includes tie-off contact layout patterns 171-176. In FIG. 5A, the tie-off contact layout pattern 171 overlaps an intersection of the gate layout pattern 131 and the Vdd line layout pattern 161, thus providing an electrical connection between the gate layout pattern 131 and the Vdd line layout pattern 161. The tie-off contact layout pattern 172 overlaps an intersection of the gate layout pattern 138 and the Vdd line layout pattern 161, thus providing an electrical connection between the gate layout pattern 138 and the Vdd line layout pattern 161. The tie-off contact layout pattern 173 overlaps an intersection of the gate layout pattern 131 and the metal line layout pattern 167, thus providing an electrical connection between the gate layout pattern 131 and the metal line layout pattern 167. The tie-off contact layout pattern 174 overlaps an intersection of the gate layout pattern 134 and the metal line layout pattern 167, thus providing an electrical connection between the gate layout pattern 134 and the metal line layout pattern 167. The tie-off contact layout pattern 175 overlaps an intersection of the gate layout pattern 135 and the metal line layout pattern 167, thus providing an electrical connection between the gate layout pattern 135 and the metal line layout pattern 167. The tie-off contact layout pattern 176 overlaps an intersection of the gate layout pattern 138 and the metal line layout pattern 167, thus providing an electrical connection between the gate layout pattern 138 and the metal line layout pattern 167.

The layout 200N may also include other components, such as cut-gate layout patterns 150, metal line layout patterns 161-168, tie-off abut layout patterns 180, and cut-metal-line layout patterns 190. In the present embodiments, the cut-metal-line layout patterns 190 may cut the metal line layout pattern 167 into separate/several different portions 1671-1675, in which the portions 1671, 1673, and 1675 overlap the tie-off contact layout patterns 173-176. Other details of the present embodiments are similar to those illustrated above, and thereto not repeated herein.

Figure 5B:
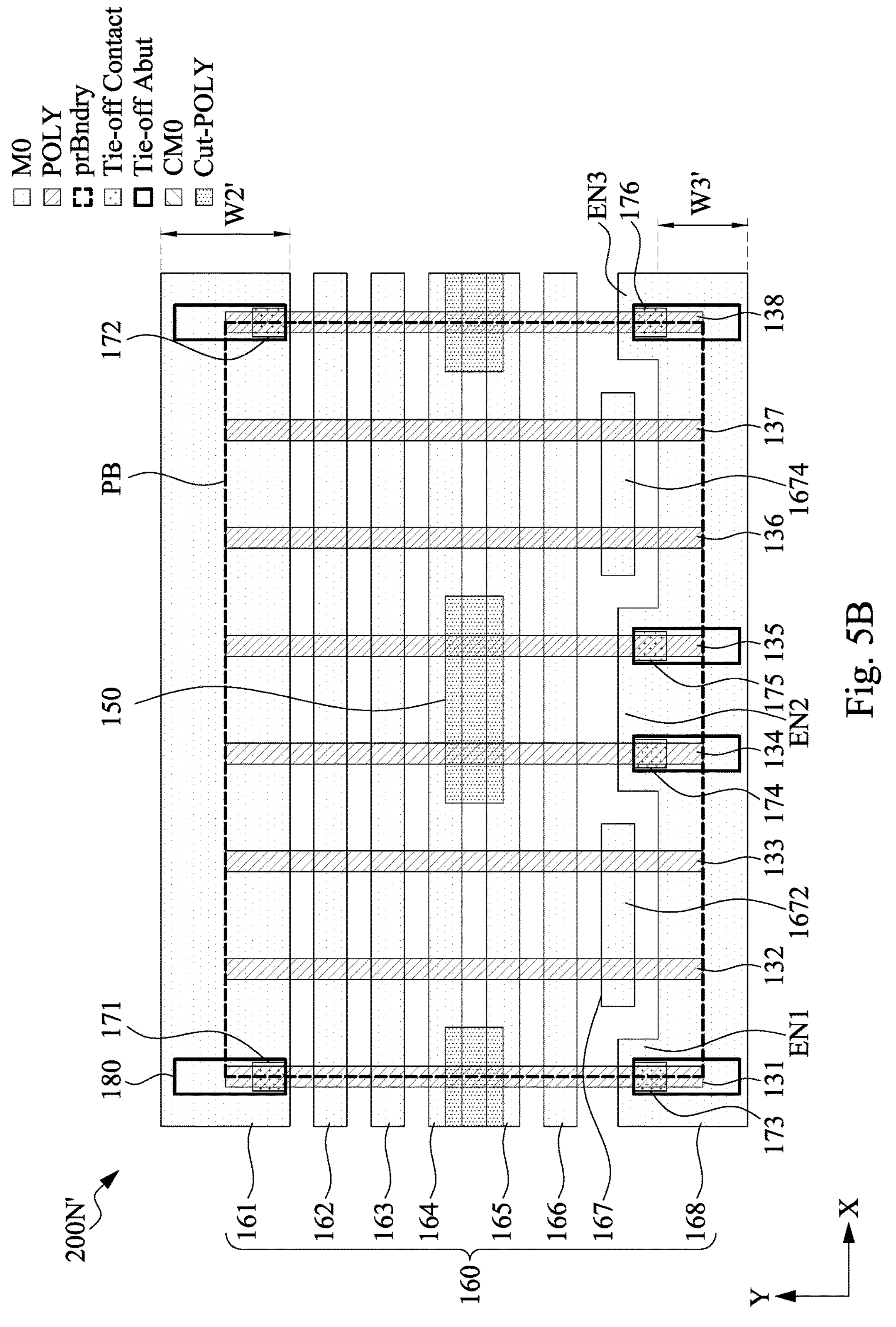
FIG. 5B is a modified layout from FIG. 5A.

FIG. 5B is a modified layout from FIG. 5A. A third layout modification step may be performed to the layout 200N of FIG. 5A, and a layout 200N' is obtained. The third layout modification step includes modifying the shape of the Vss line layout pattern 168, such that the tie-off contact layout patterns 173-176 may land on the Vss line layout pattern 168. In some embodiments, the modification process may include moving the tie-off contact layout patterns 173-176 and the portions 1671, 1673, and 1675 overlapping the tie-off contact layout patterns 173-176 (referring to FIG. 5A) downward (e.g., toward Vss line layout pattern 168), until the portions 1671, 1673, and 1675 (referring to FIG. 5A) merge with the Vss line layout pattern 168. The portions 1671, 1673, and 1675 (referring to FIG. 5A) merged with the Vss line layout pattern 168 may be referred to as protruding portions EN1-EN3, respectively. In some alternative embodiments, the modification process may include removing the portions 1671, 1673, and 1675 overlapping the tie-off contact layout patterns 173-176 (referring to FIG. 5A), modifying the shape of the Vss line layout pattern 168 to include protruding portions EN1-EN3 corresponding to the portions 1671, 1673, and 1675 (referring to FIG. 5A), and moving the tie-off contact layout patterns 173-176 downward to overlap the protruding portions EN1-EN3 of the Vss line layout pattern 168. The protruding portions EN1-EN3 of the Vss line layout pattern 168 face the Vdd line layout pattern 161 from a top view. By the third layout modification step, the metal line layout pattern 167 is spaced apart from the tie-off contact layout patterns 173-176, and therefore the cut-metal-line layout patterns 190 (referring to FIG. 5A) may be removed from the layout. Other details of the present embodiments are similar to those illustrated above, and thereto not repeated herein.

Figure 6A:
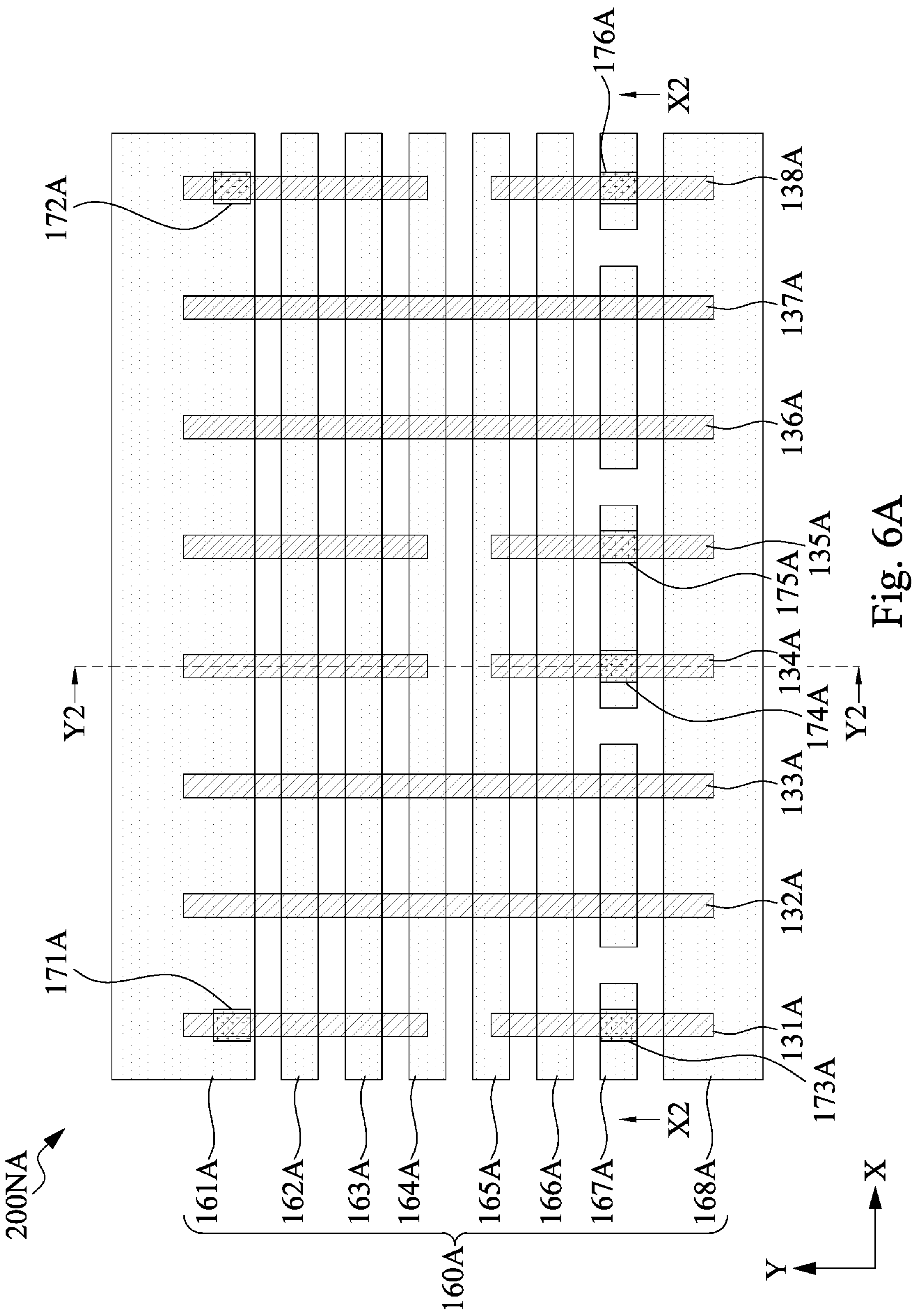
FIGS. 6A-6C are views of a semiconductor device fabricated using the layout of FIG. 5A, in accordance with some embodiments.
Figure 6B:
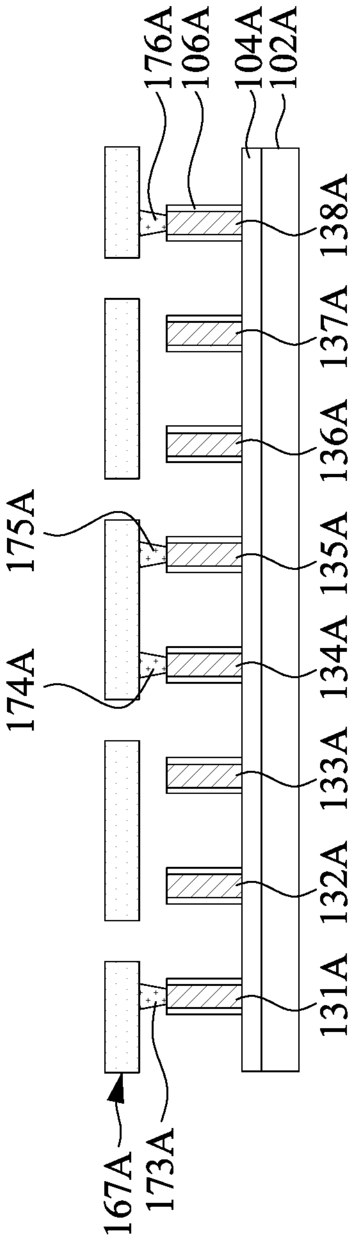
Figure 6C:
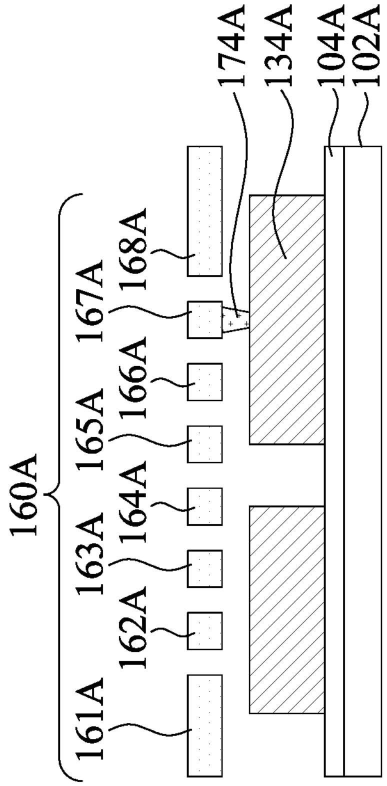

FIGS. 6A-6C are views of a semiconductor device 200NA fabricated using the layout 200N of FIG. 5A, in accordance with some embodiments. The semiconductor device 200NA includes gate structures 131A-138A, metal lines 161A-168A, and tie-off contacts 171A-176A. The gate structures 131A-138A corresponds to the gate layout patterns 131-138 of the layout 200N. The metal lines 161A-168A corresponds to the metal line layout patterns 161-168 of the layout 200N. The tie-off contacts 171A-176A corresponds to the tie-off contact layout patterns 171-176 of the layout 200N. In FIG. 6A, the tie-off contacts 171A and 172A respectively overlap intersections of the Vdd line 161A and the gate structures 131A and 138A, and the tie-off contacts 173A-176A respectively overlap intersections of the metal line 167A and the gate structures 131A, 134A, 135A, and 138A. In some embodiments, the tie-off contacts 175A and 176A inside the standard cell can be used to switch off devices (e.g., PMOS or NMOS) in the standard cell. Other details of the present embodiments are similar to those illustrated above, and thereto not repeated herein.

Figure 7A:
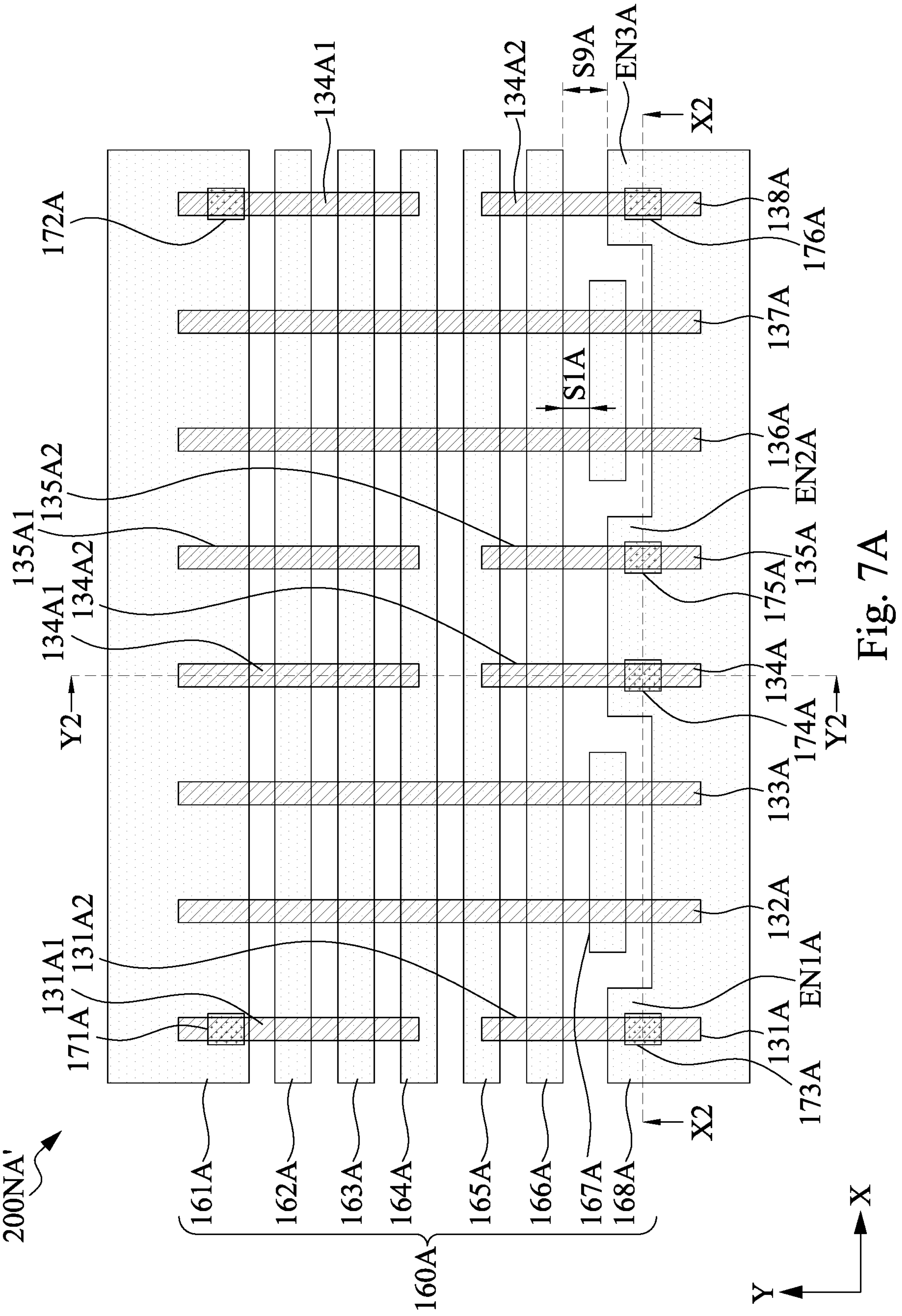
FIGS. 7A-7C are views of a semiconductor device fabricated using the layout of FIG. 5B, in accordance with some embodiments.
Figure 7B:
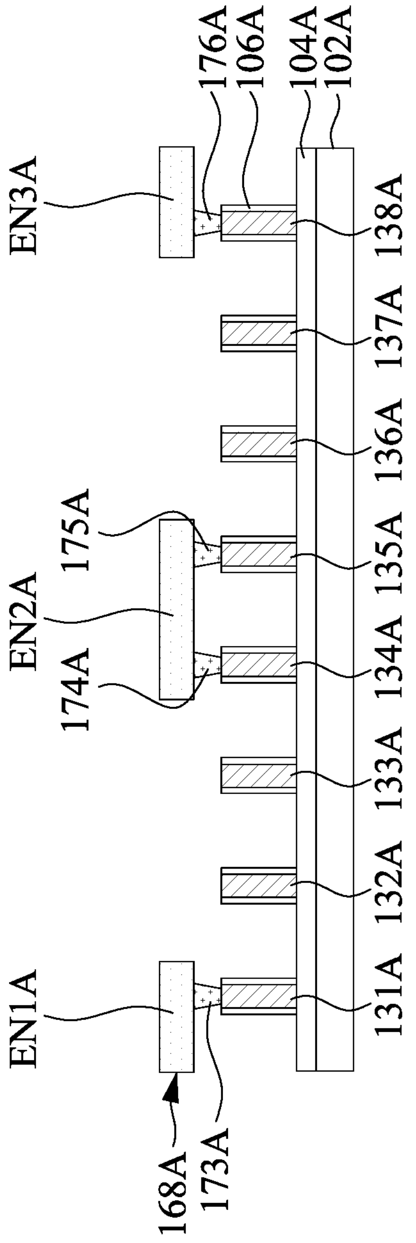
Figure 7C:
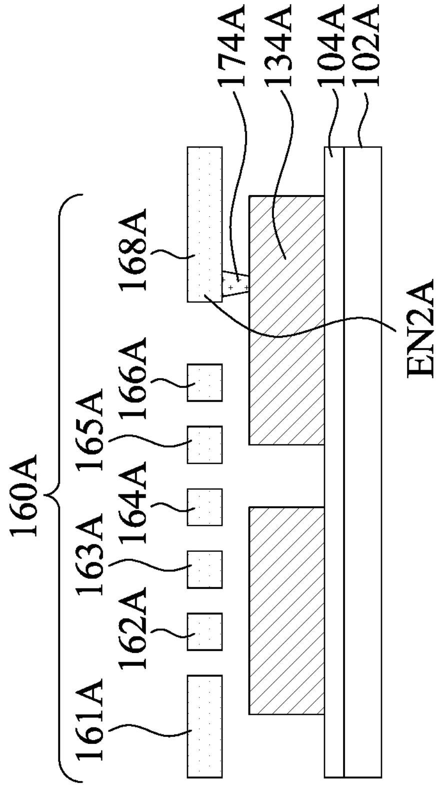

FIGS. 7A-7C are views of a semiconductor device 200NA' fabricated using the layout 200N' of FIG. 5B, in accordance with some embodiments. The semiconductor device 200NA' includes gate structures 131A-138A, metal lines 161A-168A, and tie-off contacts 171A-176A. The gate structures 131A-138A corresponds to the gate layout patterns 131-138 of the layout 200N'. The metal lines 161A-168A corresponds to the metal line layout patterns 161-168 of the layout 200N'. The tie-off contacts 171A-176A corresponds to the tie-off contact layout patterns 171-176 of the layout 200N'. In FIG. 7A, the Vss line 168A includes protruding portions EN1A-EN3A facing the Vdd line layout pattern 161A from a top view, and the protruding portions EN1A-EN3A corresponds to the protruding portions EN1-EN3 of the layout 200N'.

In the present embodiments, the gate structure 131A include separated gate structures 131A1 and 131A2, the gate structure 134A includes separated gate structures 134A1 and 134A2, the gate structure 135A includes separated gate structures 135A1 and 135A2, and the gate structure 138A includes separated gate structures 138A1 and 138A2.

In the present embodiments, in FIG. 7A, the metal line 167A is immediately adjacent to the Vss line 168A, and the metal line 167A is misaligned with the protruding portions EN1A-EN3A of the Vss line 168A along the direction Y. In the present embodiments, the metal line 166A is immediately adjacent to the metal line 167A, and a spacing S9A between the metal line 166A and the protruding portions EN1A-EN3A of the Vss line 168A is greater than a spacing S1A between the metal lines 166A and 167A.

In FIG. 7A, the tie-off contact 173A overlaps an intersection of the protruding portion EN1A of the Vss line 168A and the gate structure 131A, the tie-off contact 174A overlaps an intersection of the protruding portion EN2A of the Vss line 168A and the gate structure 134A, the tie-off contact 175A overlaps an intersection of the protruding portion EN2A of the Vss line 168A and the gate structure 135A, and the tie-off contact 176A overlaps an intersection of the protruding portion EN3A of the Vss line 168A and the gate structure 138A. The tie-off contacts 171A and 172A respectively overlap intersections of the Vdd line 161A and the gate structures 131A and 138A. Other detail of the present embodiments are similar to those illustrated above, and thereto not repeated herein.

Figure 8A:
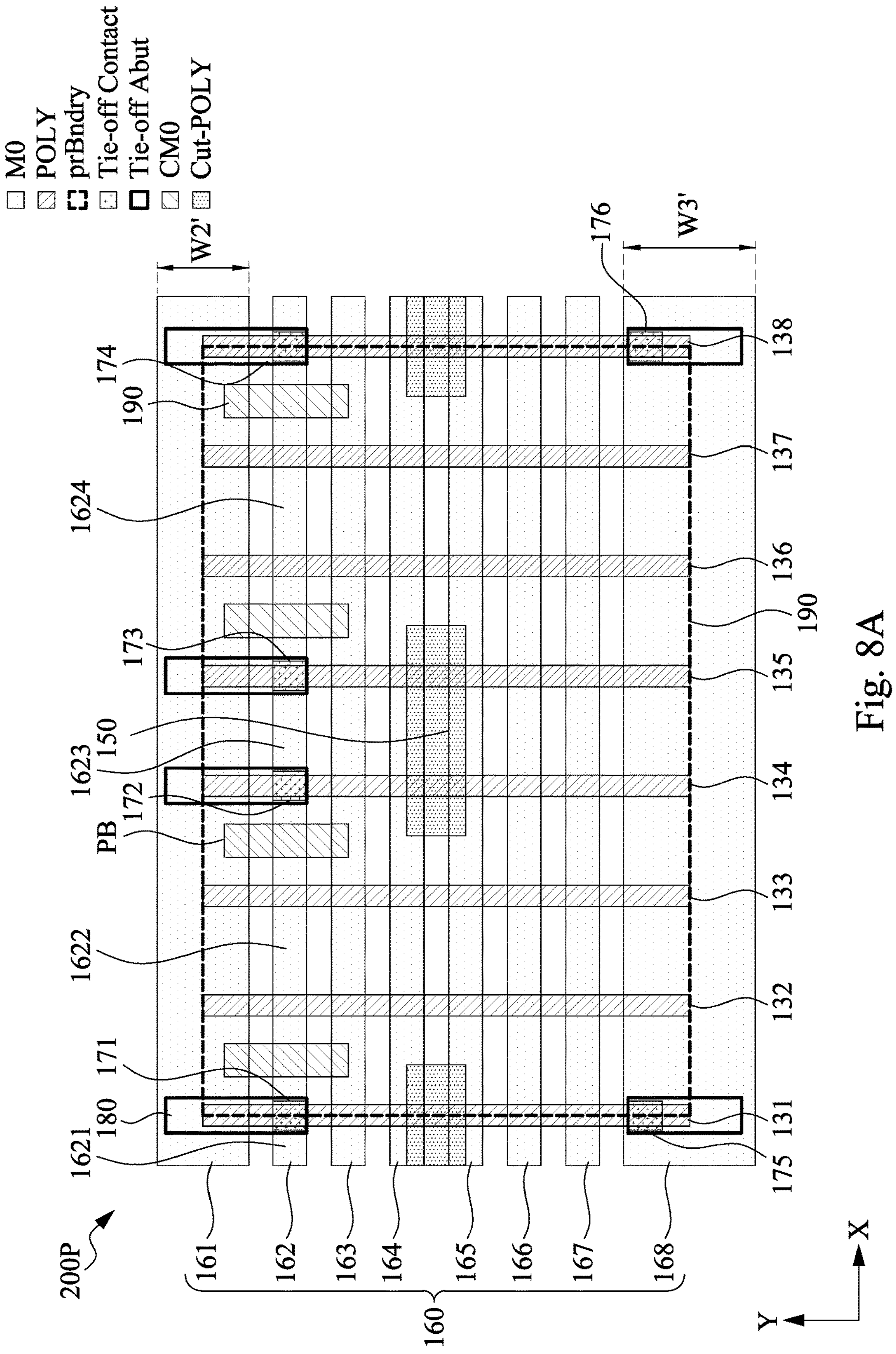
FIG. 8A is a layout of a semiconductor device, in accordance with some embodiments.

FIG. 8A is a layout 200P of a semiconductor device, in accordance with some embodiments. The layout 200P may be similar to the layout 100P in FIG. 3C, for example, the layout 200P have been processed through the aforementioned first and second modification steps, such that the Vdd line width W2' is less than the Vss line width W3'. One of the differences between the layout 200P and the layout 100P of FIG. 3C is that the layout 200P includes dummy gate layout patterns 134 and 135 and tie-off contact layout pattern 172 and 173 overlapping the dummy gate layout patterns 134 and 135 inside the cell boundary PB.

The layout 200P includes gate layout patterns 131-138. In some embodiments, the gate layout patterns 131 and 138 are dummy gates at left and right sides of the boundary PB of the layout 200P, and the gate layout patterns 134 and 135 are dummy gates between the dummy gate layout patterns 131 and 138. In some embodiments, the gate layout patterns 132 and 133 are active gates between the dummy gate layout patterns 131 and 134, and the gate layout patterns 136 and 137 are active gates between the dummy gate layout patterns 135 and 138.

The layout 200P includes tie-off contact layout patterns 171-176. In FIG. 8A, the tie-off contact layout pattern 171 overlaps an intersection of the gate layout pattern 131 and the metal line layout pattern 162, thus providing an electrical connection between the gate layout pattern 131 and the metal line layout pattern 162. The tie-off contact layout pattern 172 overlaps an intersection of the gate layout pattern 134 and the metal line layout pattern 162, thus providing an electrical connection between the gate layout pattern 134 and the metal line layout pattern 162. The tie-off contact layout pattern 173 overlaps an intersection of the gate layout pattern 135 and the metal line layout pattern 162, thus providing an electrical connection between the gate layout pattern 135 and the metal line layout pattern 162. The tie-off contact layout pattern 174 overlaps an intersection of the gate layout pattern 138 and the metal line layout pattern 162, thus providing an electrical connection between the gate layout pattern 138 and the metal line layout pattern 162. The tie-off contact layout pattern 175 overlaps an intersection of the gate layout pattern 131 and the Vss line layout pattern 168, thus providing an electrical connection between the gate layout pattern 131 and the Vss line layout pattern 168. The tie-off contact layout pattern 176 overlaps an intersection of the gate layout pattern 138 and the Vss line layout pattern 168, thus providing an electrical connection between the gate layout pattern 138 and the Vss line layout pattern 168.

The layout 200P may also include other components, such as cut-gate layout patterns 150, metal line layout patterns 161-168, tie-off abut layout patterns 180, and cut-metal-line layout patterns 190. In the present embodiments, the cut-metal-line layout patterns 190 may cut the metal line layout pattern 162 into separated portions 1621-1625, in which the portions 1621, 1623, and 1625 overlaps the tie-off contact layout patterns 171-174. Other details of the present embodiments are similar to those illustrated above, and thereto not repeated herein.

Figure 8B:
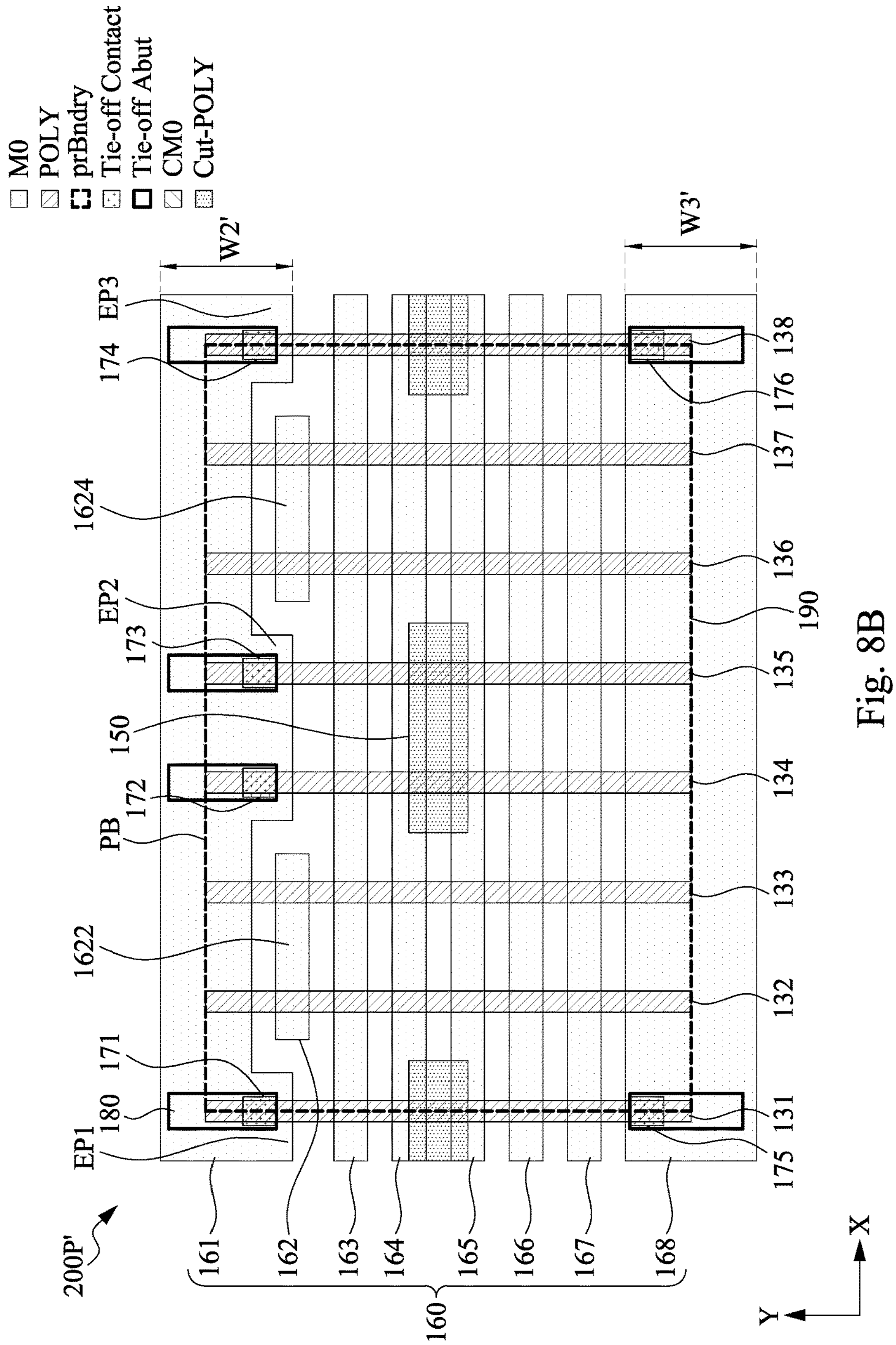
FIG. 8B is a modified layout from FIG. 8A.

FIG. 8B is a modified layout from FIG. 8A. A third layout modification step may be performed to the layout 200P of FIG. 8A, and a layout 200P' is obtained. The third layout modification step include modifying the shape of the Vdd line layout pattern 161, such that the tie-off contact layout patterns 171-174 may land on the Vdd line layout pattern 161. In some embodiments, the modification process may include moving the tie-off contact layout patterns 171-174 and the portions 1621, 1623, and 1625 overlapping the tie-off contact layout patterns 171-174 (referring to FIG. 8A) upward (e.g., toward Vdd line layout pattern 161), until the portions 1621, 1623, and 1625 (referring to FIG. 8A) merges with the Vdd line layout pattern 161. The portions 1621, 1623, and 1625 (referring to FIG. 8A) merged with the Vdd line layout pattern 161 may be referred to as protruding portions EP1-EP3, respectively. In some alternative embodiments, the modification process may include removing the portions 1621, 1623, and 1625 overlapping the tie-off contact layout patterns 171-174 (referring to FIG. 8A), modifying the shape of the Vdd line layout pattern 168 to include protruding portions EP1-EP3 corresponding to the portions 1621, 1623, and 1625 (referring to FIG. 8A), and moving the tie-off contact layout patterns 171-174 upward to overlap the protruding portions EP1-EP3 of the Vdd line layout pattern 161. The protruding portions EP1-EP3 of the Vdd line layout pattern 161 face the Vss line layout pattern 168 from a top view. By the third layout modification step, the metal line layout pattern 162 is spaced apart from the tie-off contact layout patterns 171-174, and therefore the cut-metal-line layout patterns 190 (referring to FIG. 8A) may be removed from the layout. Other details of the present embodiments are similar to those illustrated above, and thereto not repeated herein.

Figure 9A:
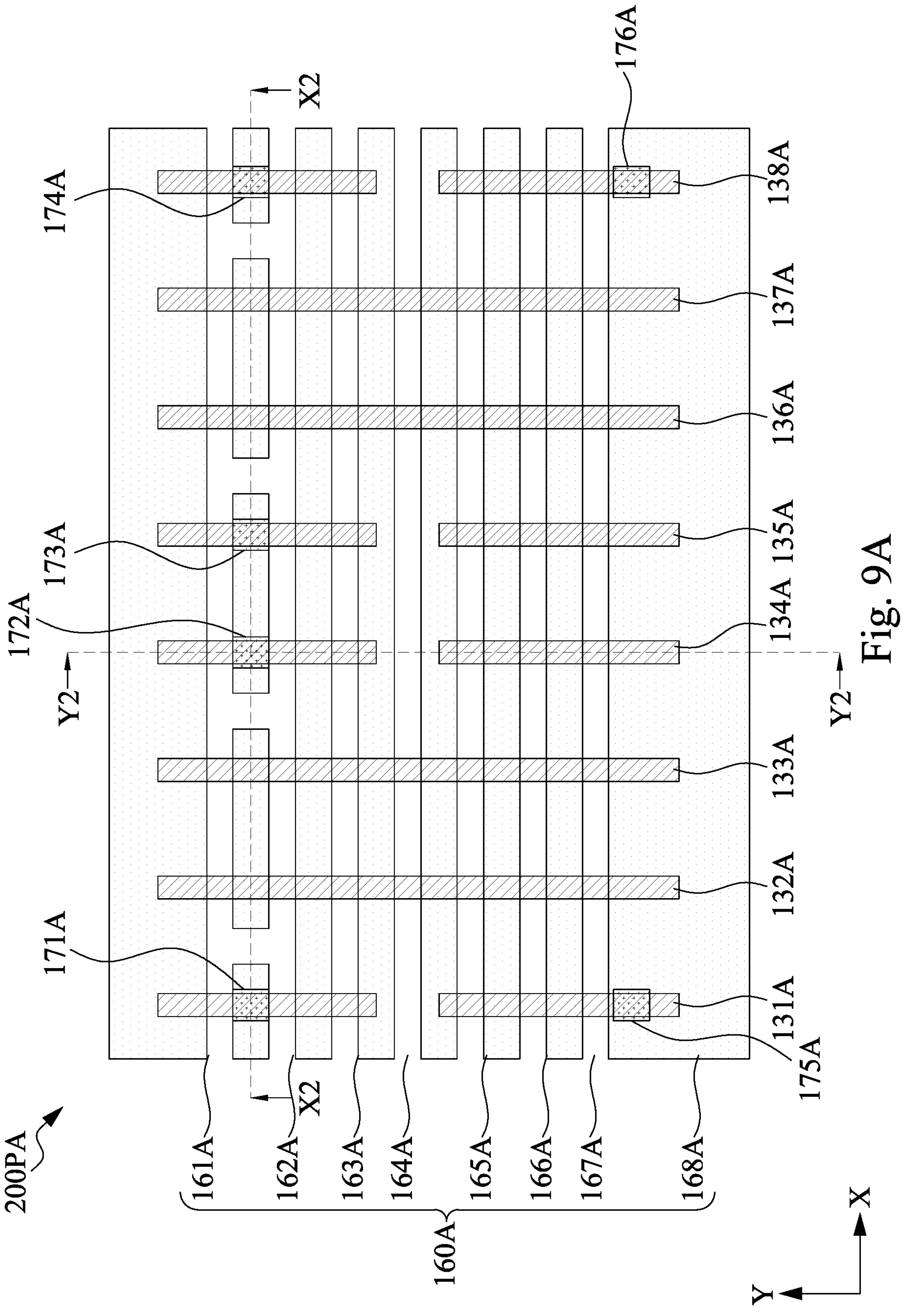
FIGS. 9A-9C are views of a semiconductor device fabricated using the layout of FIG. 8A, in accordance with some embodiments.
Figure 9B:
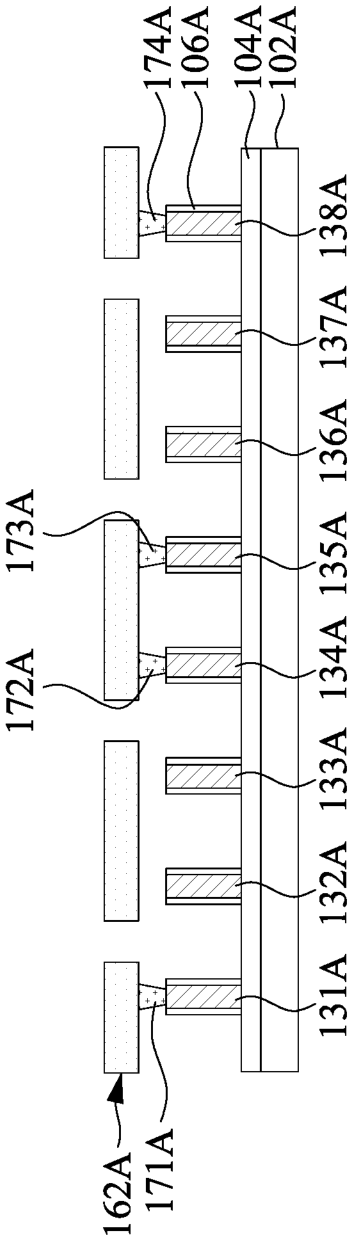
Figure 9C:
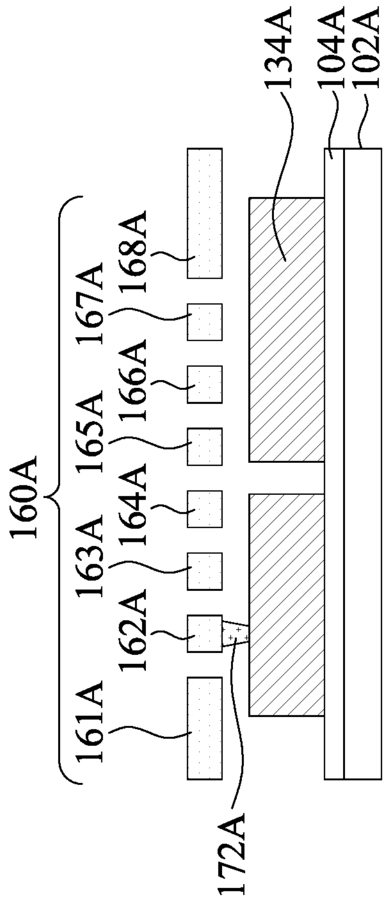

FIGS. 9A-9C are views of a semiconductor device 200PA fabricated using the layout 200P of FIG. 8A, in accordance with some embodiments. The semiconductor device 200PA includes gate structures 131A-138A, metal lines 161A-168A, and tie-off contacts 171A-176A. The gate structures 131A-138A corresponds to the gate layout patterns 131-138 of the layout 200P. The metal lines 161A-168A corresponds to the metal line layout patterns 161-168 of the layout 200P. The tie-off contacts 171A-176A corresponds to the tie-off contact layout patterns 171-176 of the layout 200P. In FIG. 9A, the tie-off contacts 171A-174A respectively overlap intersections of the metal line 162A and the gate structures 131A, 134A, 135A, and 138A, and the tie-off contacts 175A and 176A respectively overlap intersections of the Vss line 168A and the gate structures 131A and 138A. In some embodiments, the tie-off contacts 173A and 174A inside the standard cell can be used to switch off devices (e.g., PMOS or NMOS) in the standard cell. Other details of the present embodiments are similar to those illustrated above, and thereto not repeated herein.

Figure 10A:
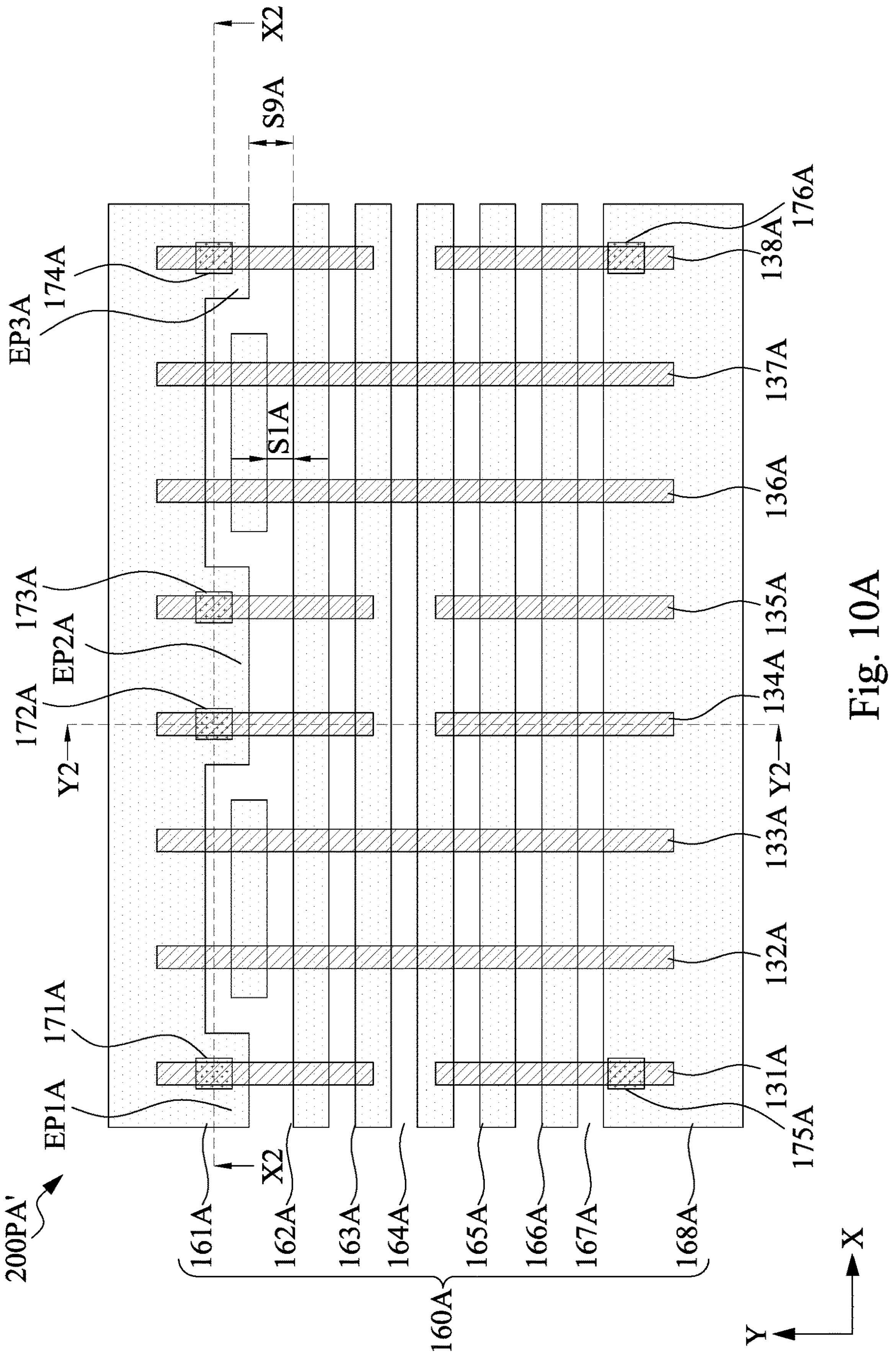
FIGS. 10A-10C are views of a semiconductor device fabricated using the layout of FIG. 8B, in accordance with some embodiments.
Figure 10B:
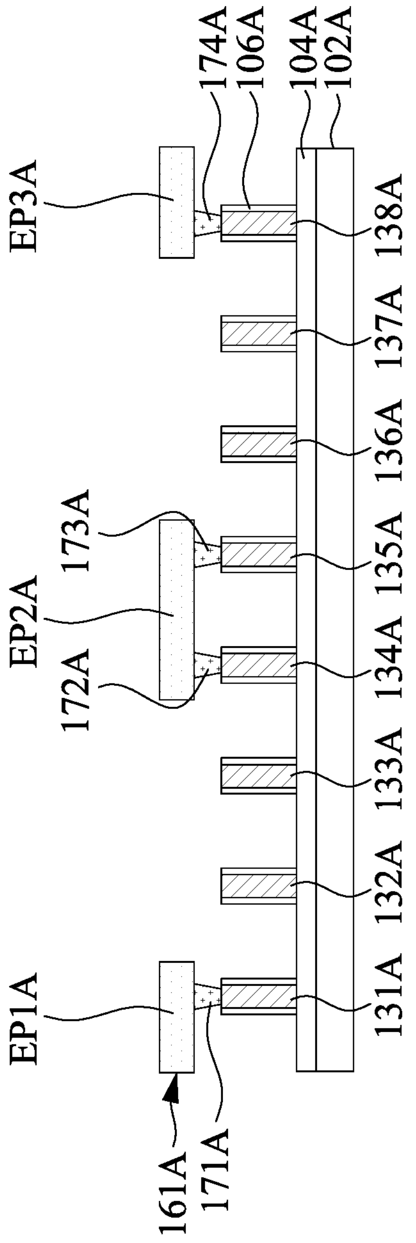
Figure 10C:
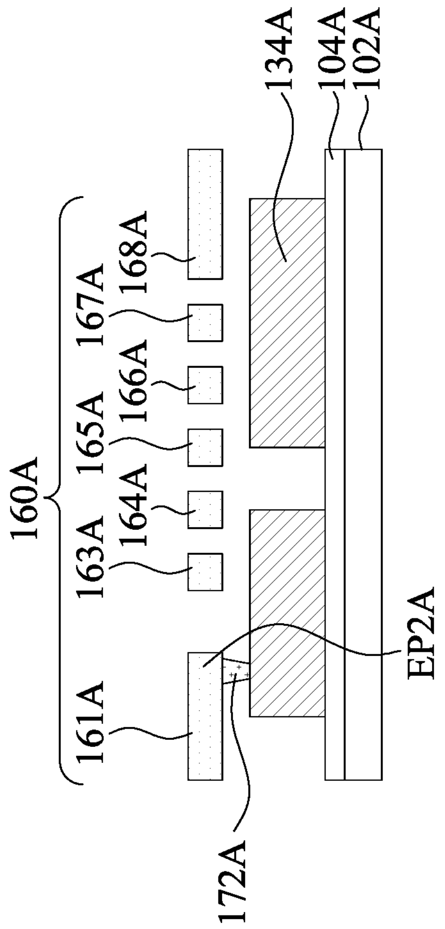

FIGS. 10A-10C are views of a semiconductor device 200PA' fabricated using the layout 200P' of FIG. 8B, in accordance with some embodiments. The semiconductor device 200PA' includes gate structures 131A-138A, metal lines 161A-168A, and tie-off contacts 171A-176A. The gate structures 131A-138A corresponds to the gate layout patterns 131-138 of the layout 200P'. The metal lines 161A-168A corresponds to the metal line layout patterns 161-168 of the layout 200P'. The tie-off contacts 171A-176A corresponds to the tie-off contact layout patterns 171-176 of the layout 200P'. In FIG. 10A, the Vdd line 161A includes protruding portions EP1A-EP3A facing the Vss line layout pattern 168A from a top view, and the protruding portions EP1A-EP3A corresponds to the protruding portions EP1-EP3 of the layout 200P'.

In the present embodiments, in FIG. 10A, the metal line 162A is immediately adjacent to the Vdd line 161A, and the metal line 162A is misaligned with the protruding portions EP1A-EP3A of the Vdd line 161A along the direction Y. In the present embodiments, the metal line 163A is immediately adjacent to the metal line 162A, and a spacing S9A between the metal line 163A and the protruding portions EP1A-EP3A of the Vdd line 161A is greater than a spacing S1A between the metal lines 162A and 163A.

In FIG. 10A, the tie-off contact 171A overlaps an intersection of the protruding portion EP1A of the Vdd line 161A and the gate structure 131A, the tie-off contact 172A overlaps an intersection of the protruding portion EP2A of the Vdd line 161A and the gate structure 134A, the tie-off contact 173A overlaps an intersection of the protruding portion EP2A of the Vdd line 161A and the gate structure 135A, and the tie-off contact 174A overlaps an intersection of the protruding portion EP3A of the Vdd line 161A and the gate structure 138A. The tie-off contacts 175A and 176A respectively overlap intersections of the Vss line 168A and the gate structures 131A and 138A. Other detail of the present embodiments are similar to those illustrated above, and thereto not repeated herein.

Figure 11:
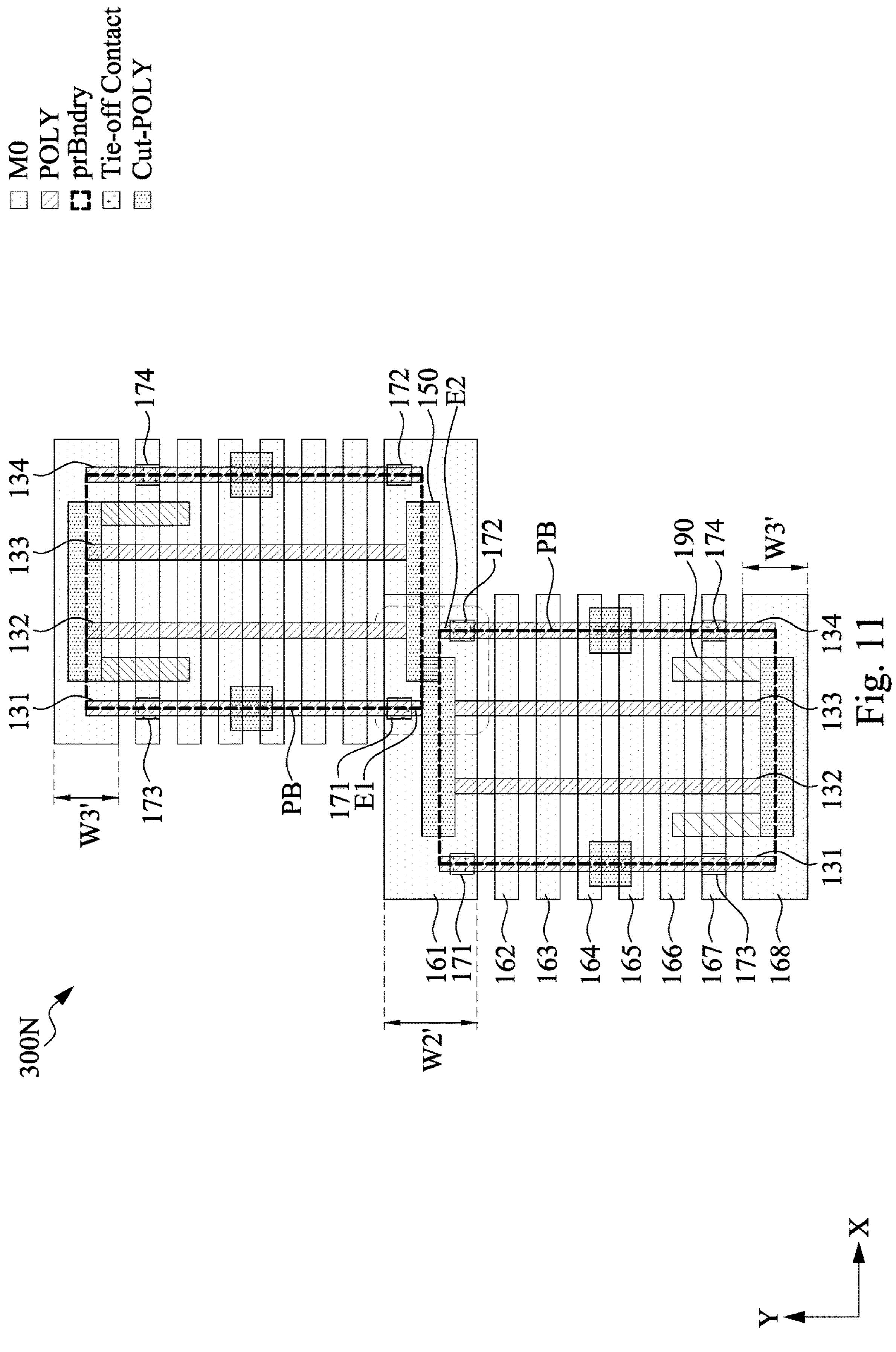
FIG. 11 represents a diagram of a layout of a semiconductor device, in accordance with some embodiments.

FIG. 11 represents a diagram of a layout 300N of a semiconductor device, in accordance with some embodiments. The layout 300N may be similar to the layout 100N in FIG. 1C, for example, the Vdd line width W2' is greater than the Vss line width W3'. In the layout 300N, one cell abuts another (adjoining boundaries PB). The layout 300N may include cut-gate layout patterns 150 at the upper and the lower sides of the boundaries PB.

In absence of the increase in width of the Vdd line layout pattern 161, the cut-gate layout patterns 150 may overlap a large section of the dummy gate layout pattern 131/134 and leave a small section of the dummy gate layout pattern 131/134 free from overlapping the cut-gate layout patterns 150. Thus, the dummy gate layout pattern 131/134 may have the small section for placing the tie-off contact 171/172, which may result in insufficient enclosure for the tie-off contact 171/172.

With the configuration of wider Vdd line layout pattern 161, while the cut-gate layout patterns 150 may overlap a large section of the dummy gate layout pattern 131/134, the dummy gate layout pattern 131/134 may still have a large section for receiving the tie-off contact 171/172. For example, as shown in FIG. 11, the tie-off contact 171/172 are spaced apart from the cut-gate layout patterns 150 by a space. That is, the dummy gate layout pattern 131/134 may have portions E1/E2 extending beyond an edge of the tie-off contact 171/172 away from the metal line layout pattern 162-167. Through the configuration, there is sufficient enclosure for the tie-off contact 171/172.

Figure 12:
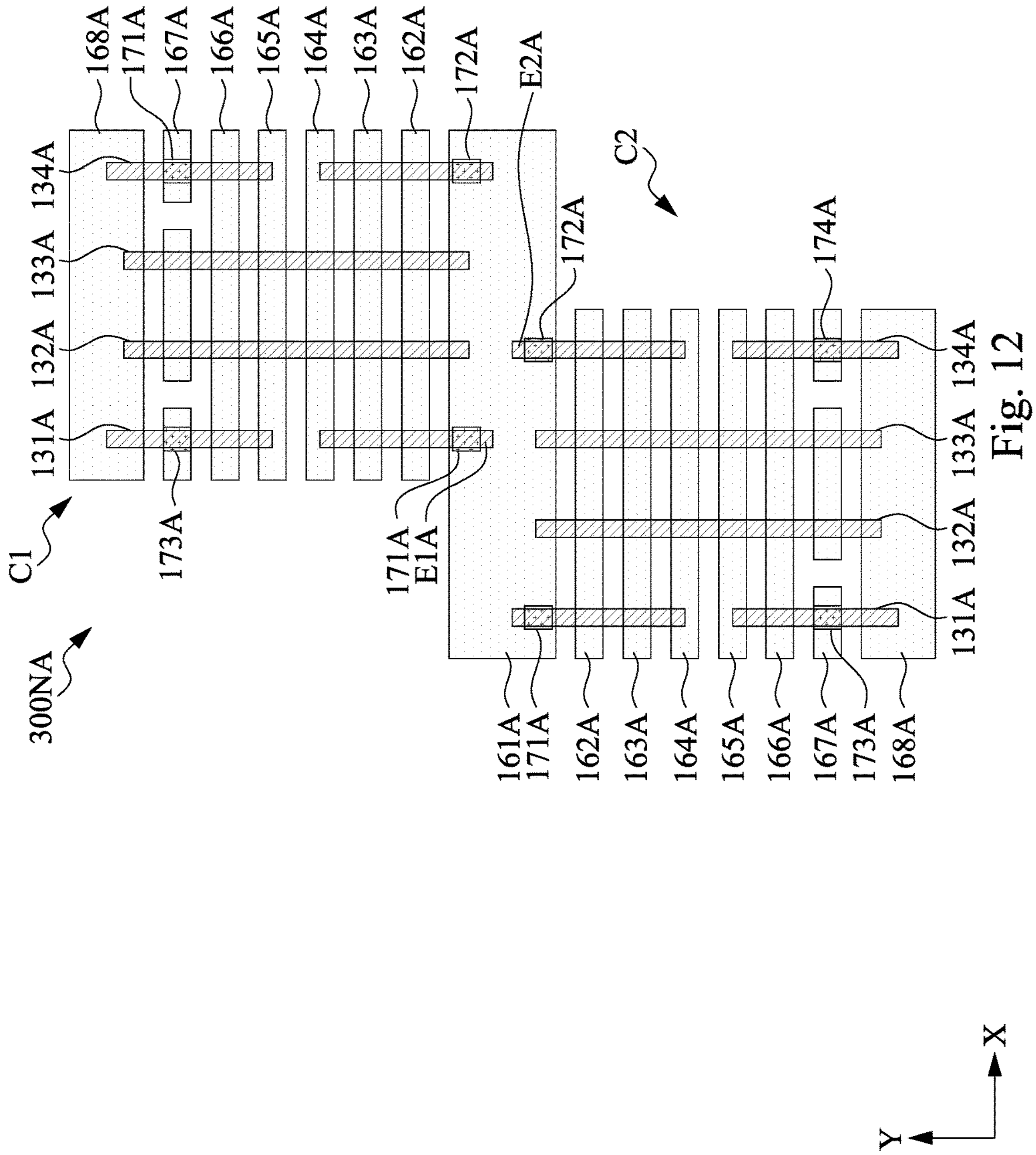
FIG. 12 represents a top view of semiconductor device fabricated using the layout of FIG. 11, in accordance with some embodiments.

FIG. 12 represents a top view of semiconductor device 300NA fabricated using the layout 300N of FIG. 11, in accordance with some embodiments. The semiconductor device 300NA includes two cells C1 and C2. Each of the cells C1 and C2 includes gate structures 131A-134A, metal lines 161A-168A, and tie-off contacts 171A-174A. The gate structures 131A-134A correspond to the gate layout patterns 131-134 of the layout 300N. The metal lines 161A-168A correspond to the metal line layout patterns 161-168 of the layout 300N. The tie-off contacts 171A-174A correspond to the tie-off contact layout patterns 171-174 of the layout 300N. As shown in FIG. 12, above the Vss metal line 161A, the gate structure 131A/134A has a portion E1A/E2A extending beyond an edge of the tie-off contact 171A/172A away from the tie-off contacts 173A and 174A. Through the configuration, sufficient connectivity is provided between the gate structure 131A/134A and the tie-off contact 171A/172A. Other details of the present embodiments are similar to those illustrated above, and thereto not repeated herein.

Figure 13A:
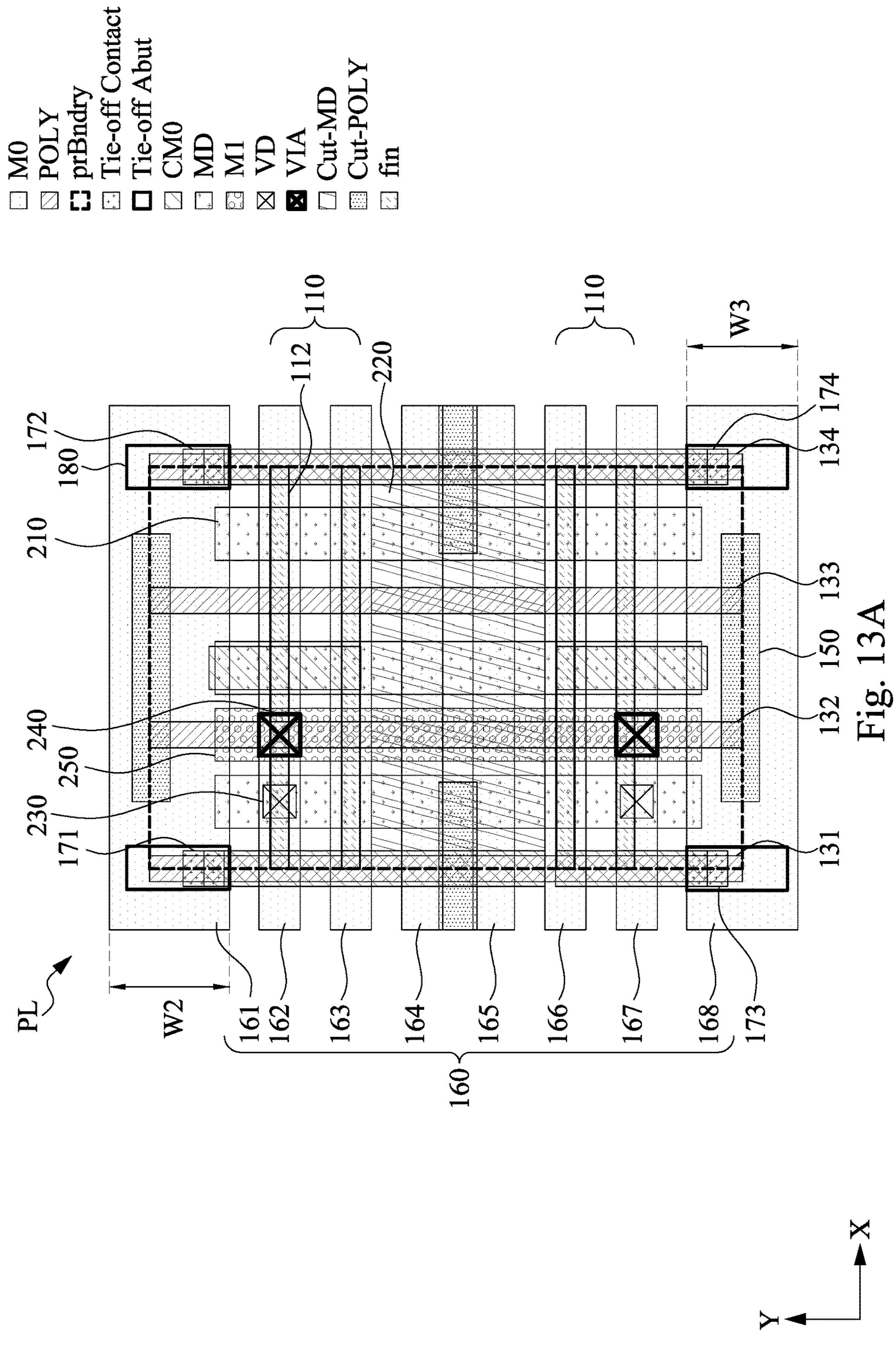
FIGS. 13A-13C illustrate a method of drawing a layout of a semiconductor device having a drain-to-drain connection, in accordance with some embodiments.
Figure 13B:
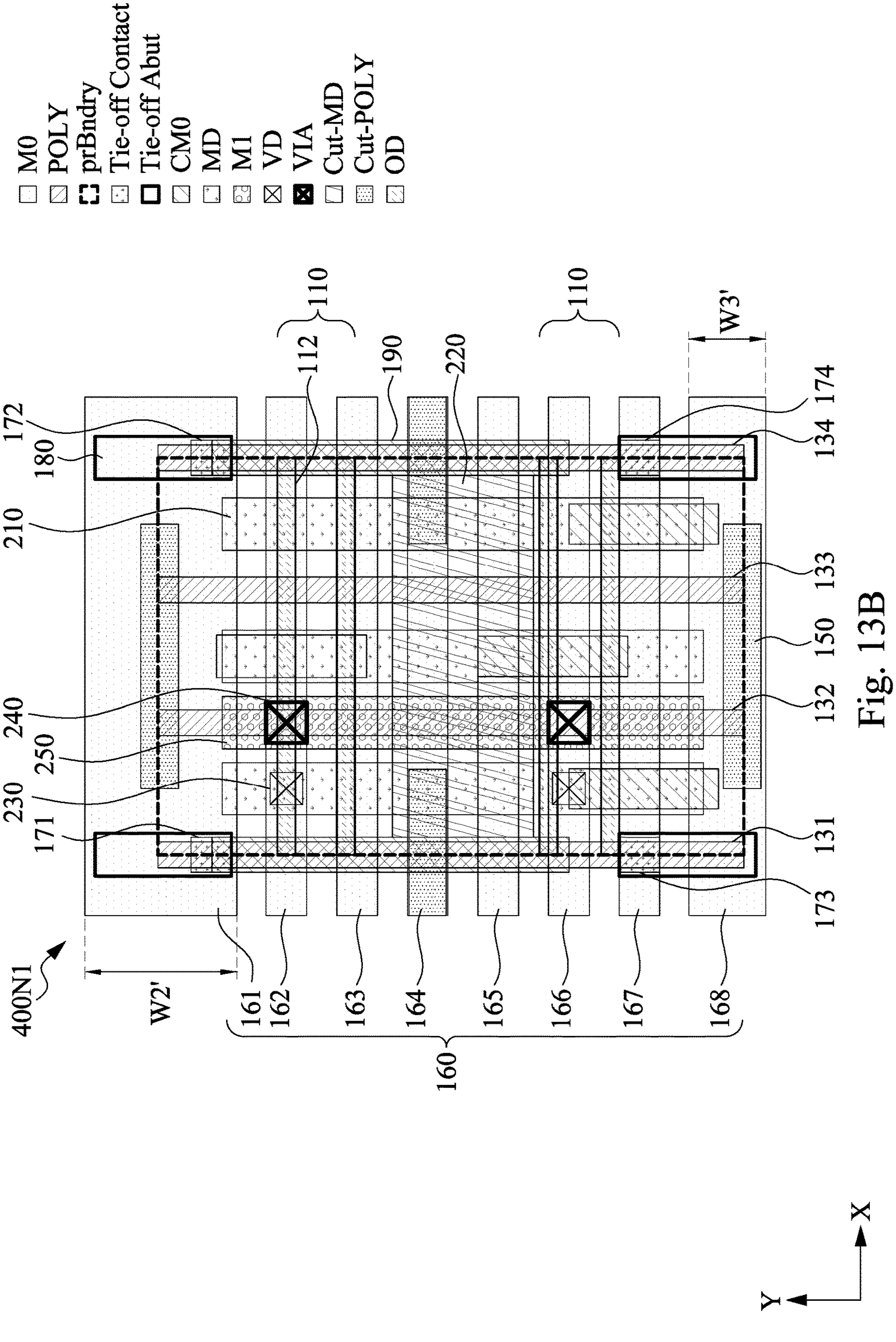
Figure 13C:
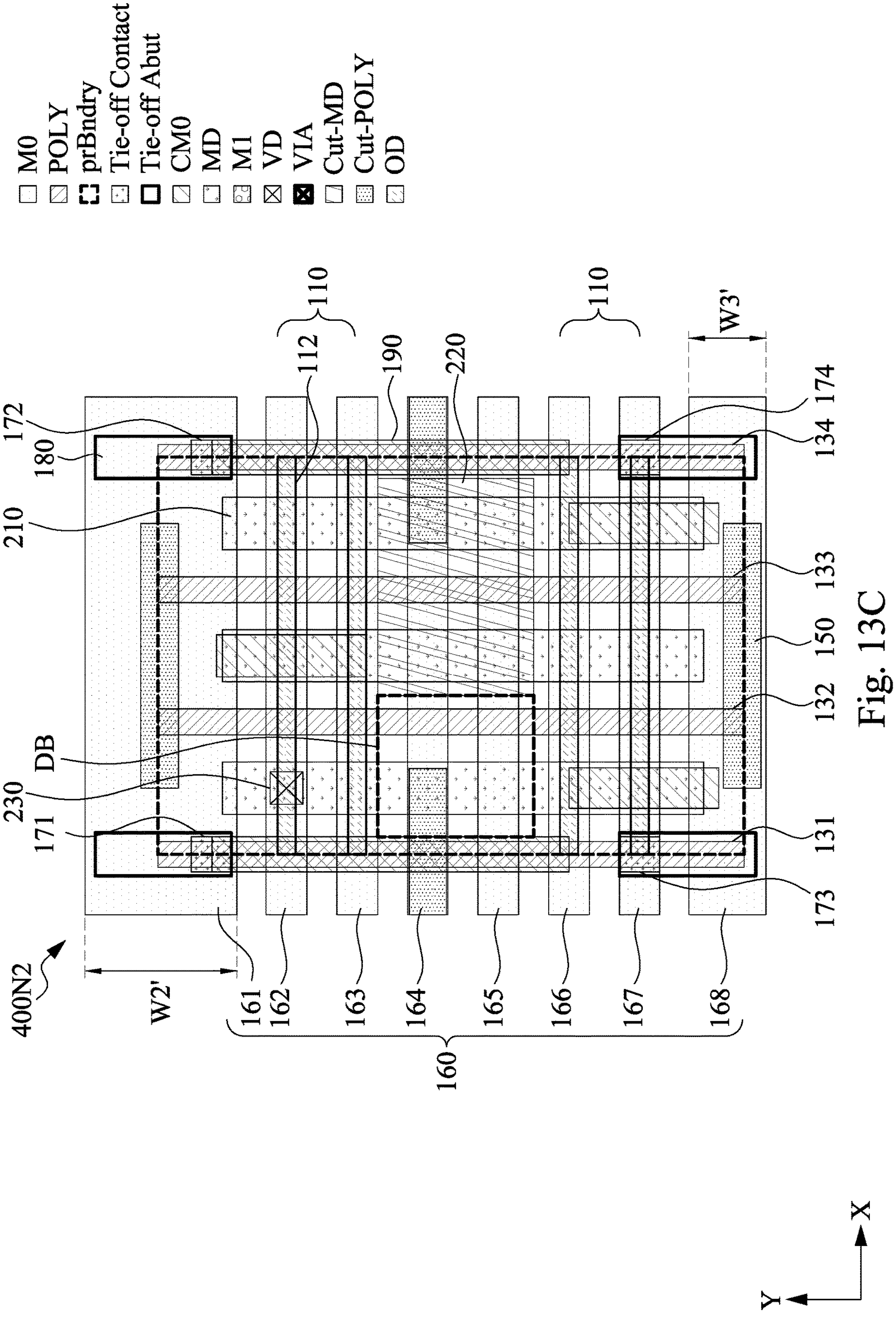
Figure 14A:
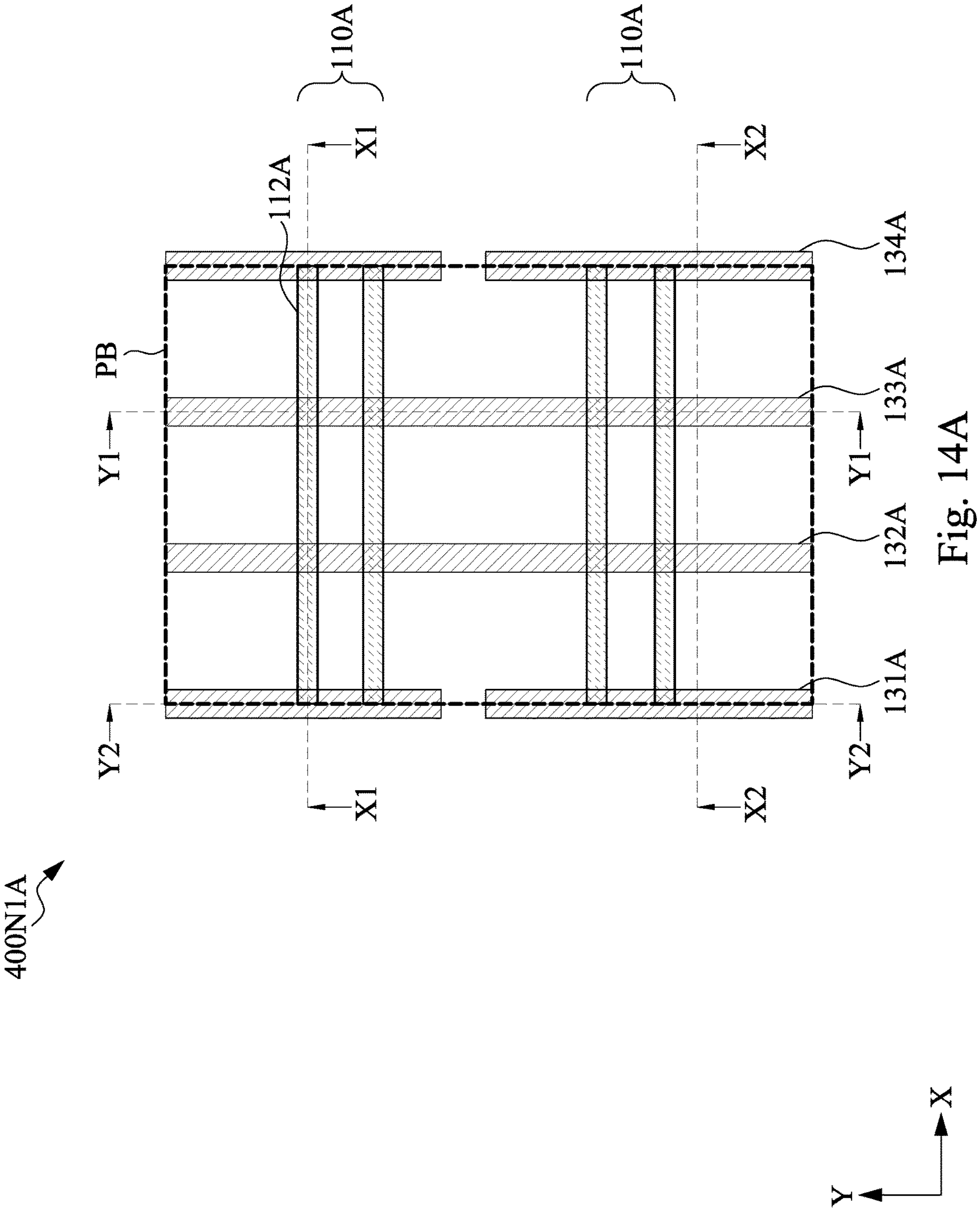
FIGS. 14A-18E illustrate a method of fabricating a semiconductor device using the layout of FIG. 13B, in accordance with some embodiments.
Figure 14D:
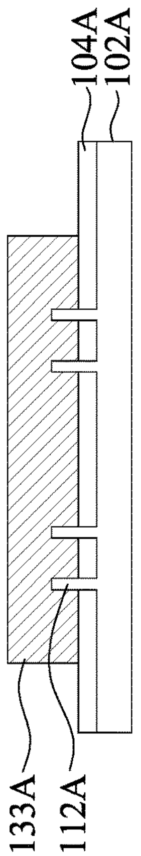
Figure 14E:
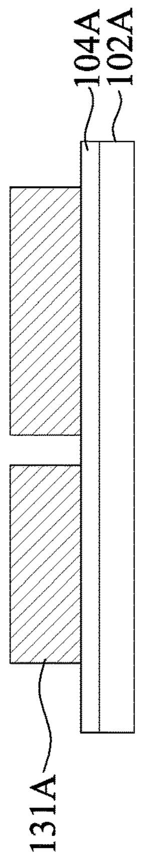
Figure 14B:
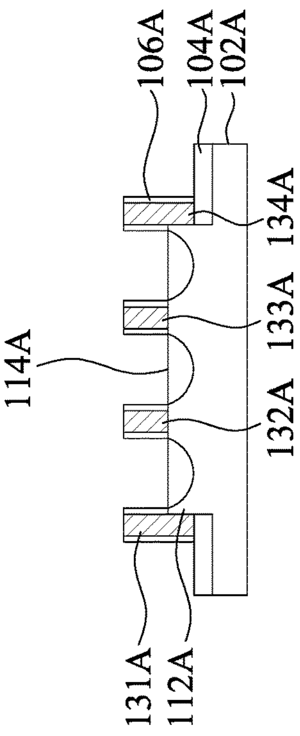
Figure 14C:
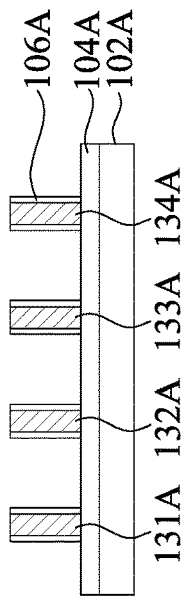
Figure 15A:
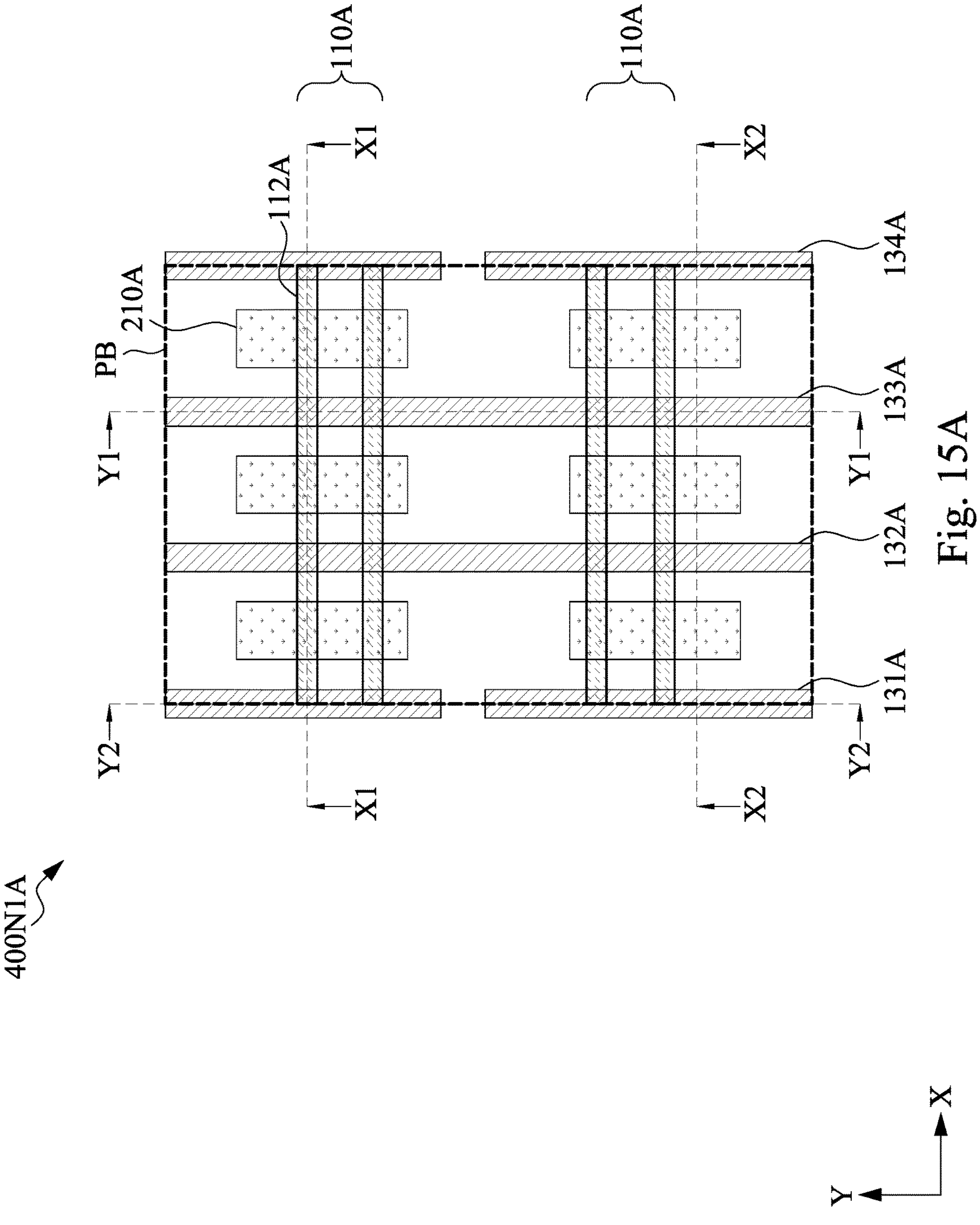
Figure 15D:
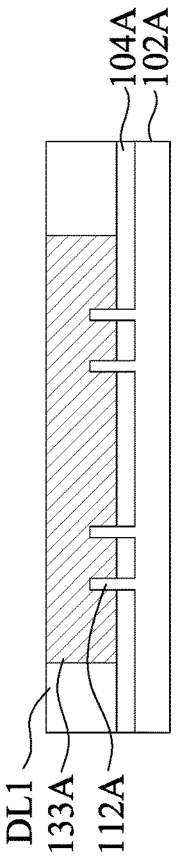
Figure 15E:
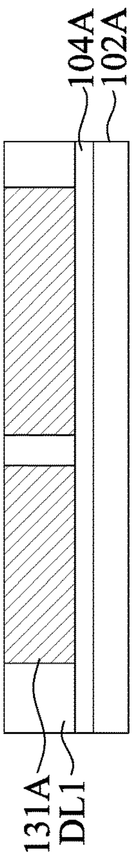
Figure 15B:
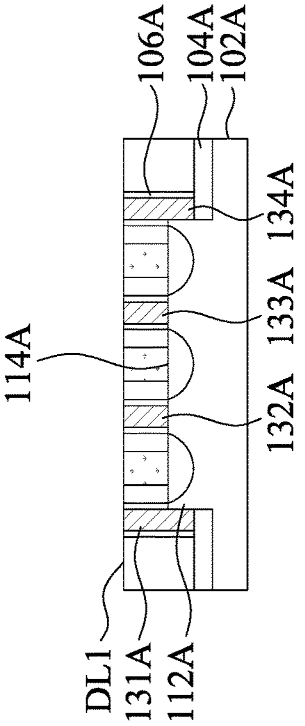
Figure 15C:
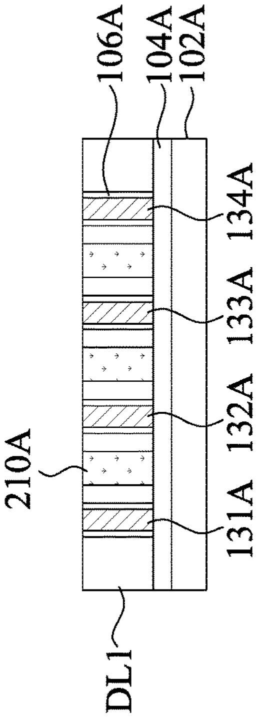
Figure 16A:
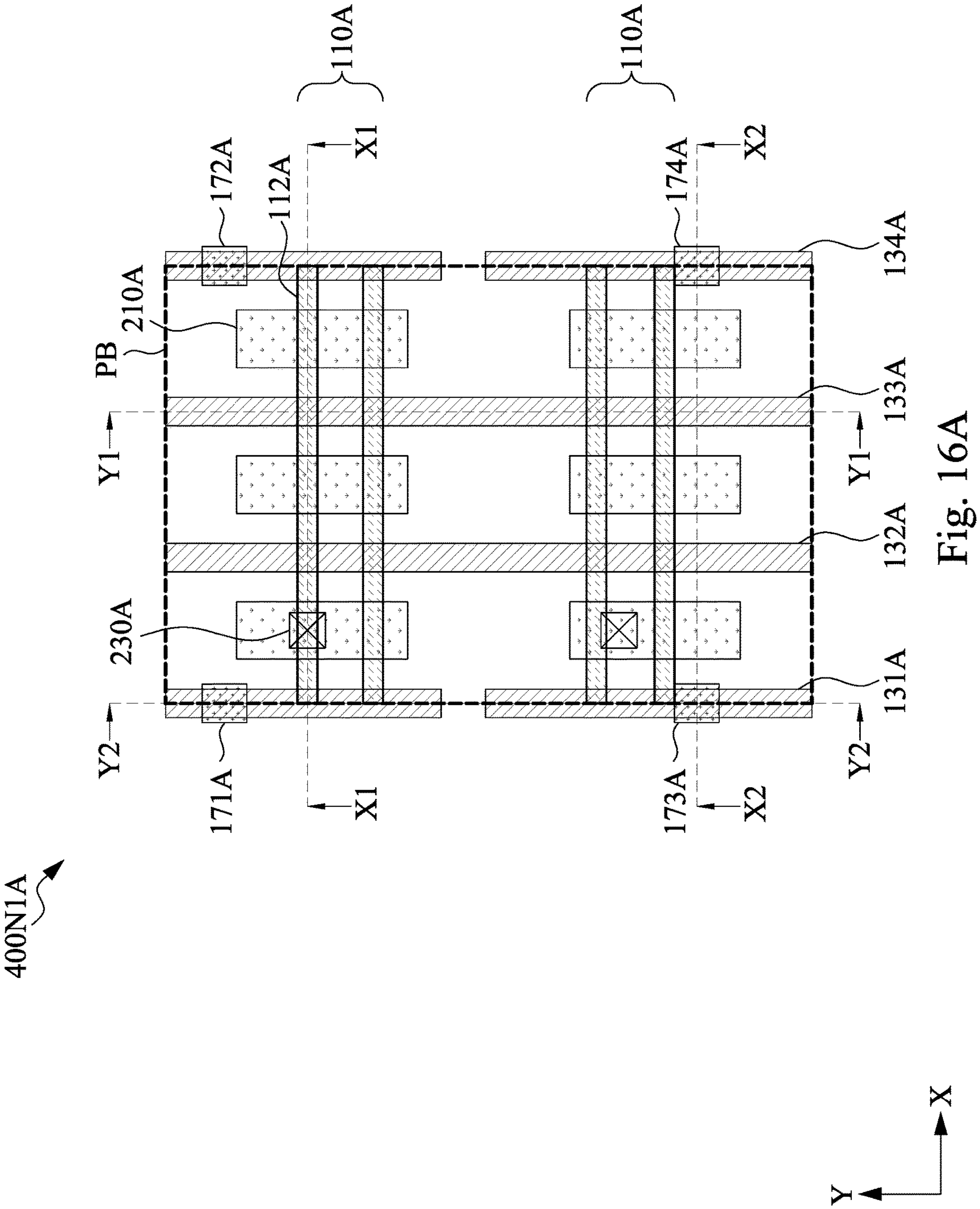
Figure 16B:
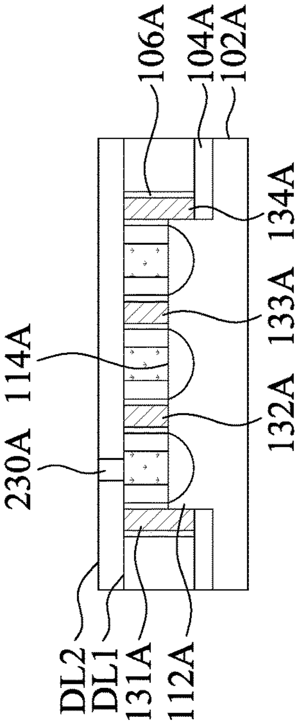
Figure 16C:
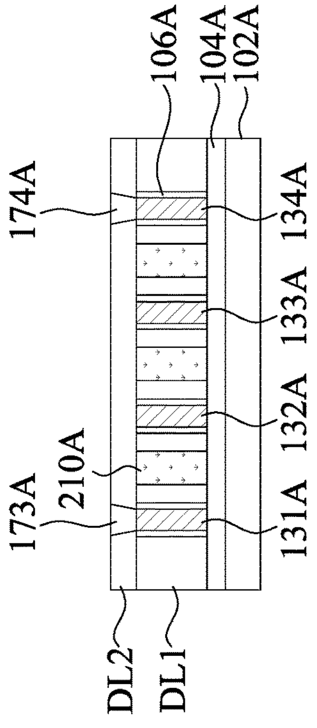
Figure 16D:
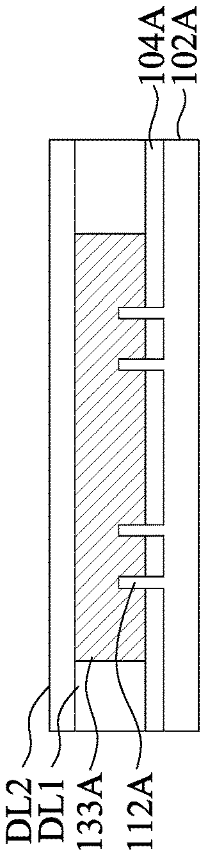
Figure 16E:
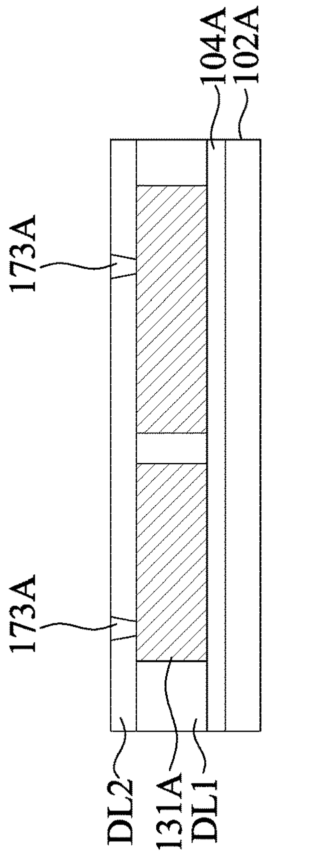
Figure 17A:
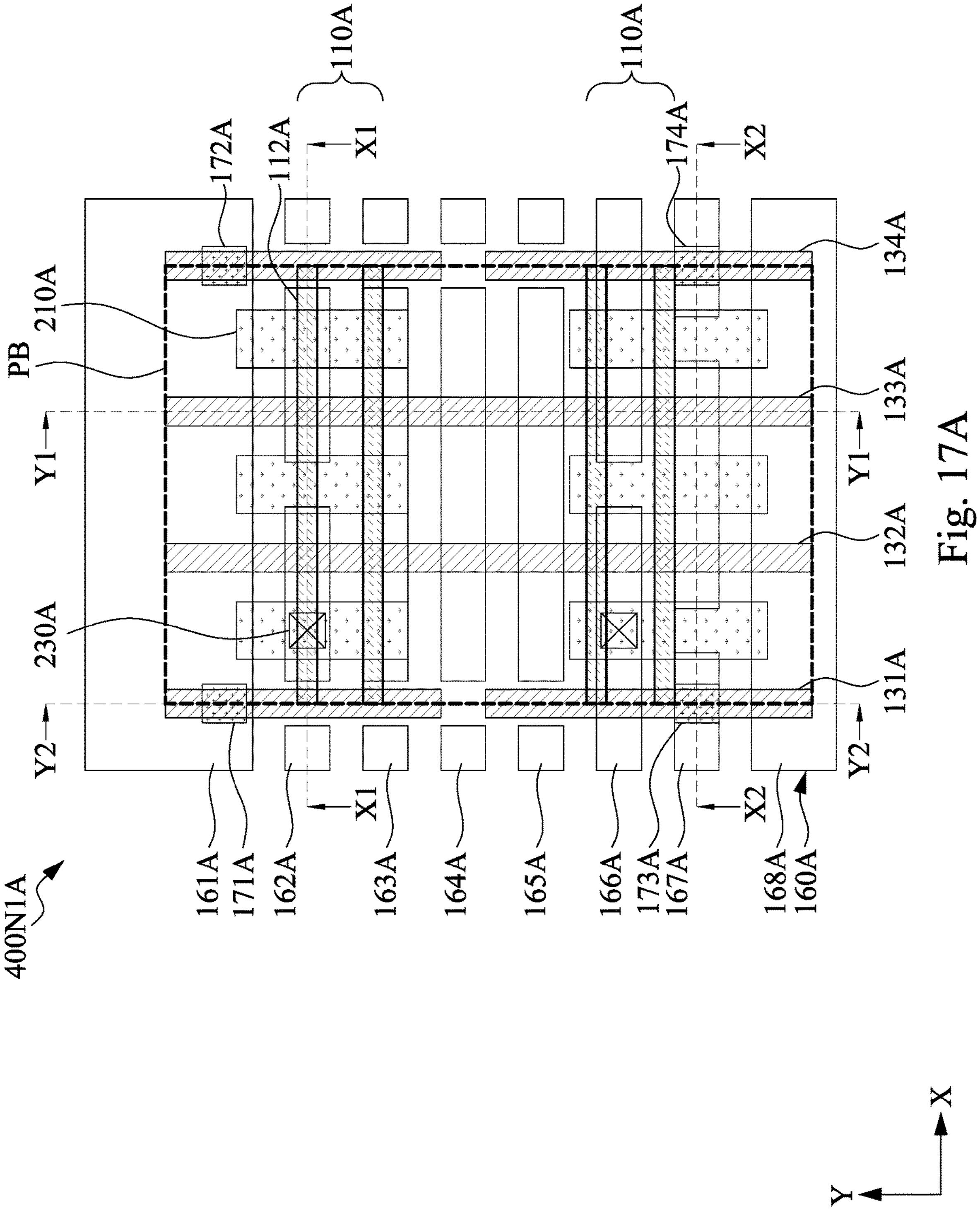
Figure 17D:
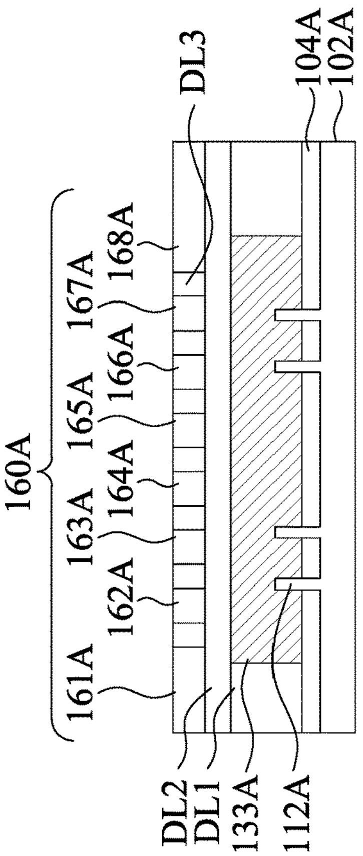
Figure 17E:
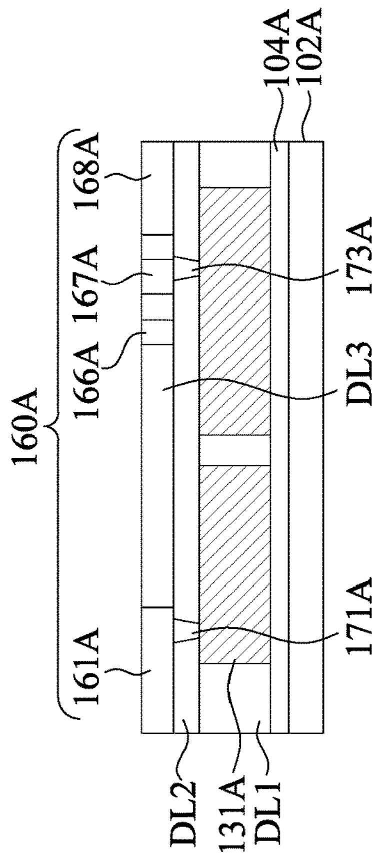
Figure 17B:
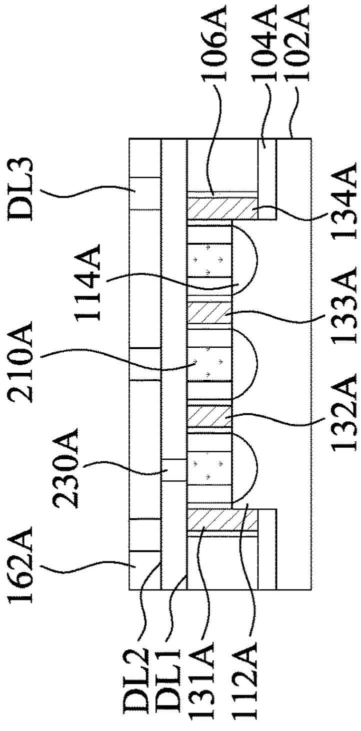
Figure 17C:
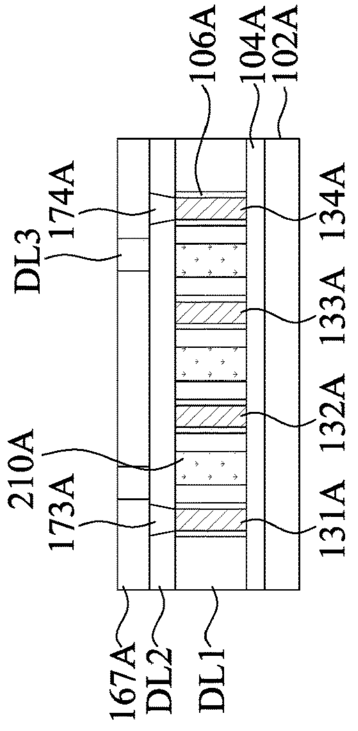
Figure 18A:
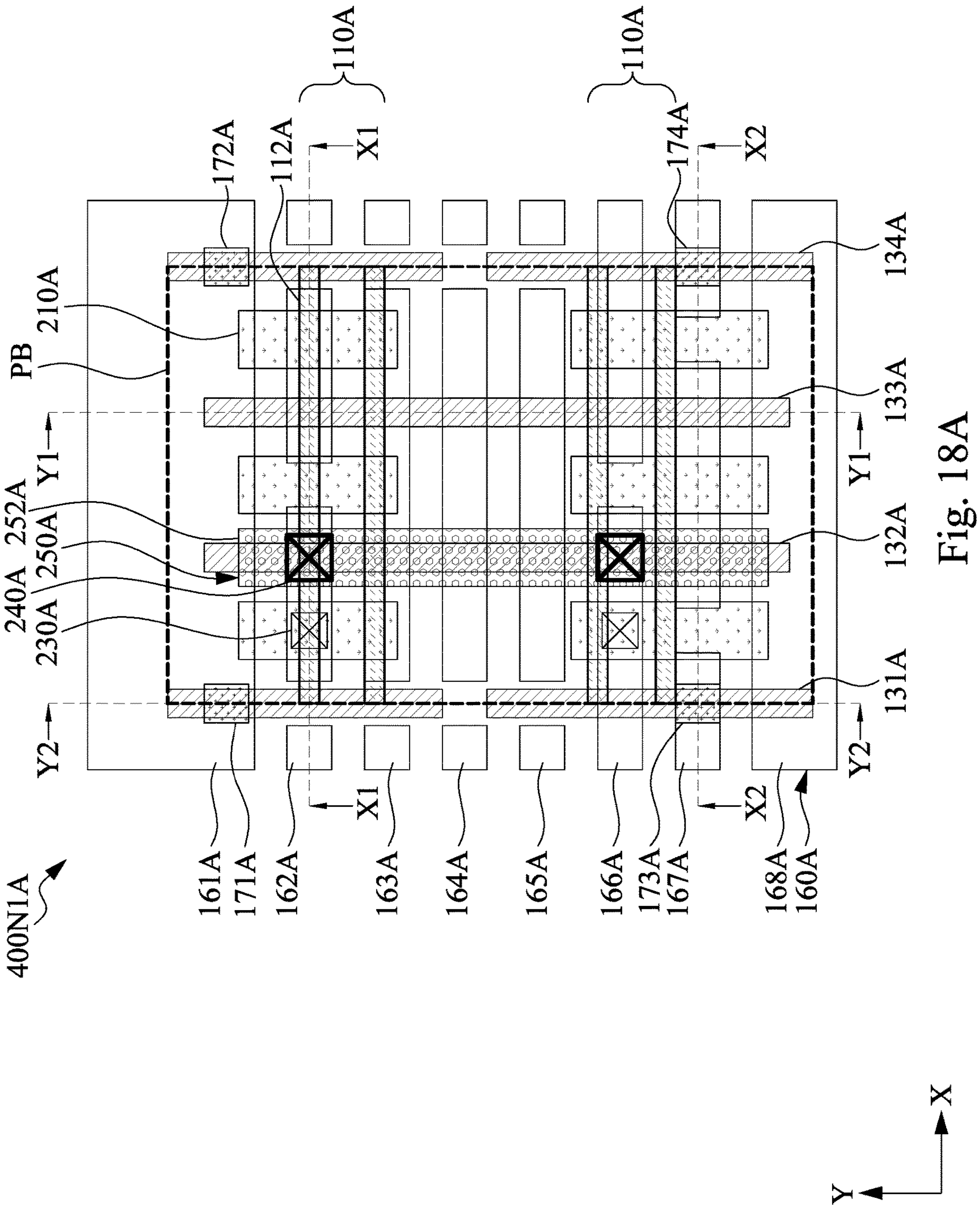
Figure 18B:
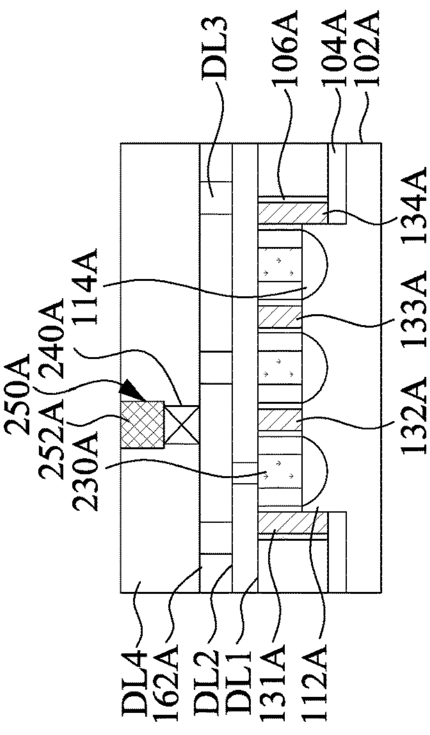
Figure 18C:
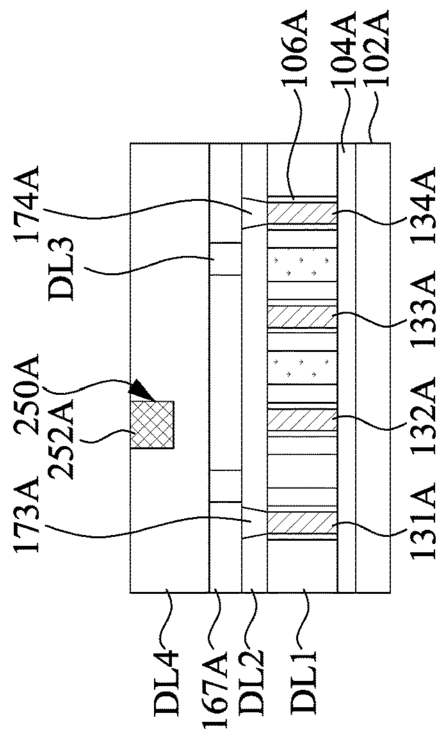
Figure 18D:
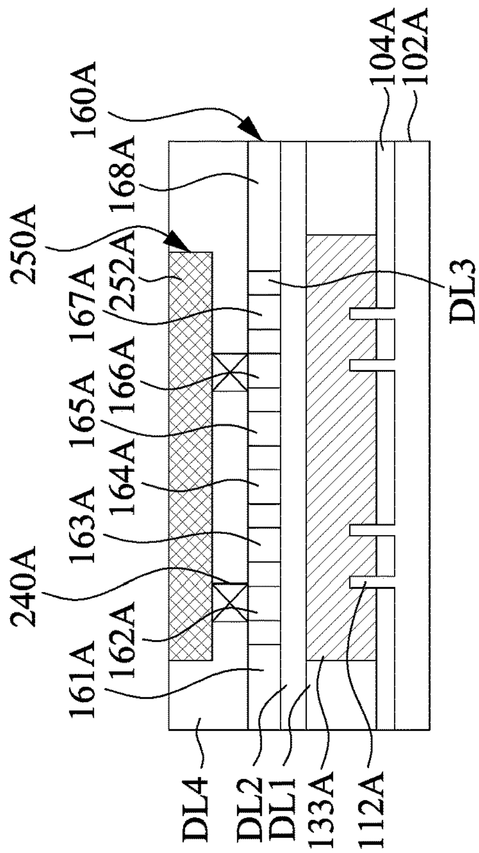
Figure 18E:
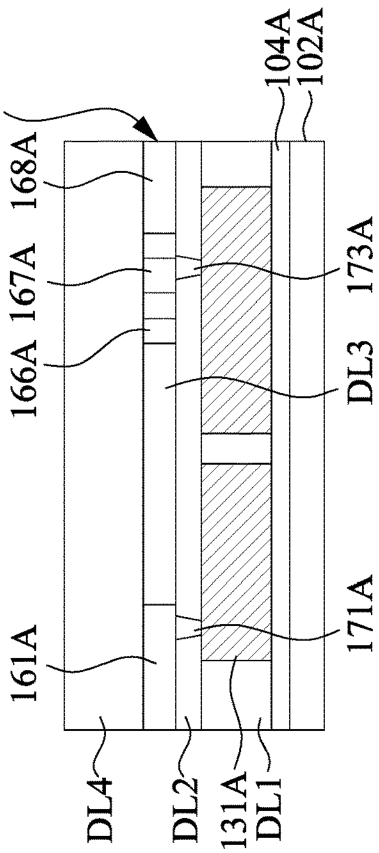

FIGS. 13A-13C illustrate a method of drawing a layout of a semiconductor device having a drain-to-drain connection, in accordance with some embodiments. The method of drawing the layout in FIGS. 13A-13C attempts to increase the Vdd line width and decrease the Vss line width. It is understood that additional steps may be provided before, during, and after the steps shown in FIGS. 13A-13C, and some of the steps described below can be replaced or eliminated for additional embodiments of the method. The order of the operations/processes may be interchangeable.

FIG. 13A shows a primary layout PL of a semiconductor device having a drain-to-drain connection in accordance with some embodiments. The primary layout PL may include fin group layout patterns 110, gate layout patterns 131, 132, 133 and 134, cut-gate layout patterns 150, a metallization layout pattern 160 including metal line layout patterns 161-168, tie-off contact layout patterns 171-174, tie-off abut layout patterns 180, and cut-metal-line layout patterns 190. The details of these components are similar to those aforementioned, and not repeated for sake of brevity.

The primary layout PL may further include source/drain contact layout patterns 210, a cut-contact layout pattern 220, source/drain via layout patterns 230, metal via layout patterns 240, and an upper metallization layout pattern 250.

The source/drain contact layout patterns 210 extend substantially along the Y direction across the fin group layout patterns 110. The source/drain contact layout patterns 210 are identified in the legend in the drawing with label "MD". The cut-contact layout pattern 220 may extend substantially along the Y direction across one or more the source/drain contact layout patterns 210. The cut-contact layout pattern 220 represents cut sections or patterning area where the source/drain contact layout patterns 210 are removed for electrical isolation according to the integrated circuit design. The cut-contact layout pattern 220 is identified in the legend in the drawing with label "Cut-MD".

Each of the source/drain via layout patterns 230 may overlap an intersection of the source/drain contact layout patterns 210 and the metal line layout pattern 162/166, thus providing an electrical connection between the source/drain contact layout patterns 210 and the metal line layout pattern 162/166. The source/drain via layout patterns 230 are identified in the legend in the drawing with label "VD".

The upper metallization layout pattern 250 may include an upper metal line layout pattern 252 extending substantially along the Y direction across the metal line layout patterns 161-168. The upper metallization layout pattern 250 is identified in the legend in the drawing with label "Ml."

Each of the metal via layout patterns 240 may overlap an intersection of the upper metal line layout pattern 252 and the metal line layout pattern 162/166, thus providing an electrical connection between the upper metal line layout pattern 252 and the metal line layout pattern 162/166. The metal via layout patterns 240 are identified in the legend in the drawing with label "VIA." Through the configuration, two portions of the source/drain contact layout patterns 210 cut by the cut-contact layout pattern 220 are electrically connected by the upper metal line layout pattern 252, the metal via layout patterns 240, the metal line layout patterns 162 and 167, and the source/drain via layout patterns 230, thereby establishing the drain-to-drain connection.

Reference is made to FIG. 13B. The aforementioned first and second layout modification steps are performed to the primary layout PL in FIG. 13A, and a layout 400N1 is obtained. As illustrated in FIG. 1B, the first modification step includes moving the tie-off contact layout pattern 173 and 174 from the Vss line layout pattern 168 to the metal line layout pattern 167 and adding cut-metal-line layout patterns 190 into the layout. As illustrated in FIG. 1C, the second modification step includes increasing the width of the Vdd line layout pattern 161, decreasing the width of Vss line layout pattern 168, and shifting/moving the metal line layout pattern 162-167 toward the Vss line layout pattern 168 away from the Vdd line layout pattern 161. For example, the width W2 of the Vdd line layout pattern 161 in FIG. 13A is increased to a width W2' in FIG. 13B, and the width W3 of the Vss line layout pattern 168 in FIG. 11A is decreased to be a width W3' in FIG. 13B. Other details of FIG. 13B are similar to those illustrated in FIGS. 1A-1D, and thereto not repeated herein.

The layout 400N1 is used to manufacture a semiconductor device 400N1A in FIGS. 18A-18E. In the present embodiments, the fin group layout patterns 110 define corresponding fin group regions 110A of the semiconductor device 400N1A (referring to FIGS. 18A-18E). The gate layout patterns 131-134 of the layout 400N1 define corresponding gate structures 131A, 132A, 133A and 134A of the semiconductor device 400N1A (referring to FIGS. 18A-18E). The metallization layout pattern 160 (e.g., metal line layout patterns 161-168) of the layout 400N1 define corresponding metallization layer 160A (e.g., metal lines 161A-168A) of the semiconductor device 400N1A (referring to FIGS. 18A-18E). The tie-off contact layout patterns 171, 172, 173, and 174 of the layout 400N1 define corresponding tie-off contacts 171A, 172A, 173A, and 174A of the semiconductor device 400N1A (referring to FIGS. 18A-18E). The source/drain contact layout patterns 210 of the layout 400N1 define corresponding source/drain contacts 210A of the semiconductor device 400N1A (referring to FIGS. 18A-18E). The source/drain via layout patterns 230 of the layout 400N1 define corresponding source/drain vias 230A of the semiconductor device 400N1A (referring to FIGS. 18A-18E). The metal via layout patterns 240 of the layout 400N1 define corresponding metal vias 240A of the semiconductor device 400N1A (referring to FIGS. 18A-18E). The upper metallization layout pattern (e.g., metal line layout pattern 252) of the layout 400N1 define corresponding upper metallization layer 250A (e.g., metal line 252A) of the semiconductor device 400N1A (referring to FIGS. 18A-18E).

Reference is made to FIG. 13C. A fourth layout modification step is optionally performed to the layout 400N1 in FIG. 13B, and a layout 400N2 is obtained. The fourth layout modification step includes removing a portion of the cut-contact layout pattern 220 (indicated by the dashed block DB) over one of the source/drain contact layout patterns 210 that has the portions for the drain-to-drain connection in FIG. 13B. By the fourth modification step, the drain-to-drain connection can be built by a single continuous source/drain contact layout pattern 210, without using the metal line layout pattern 162/166, the metal via layout patterns 240 and the upper metal line layout pattern 252 (referring to FIG. 13B). The metal via layout patterns 240 and the upper metal line layout pattern 252 (referring to FIG. 13B) are removed in FIG. 13C. Other details of FIG. 13C are similar to those illustrated in FIG. 13B, and thereto not repeated herein.

Figure 19:
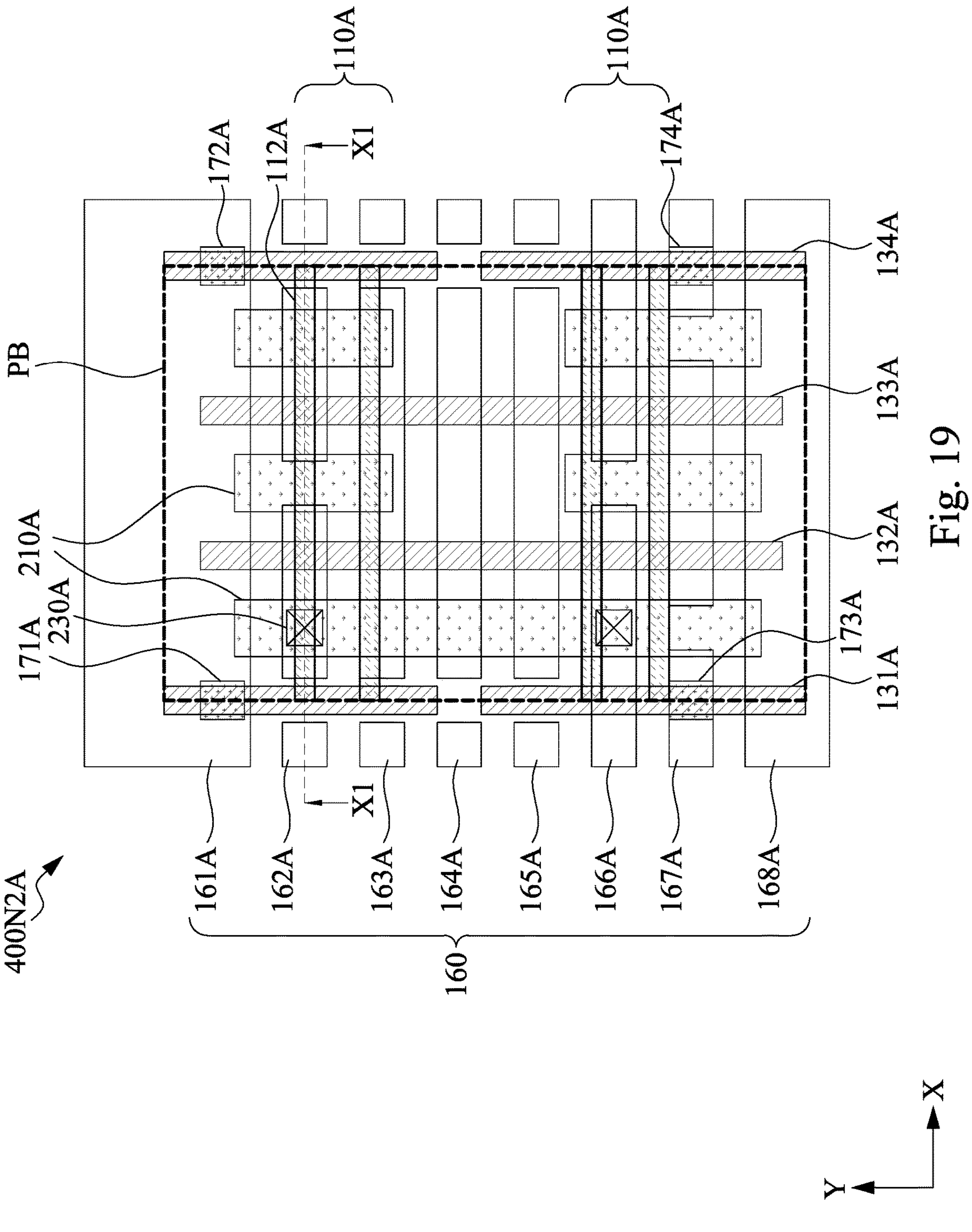
FIG. 19 is a top view of a semiconductor device fabricated using the layout of FIG. 13C, in accordance with some embodiments.

The layout 400N2 is used to manufacture a semiconductor device 400N2A in FIG. 19. In the present embodiments, the fin group layout patterns 110 define corresponding fin group regions 110A of the semiconductor device 400N2A (referring to FIG. 19). The gate layout patterns 131-134 of the layout 400N2 define corresponding gate structures 131A, 132A, 133A and 134A of the semiconductor device 400N2A (referring to FIG. 19). The metallization layout pattern 160 (e.g., metal line layout patterns 161-168) of the layout 400N2 define corresponding metallization layer 160A (e.g., metal lines 161A-168A) of the semiconductor device 400N2A (referring to FIG. 19). The tie-off contact layout patterns 171, 172, 173, and 174 of the layout 400N2 define corresponding tie-off contacts 171A, 172A, 173A, and 174A of the semiconductor device 400N2A (referring to FIG. 19). The source/drain contact layout patterns 210 of the layout 400N2 define corresponding source/drain contacts 210A of the semiconductor device 400N2A (referring to FIG. 19). The source/drain via layout patterns 230 of the layout 400N2 define corresponding source/drain vias 230A of the semiconductor device 400N2A (referring to FIG. 19).

FIGS. 14A-18E illustrate a method of fabricating a semiconductor device 400N1A using the layout 400N1 of FIG. 13B, in accordance with some embodiments. The semiconductor device 400N1A may inherit geometry of patterns in the layout 400N1. It is understood that additional steps may be provided before, during, and after the steps shown in FIGS. 14A-18E, and some of the steps described below can be replaced or eliminated for additional embodiments of the method. The order of the operations/processes may be interchangeable.

FIGS. 14A-14E illustrate the formation of fins 112A and the gate structures 131A-134A. The semiconductor device 100NA includes a substrate 102A. The fins 112A may be formed by patterning the semiconductor substrate 102A using photolithography and etching techniques. The isolation structure 104A is formed to separate the fins 112A from each other. The gate structures 131A-134A are formed across the fins 112A. In some embodiments, the gate structures 131A-134A are high-k metal gate (HKMG) structures that may be formed using the gate-last process flow. In a gate-last process flow, sacrificial dummy gate structures (e.g., polysilicon gate, not shown) are formed over the fins 112A and the isolation structure 104A. Gate spacers 106A may be formed alongside sacrificial dummy gate structures. The source/drain regions 114A may be formed self-aligned to the gate spacers 106A in the fins 112A. After the formation of the source/drain regions 114A, the sacrificial dummy gate structures are replaced with high-k metal gate (HKMG) materials, thereby forming the gate structures 131A-134A between the gate spacers 106A.

FIGS. 15A-15E illustrate the formation of source/drain contacts 210A. An interlayer dielectric layer DL1 may be deposited around the gate structures 131A-134A. The interlayer dielectric layer DL1 may include suitable dielectric materials, such assuitable dielectric materials, such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. Formation of the source/drain contacts 210A may include etching source/drain contact openings in the interlayer dielectric layer DL1 to expose the source/drain regions 114A, depositing one or more conductive materials in the source/drain contact openings, and planarizing the one or more conductive materials by using, for example, a CMP process. The one or more conductive materials may include, for example, W, Ru, Co, Cu, Ti, TiN, Ta, TaN, Mo, Ni, other metal, or combinations thereof. Remaining portions of the one or more conductive materials in the source/drain contact openings may form the source/drain contacts 210A.

FIGS. 16A-16E illustrate the formation of tie-off contacts 171A, 172A, 173A, and 174A and source/drain vias 230A. An interlayer dielectric layer DL2 may be deposited over the structure of FIGS. 15A-15E. The interlayer dielectric layer DL2 may include suitable dielectric materials, such as TEOS oxide, un-doped silicate glass, or doped silicon oxide such as BPSG, FSG, PSG, BSG, and/or other suitable dielectric materials. Formation of the tie-off contacts 171A-174A includes, for example, etching tie-off contact openings in the interlayer dielectric layer DL2 over the gate structures 131A-134A, depositing one or more conductive materials in the tie-off contact openings, and planarizing the one or more conductive materials by using, for example, a CMP process. The one or more conductive materials may include, for example, W, Ru, Co, Cu, Ti, TiN, Ta, TaN, Mo, Ni, other metal, or combinations thereof. Remaining portions of the one or more conductive materials in the tie-off contact openings may form the tie-off contacts 171A, 172A, 173A, and 174A.

Similarly, formation of the source/drain vias 230A includes, for example, etching source/drain via openings in the interlayer dielectric layer DL2 over the source/drain contacts 210A, depositing one or more conductive materials in the source/drain via openings, and planarizing the one or more conductive materials by using, for example, a CMP process. The one or more conductive materials may include, for example, W, Ru, Co, Cu, Ti, TiN, Ta, TaN, Mo, Ni, other metal, or combinations thereof. Remaining portions of the one or more conductive materials in the source/drain via openings may form the source/drain vias 230A.

FIGS. 17A-17E illustrate the formation of a metallization layer 160A. The metallization layer 160A may include metal lines 161A-168A embedded in an interlayer dielectric layer DL3. The interlayer dielectric layer DL3 may be deposited over the structure of FIGS. 16A-16E prior to the formation of the metallization layer 160A. The interlayer dielectric layer DL3 may include suitable dielectric materials, such as suitable dielectric materials, such as TEOS oxide, un-doped silicate glass, or doped silicon oxide such as BPSG, FSG, PSG, BSG, and/or other suitable dielectric materials. Formation of the metallization layer 160A includes, for example, etching trenches in the interlayer dielectric layer DL3, depositing one or more conductive materials in the trenches, and planarizing the one or more conductive materials by using, for example, a CMP process. The one or more conductive materials may include, for example, W, Ru, Co, Cu, Ti, TiN, Ta, TaN, Mo, Ni, other metal, or combinations thereof. Remaining portions of the one or more conductive materials in the trenches may form the metal lines 161A-168A of the metallization layer 160A.

FIGS. 18A-18E illustrate the formation of metal vias 240A and a metallization layer 250A. The metallization layer 250A may include a metal line 252A embedded in an interlayer dielectric layer DL4. An interlayer dielectric layer DL4 may be deposited over the structure of FIGS. 17A-17E prior to the formation of the metallization layer 250A. The interlayer dielectric layer DL4 may include suitable dielectric materials, such as suitable dielectric materials, such as TEOS oxide, un-doped silicate glass, or doped silicon oxide such as BPSG, FSG, PSG, BSG, and/or other suitable dielectric materials. Formation of the metal vias 240A and the metallization layer 250A includes, for example, etching a trench in the interlayer dielectric layer DL4, etching via openings in the interlayer dielectric layer DL4 to expose the metal lines 162A and 166A, depositing one or more conductive materials in the trench and the via openings, and planarizing the one or more conductive materials by using, for example, a CMP process. The one or more conductive materials may include, for example, W, Ru, Co, Cu, Ti, TiN, Ta, TaN, Mo, Ni, other metal, or combinations thereof. Remaining portions of the one or more conductive materials in the trench may form the metallization layer 250A (e.g., the metal line 252A), remaining portions of the one or more conductive materials in the via openings may form the metal vias 240A. Other details of the present embodiments are similar to those illustrated previously, and therefore not repeated herein.

FIG. 19 is a top view of a semiconductor device 400N2A fabricated using the layout 400N2 of FIG. 13C, in accordance with some embodiments, and thus the semiconductor device 400N2A inherits geometry of the patterns in the layout 400N2. Cross-sectional views of the semiconductor device 400N2A may be similar to FIGS. 18B-18E of the semiconductor device 400N1A, except that the metal vias 240A and the metal line 252A of the semiconductor device 400N2A are removed. Other details of the semiconductor device 400N2A may be similar to that of the semiconductor device 400N1A in FIGS. 18A-18E, and therefore not repeated herein.

Figure 20A:
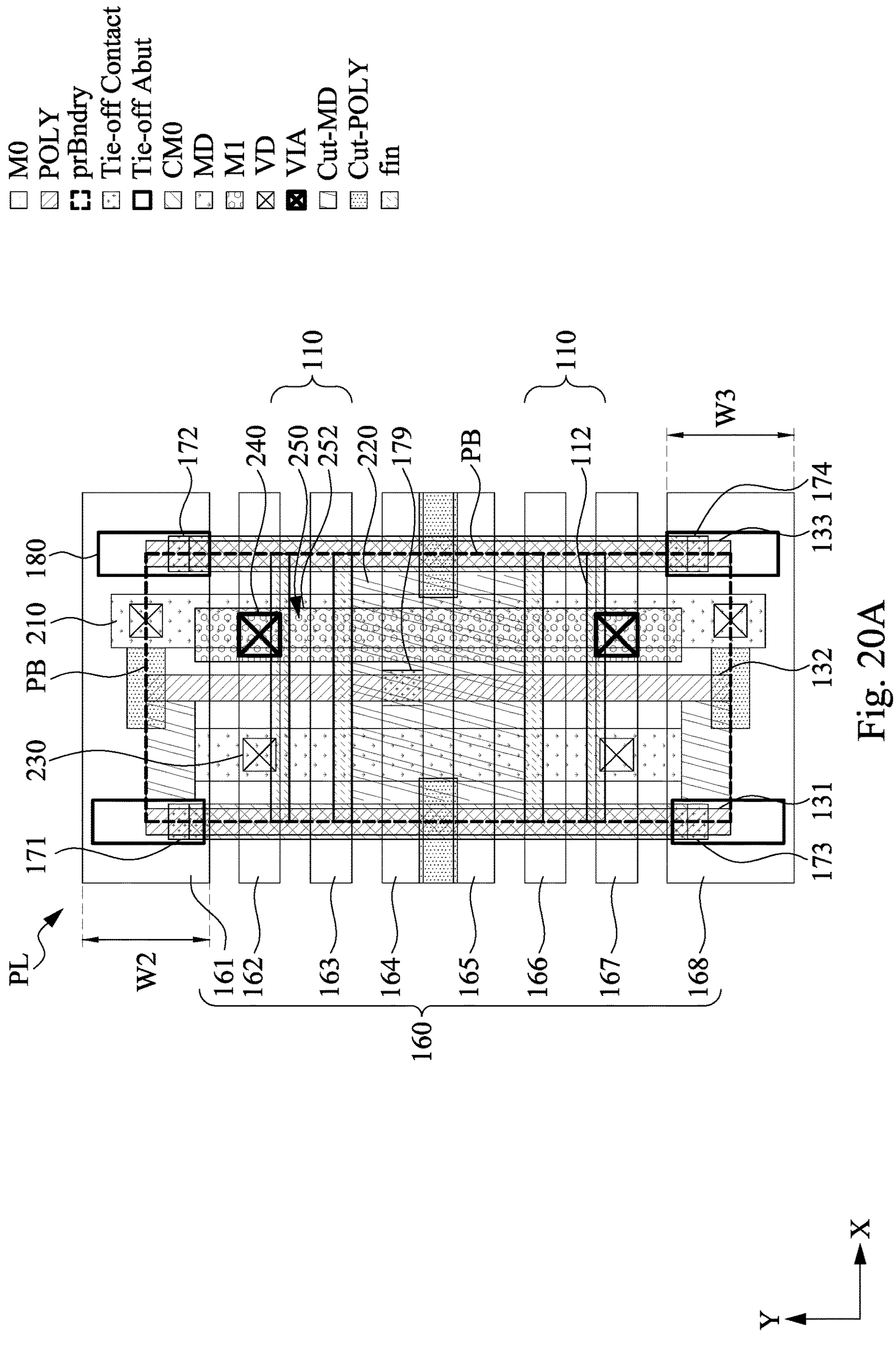
FIGS. 20A-20C illustrate a method of drawing a layout of an inverter, in accordance with some embodiments.
Figure 20B:
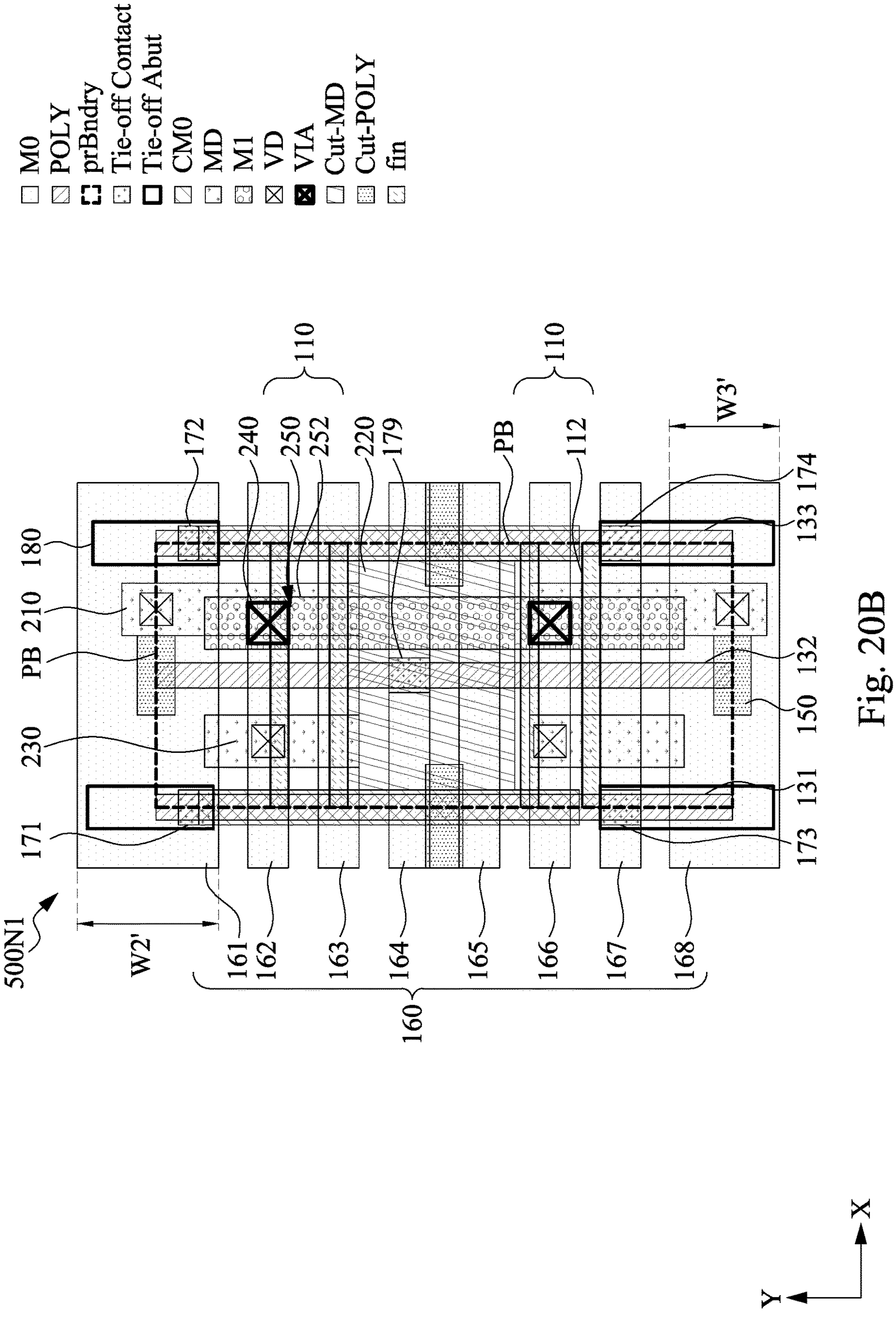
Figure 20C:
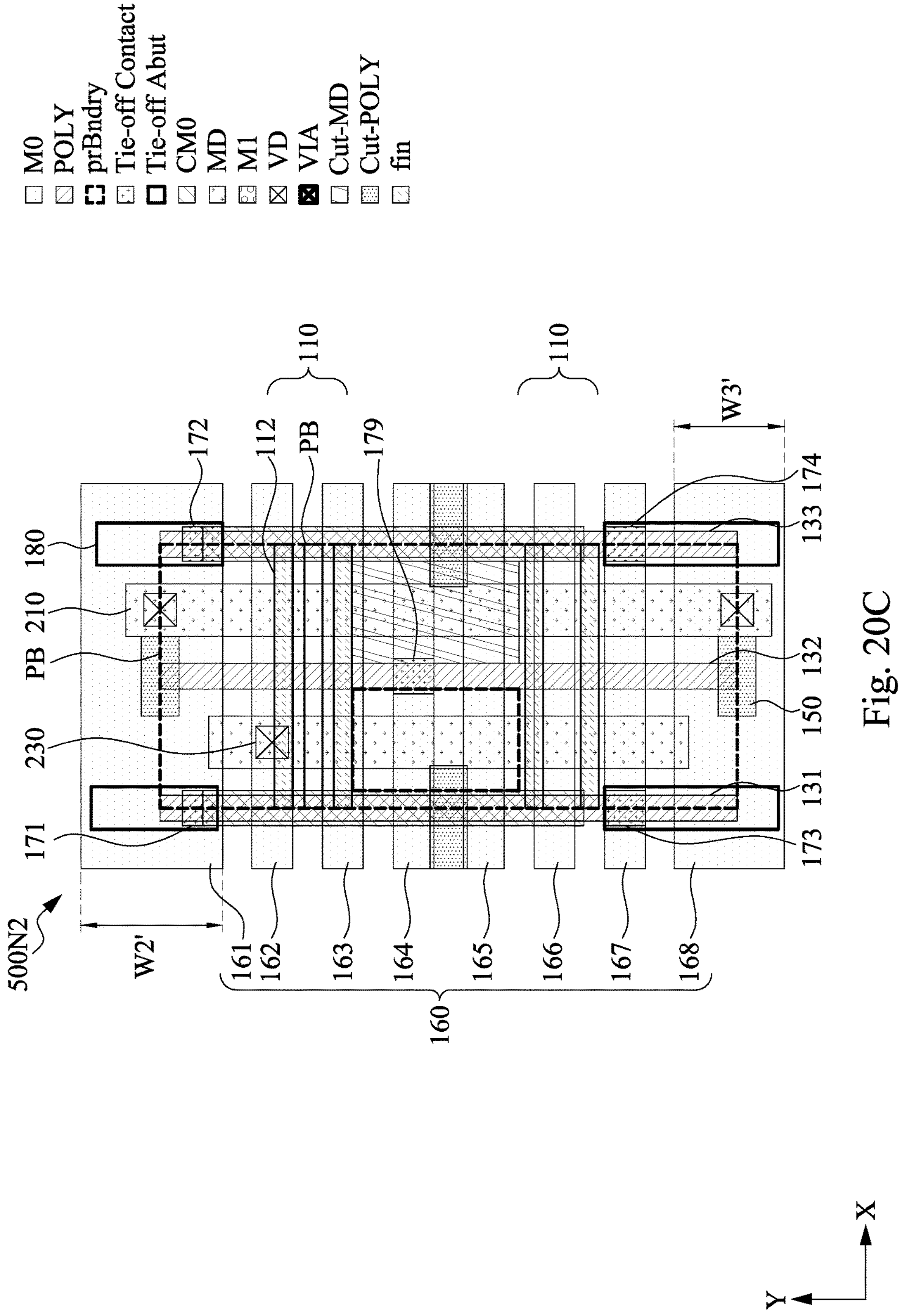

FIGS. 20A-20C illustrate a method of drawing a layout of an inverter, in accordance with some embodiments. The method of drawing the layout in FIGS. 20A-20C attempts to increase the Vdd line width and decrease the Vss line width. It is understood that additional steps may be provided before, during, and after the steps shown in FIGS. 20A-20C, and some of the steps described below can be replaced or eliminated for additional embodiments of the method. The order of the operations/processes may be interchangeable.

FIG. 20A shows a primary layout PL of an inverter. The primary layout PL may include gate layout patterns 131, 132, 133, cut-gate layout patterns 150, a metallization layer 160 including metal line layout patterns 161-168, tie-off contact layout patterns 171-174, a gate contact layout pattern 179, tie-off abut layout patterns 180, cut-metal-line layout patterns 190, source/drain contact layout patterns 210, a cut-contact layout pattern 220, source/drain via layout patterns 230, metal via layout patterns 240, and an upper metallization layout pattern 250 including upper metal line layout pattern 252. In the present embodiments, the gate layout patterns 131 and 133 are dummy gates at left and right sides of the boundary PB of the layout PL, and the gate layout pattern 132 is an active gate between the dummy gate layout patterns 131 and 133.

The tie-off contact layout pattern 171 overlaps an intersection of the gate layout pattern 131 and the Vdd line layout pattern 161, thus providing an electrical connection between the gate layout pattern 131 and the Vdd line layout pattern 161. In the present embodiments, the tie-off contact layout pattern 172 overlaps an intersection of the gate layout pattern 133 and the Vdd line layout pattern 161, thus providing an electrical connection between the gate layout pattern 133 and the Vdd line layout pattern 161. The tie-off contact layout pattern 173 overlaps an intersection of the gate layout pattern 131 and the Vss line layout pattern 168, thus providing an electrical connection between the gate layout pattern 131 and the Vss line layout pattern 168. The tie-off contact layout pattern 174 overlaps an intersection of the gate layout pattern 133 and the Vss line layout pattern 168, thus providing an electrical connection between the gate layout pattern 133 and the Vss line layout pattern 168. In the present embodiments, the gate contact layout pattern 179 may overlap an intersection of the gate layout pattern 132 and the metal line layout pattern 164, thus providing an electrical connection between the gate layout pattern 132 and the metal line layout pattern 164. The fin group layout patterns 110 including the fin layout patterns 112 are omitted herein for sake of brevity. Other details of these components are similar to those aforementioned, and not repeated for sake of brevity.

Reference is made to FIG. 20B. The aforementioned first and second layout modification steps are performed to the primary layout PL in FIG. 20A, and a layout 500N1 is obtained. As illustrated in FIG. 1B, the first modification step includes moving the tie-off contact layout pattern 173 and 174 from the Vss line layout pattern 168 to the metal line layout pattern 167. As illustrated in FIG. 1C, the second modification step includes increasing the width of the Vdd line layout pattern 161, decreasing the width of Vss line layout pattern 168, and shifting/moving the metal line layout pattern 162-167 toward the Vss line layout pattern 168 away from the Vdd line layout pattern 161. For example, the width W2 of the Vdd line layout pattern 161 in FIG. 20A is increased to be a width W2' in FIG. 20B, and the width W3 of the Vss line layout pattern 168 in FIG. 20A is decreased to be a width W3' in FIG. 20B. Other details of FIG. 20B are similar to those illustrated in FIGS. 1A-1D, and thereto not repeated herein.

Reference is made to FIG. 20C. A fourth layout modification step is optionally performed to the layout 500N1 in FIG. 20B, and a layout 500N2 is obtained. As illustrated in FIG. 20C, the fourth layout modification step includes removing a portion of the cut-contact layout pattern 220 (indicated by the dashed block DB) over one of the source/drain contact layout patterns 210 for the drain-to-drain connection. By the fourth modification step, the drain-to-drain connection can be built by a single continuous source/drain contact layout pattern 210, without using the metal line layout pattern 162/166, the metal via layout patterns 240 and the upper metal line layout pattern 252 (referring to FIG. 20B). The metal via layout patterns 240 and the upper metal line layout pattern 252 (referring to FIG. 20B) are removed in FIG. 18C. Other details of FIG. 20C are similar to those illustrated in FIG. 20B, and thereto not repeated herein.

Figure 21A:
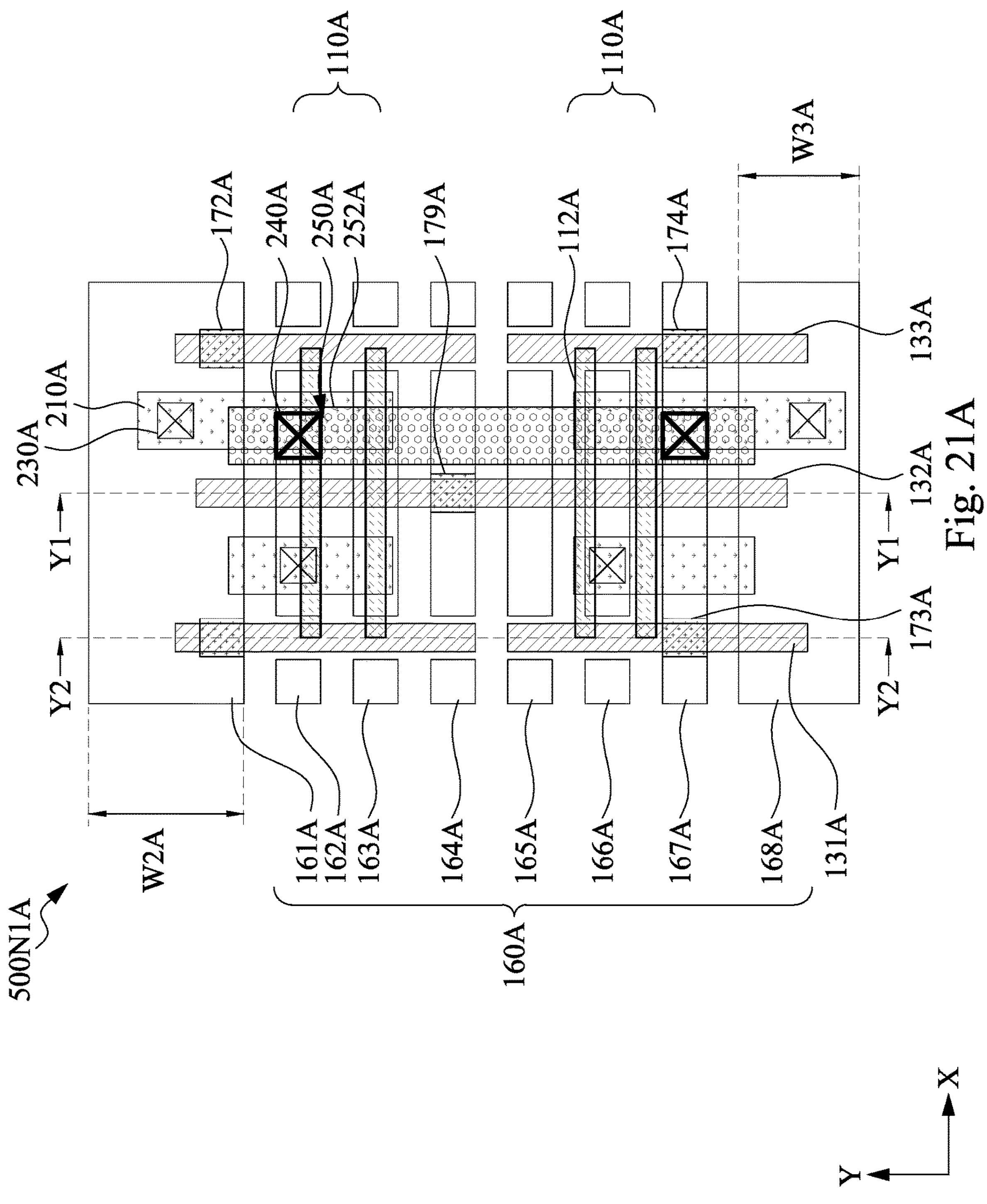
FIGS. 21A-21C are views of an inverter fabricated using the layout of FIG. 20B, in accordance with some embodiments.
Figure 21B:
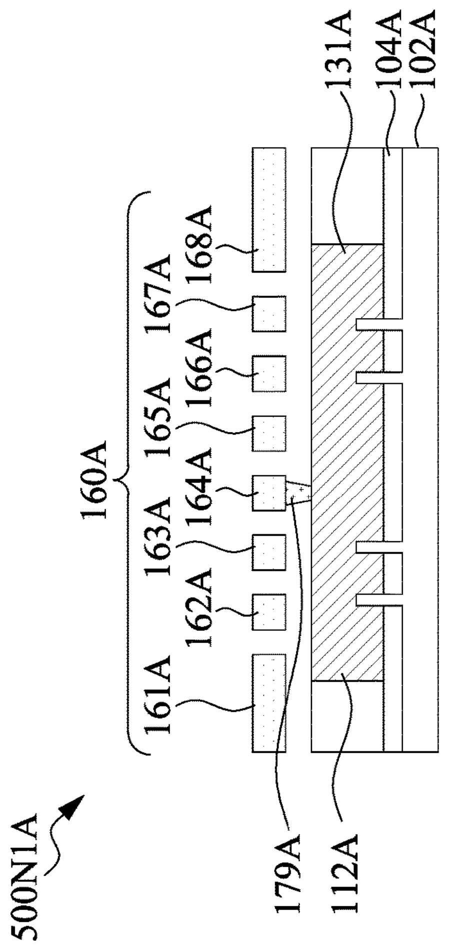
Figure 21C:
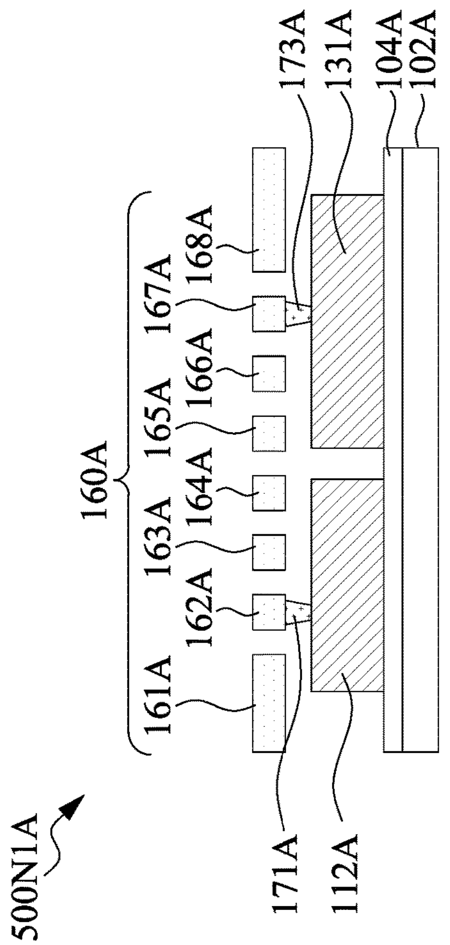

FIGS. 21A-21C are views of an inverter 500N1A fabricated using the layout of FIG. 20B, in accordance with some embodiments. FIG. 21A is a top view of the inverter 500N1A. FIGS. 21B and 21C are cross-sectional views taken along line Y1-Y1 and line Y2-Y2 of FIG. 21A. In the present embodiments, the gate layout patterns 131-133 of the layout 500N1 (referring to FIG. 20B) define corresponding gate structures 131A, 132A, and 133A of the inverter 500N1A. The metallization layout pattern 160 (e.g., metal line layout patterns 161-168) of the layout 500N1 (referring to FIG. 20B) define corresponding metallization layer 160A (e.g., metal lines 161A-168A) of the inverter 500N1A. The tie-off contact layout patterns 171, 172, 173, and 174 of the layout 500N1 (referring to FIG. 20B) define corresponding tie-off contacts 171A, 172A, 173A, and 174A of the inverter 500N1A. The gate contact layout pattern 179 of the layout 500N1 (referring to FIG. 20B) define corresponding gate contact 179A of the inverter 500N1A. The gate contact 179A and the tie-off contacts 171A, 172A, 173A, and 174A are at the same level. The source/drain contact layout patterns 210 of the layout 500N1 (referring to FIG. 20B) define corresponding source/drain contacts 210A of the inverter 500N1A. The source/drain via layout patterns 230 of the layout 500N1 (referring to FIG. 20B) define corresponding source/drain vias 230A of the inverter 500N1A. The metal via layout patterns 240 of the layout 500N1 (referring to FIG. 20B) define corresponding metal vias 240A of the inverter 500N1A. The upper metallization layout pattern 250 (e.g., metal line layout pattern 252 of the layout 500N1 (referring to FIG. 20B) define corresponding metallization layer 250A (e.g., metal line 252A) of the inverter 500N1A.

The gate contact 179A may be fabricating by the same process as the tie-off contacts 171A, 172A, 173A, and 174A. Formation of the tie-off contacts 171A-174A and the gate contact 179A may include etching tie-off contact openings and gate contact openings in the interlayer dielectric layer DL2 (referring to FIGS. 16B-16E) over the gate structures 131A-134A, depositing one or more conductive materials in the tie-off contact openings and the and gate contact openings, and planarizing the one or more conductive materials by using, for example, a CMP process. The one or more conductive materials may include, for example, W, Ru, Co, Cu, Ti, TiN, Ta, TaN, Mo, Ni, other metal, or combinations thereof. Remaining portions of the one or more conductive materials in the tie-off contact openings and the and gate contact openings may form the tie-off contacts 171A, 172A, 173A, and 174A and the gate contact 179A.

Figure 22:
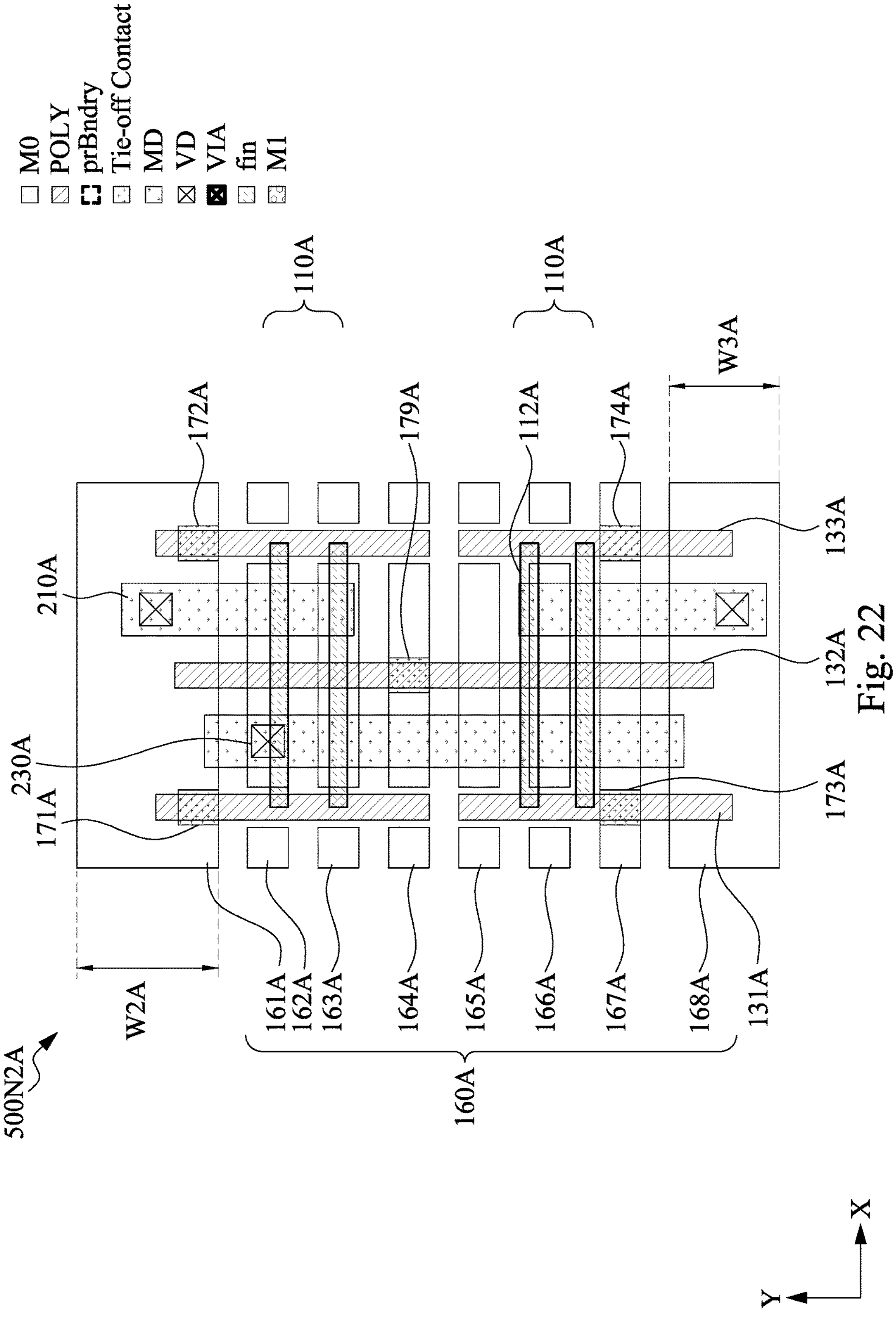
FIG. 22 is a top view of an inverter fabricated using the layout of FIG. 20C, in accordance with some embodiments.

FIG. 22 is a top view of an inverter 500N2A fabricated using the layout 500N2 of FIG. 20C, in accordance with some embodiments. In the present embodiments, the gate layout patterns 131-133 of the layout 500N2 (referring to FIG. 20C) define corresponding gate structures 131A, 132A, and 133A of the inverter 500N2A. The metallization layout pattern 160 (e.g., metal line layout patterns 161-168) of the layout 500N2 (referring to FIG. 20C) define corresponding metallization layer 160A (e.g., metal lines 161A-168A) of the inverter 500N2A. The tie-off contact layout patterns 171, 172, 173, and 174 of the layout 500N2 (referring to FIG. 20C) define corresponding tie-off contacts 171A, 172A, 173A, and 174A of the inverter 500N2A. The gate contact layout pattern 179 of the layout 500N2 (referring to FIG. 20C) define corresponding gate contact 179A of the inverter 500N2A. The gate contact 179A and the tie-off contacts 171A, 172A, 173A, and 174A are at the same level. The source/drain contact layout patterns 210 of the layout 500N2 (referring to FIG. 20C) define corresponding source/drain contacts 210A of the inverter 500N2A. The source/drain via layout patterns 230 of the layout 500N2 (referring to FIG. 20C) define corresponding source/drain vias 230A of the inverter 500N2A.

Figure 23A:
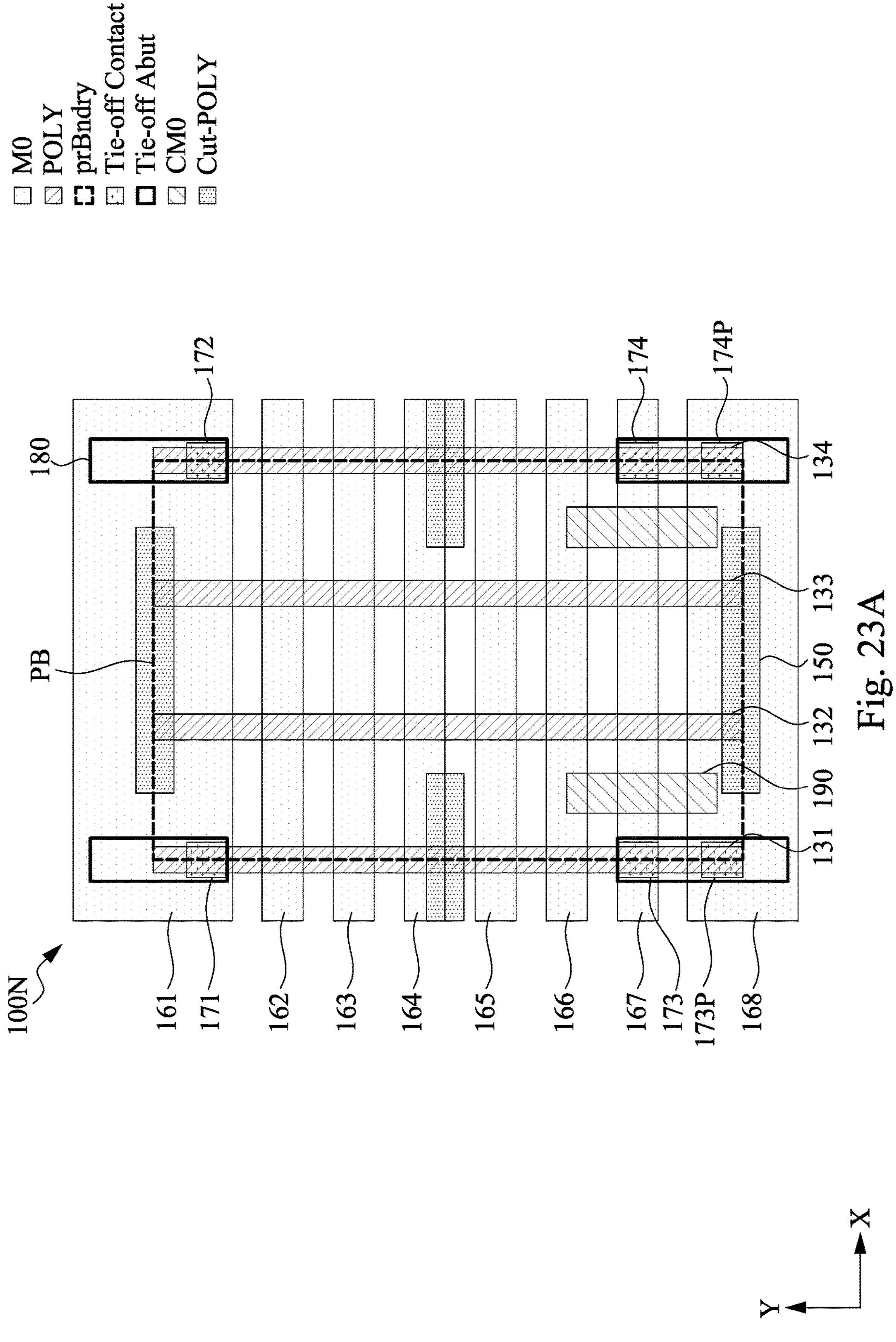
FIG. 23A is a layout of a semiconductor device, in accordance with some embodiments.
Figure 23B:
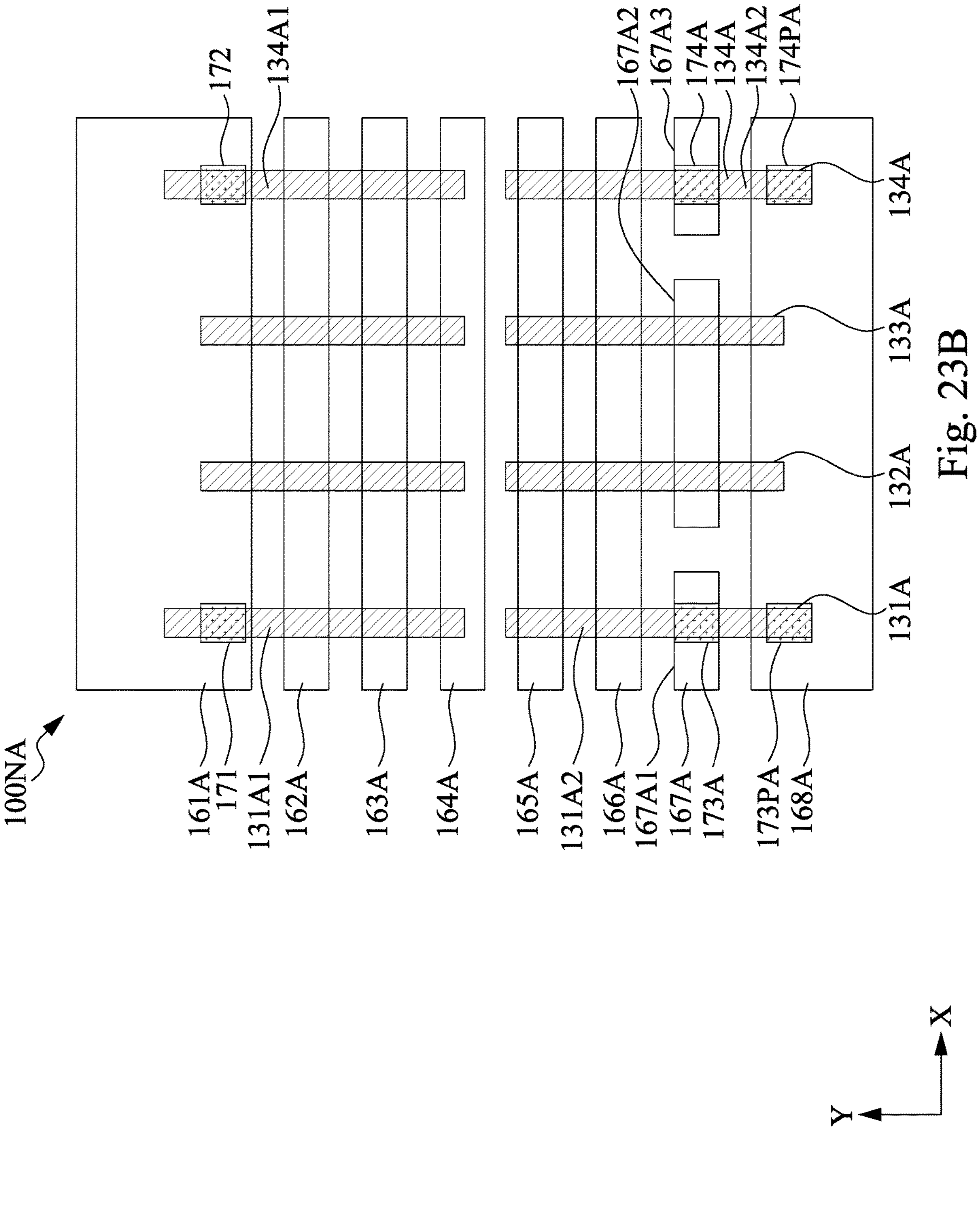
FIG. 23B is a top view of a semiconductor device fabricated using the layout of FIG. 23A, in accordance with some embodiments.

FIG. 23A is a layout 100N of a semiconductor device, in accordance with some embodiments. FIG. 23B is a top view of a semiconductor device 100NA fabricated using the layout 100N of FIG. 23A, in accordance with some embodiments. In the present embodiments, a portion of the gate structure bridges between a power line and a neighboring metal line for power supply. The layout 100N (as obtained in FIGS. 1C and 1D) may further include tie-off contact layout patterns 173P and 174P. The tie-off contact layout pattern 173 is at an intersection of the gate layout pattern 131 and the Vss line layout pattern 168. The tie-off contact layout pattern 174 is at an intersection of the gate layout pattern 134 and the Vss line layout pattern 168. Through the configuration, the semiconductor device 100NA may include tie-off contacts 173PA and 174PA. The tie-off contact 173PA is at an intersection of the gate structure 131A and the Vss line 168A, thus providing an electrical connection between the gate structure 131A and the Vss line 168A. The tie-off contact 174PA is at an intersection of the gate structure 134A and the Vss line 168A, thus providing an electrical connection between the gate structure 134A and the Vss line 168A.

Through the metal routing, the metal line 167A1 can be electrically connected to the Vss power supply, for example, through Vss line 168A, the tie-off contacts 173A and 173PA and the gate structure 131A2, and the metal line 167A3 can be electrically connected to the Vss power supply, for example, through Vss line 168A, the tie-off contacts 174A and 174PA and the gate structure 134A2. The metal line 162A2 between the metal lines 162A1 and 162A3 and the metal lines 163A-167A can be used for internal routing and are biased with different voltages than the Vdd line 161A, the Vss line 168A, and the metal lines 162A1 and 162A3.

In the present embodiments where a width of the Vdd line 161A is increased, a portion of the gate structure 131A2/134A2 is used to bridge between the Vss line 168A and the neighboring metal line 167A1/167A3 with additional tie-off contact 173PA/174PA over the Vss line 168A for Vss power supply. In some other embodiments where a width of the Vss line 168A is increased, as shown in FIG. 4A, a portion of the gate structure 131A1/134A1 can be used to bridge between the Vdd line 161A and the neighboring metal line 162A1/162A3 with additional tie-off contact over the Vdd line 161A for Vdd power supply. Other details of the present embodiments are similar to those illustrated before, and thereto not repeated herein.

Figure 24A:
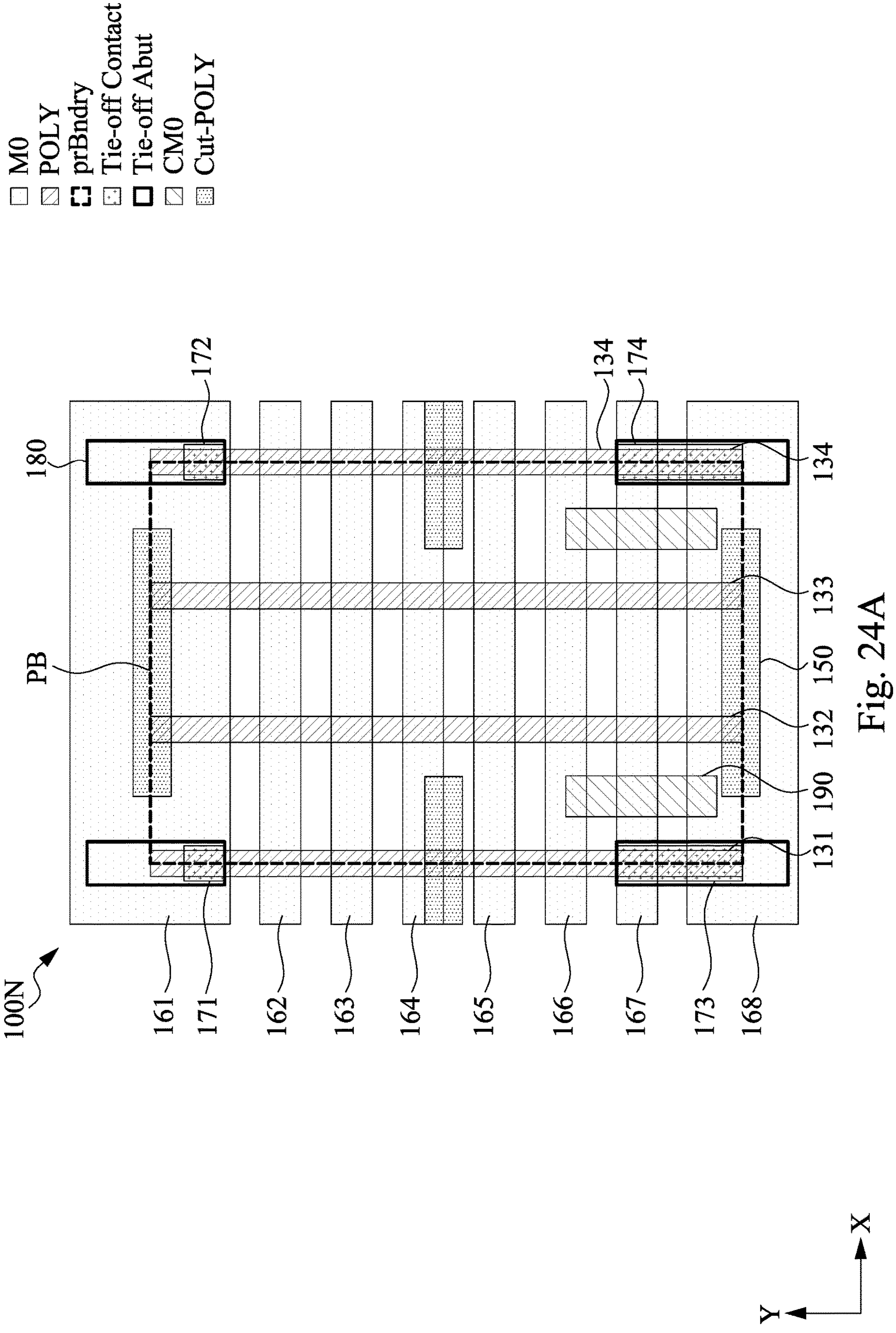
FIG. 24A is a layout of a semiconductor device, in accordance with some embodiments.
Figure 24B:
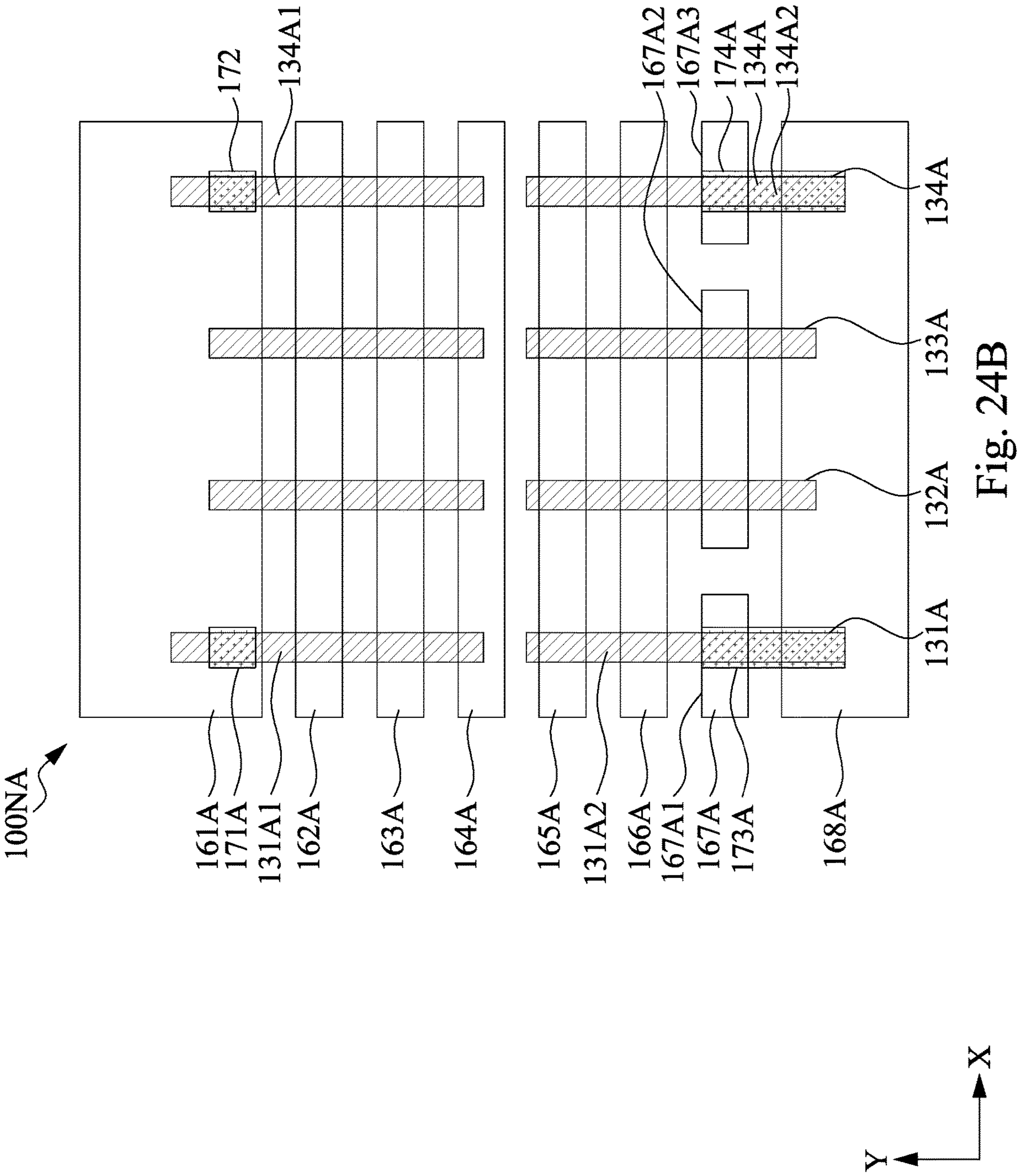
FIG. 24B is a top view of a semiconductor device fabricated using the layout of FIG. 24A, in accordance with some embodiments.

FIG. 24A is a layout of a semiconductor device, in accordance with some embodiments. FIG. 24B is a top view of a semiconductor device fabricated using the layout of FIG. 24A, in accordance with some embodiments. In the present embodiments, the tie-off contact layout patterns over the metal lines are extended in the tie-off abut layout patterns 180 to reach a neighboring power line for power supply. In the layout 100N (as obtained in FIGS. 1C and 1D), tie-off contact layout patterns 173 and 174 may be extended to across the Vss line layout pattern 168 and the metal line layout pattern 167A. Through the configuration, the semiconductor device 100NA may have the metal line 167A1 electrically connected to the Vss power supply, for example, through the Vss line 168A and the tie-off contact 173A, and the metal line 167A3 electrically connected to the Vss power supply, for example, through Vss line 168A and the tie-off contact 174A. The metal line 162A2 between the metal lines 162A1 and 162A3 and the metal lines 163A-167A can be used for internal routing and are biased with different voltages than the Vdd line 161A, the Vss line 168A, and the metal lines 162A1 and 162A3.

In the present embodiments where a width of the Vdd line 161A is increased, the tie-off contact 173A/174A is extended to provide electrical connection between the Vss line 168A and the neighboring metal line 167A1/167A3 for Vss power supply. In some other embodiments where a width of the Vss line 168A is increased, as shown in FIG. 4A, the tie-off contact 171A/172A can be extended to provide electrical connection between the Vdd line 161A and the neighboring metal line 162A1/162A3 for Vdd power supply. Other details of the present embodiments are similar to those illustrated before, and thereto not repeated herein.

Figure 25A:
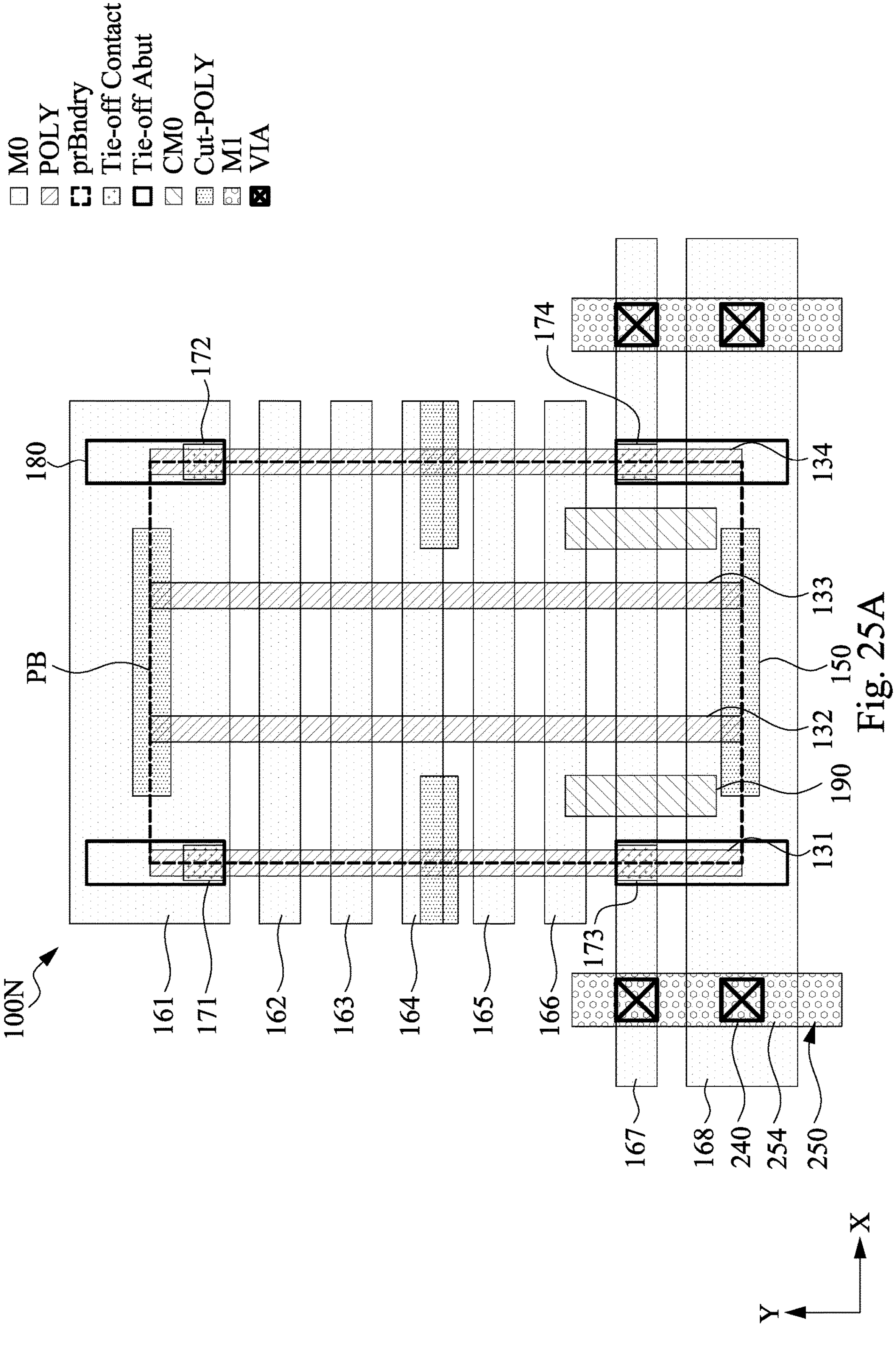
FIG. 25A is a layout of a semiconductor device, in accordance with some embodiments.
Figure 25B:
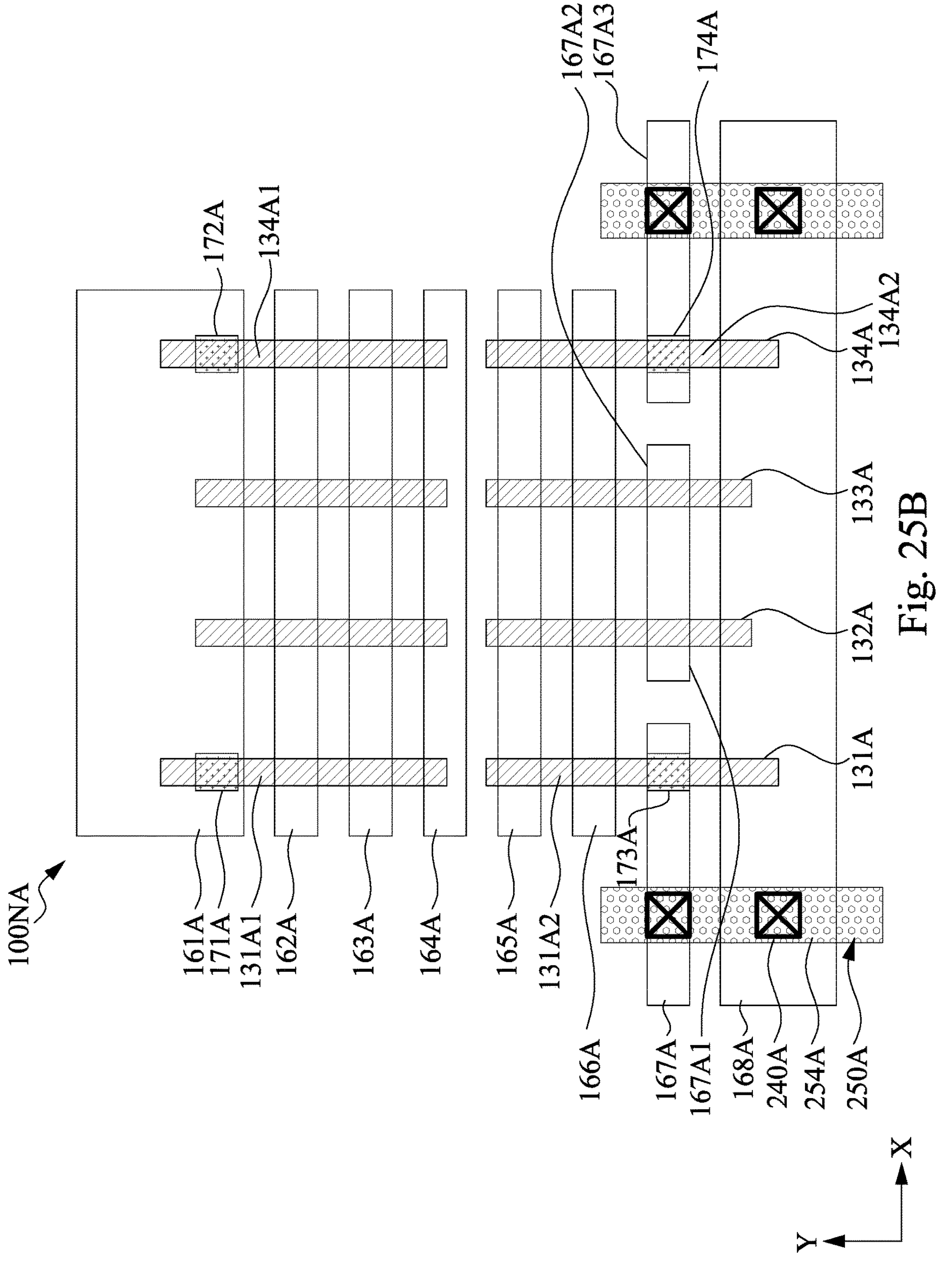
FIG. 25B is a top view of a semiconductor device fabricated using the layout of FIG. 25A, in accordance with some embodiments.

FIG. 25A is a layout of a semiconductor device, in accordance with some embodiments. FIG. 25B is a top view of a semiconductor device fabricated using the layout of FIG. 25A, in accordance with some embodiments. In the present embodiments, the upper metallization layout pattern 250 may include upper metal line layout patterns 254 for supplying power to the metal line layout patterns overlapping the tie-off contact layout patterns. In the layout 100N (as obtained in FIGS. 1C and 1D), the upper metallization layout pattern 250 is designed to include the upper metal line layout patterns 254 electrically connected to the metal line layout pattern 167 through the metal via layout patterns 240. Through the configuration, the semiconductor device 100NA may have the metal lines 167A1 and 167A3 electrically connected to the Vss power supply, for example, through the upper metal line 254A of the metallization layer 250A and the metal vias 240A. The metal line 162A2 between the metal lines 162A1 and 162A3 and the metal lines 163A-167A can be used for internal routing and are biased with different voltages than the Vdd line 161A, the Vss line 168A, and the metal lines 162A1 and 162A3.

In the present embodiments where a width of the Vdd line 161A is increased, the upper metal line 254A is used to provide electrical connection between the Vss line 168A and the neighboring metal line 167A1/167A3 for Vss power supply. In some other embodiments where a width of the Vss line 168A is increased, as shown in FIG. 4A, the upper metal line 254A can be used to provide electrical connection between the Vdd line 161A and the neighboring metal line 162A1/162A3 for Vdd power supply. Other details of the present embodiments are similar to those illustrated before, and thereto not repeated herein.

Figure 26:
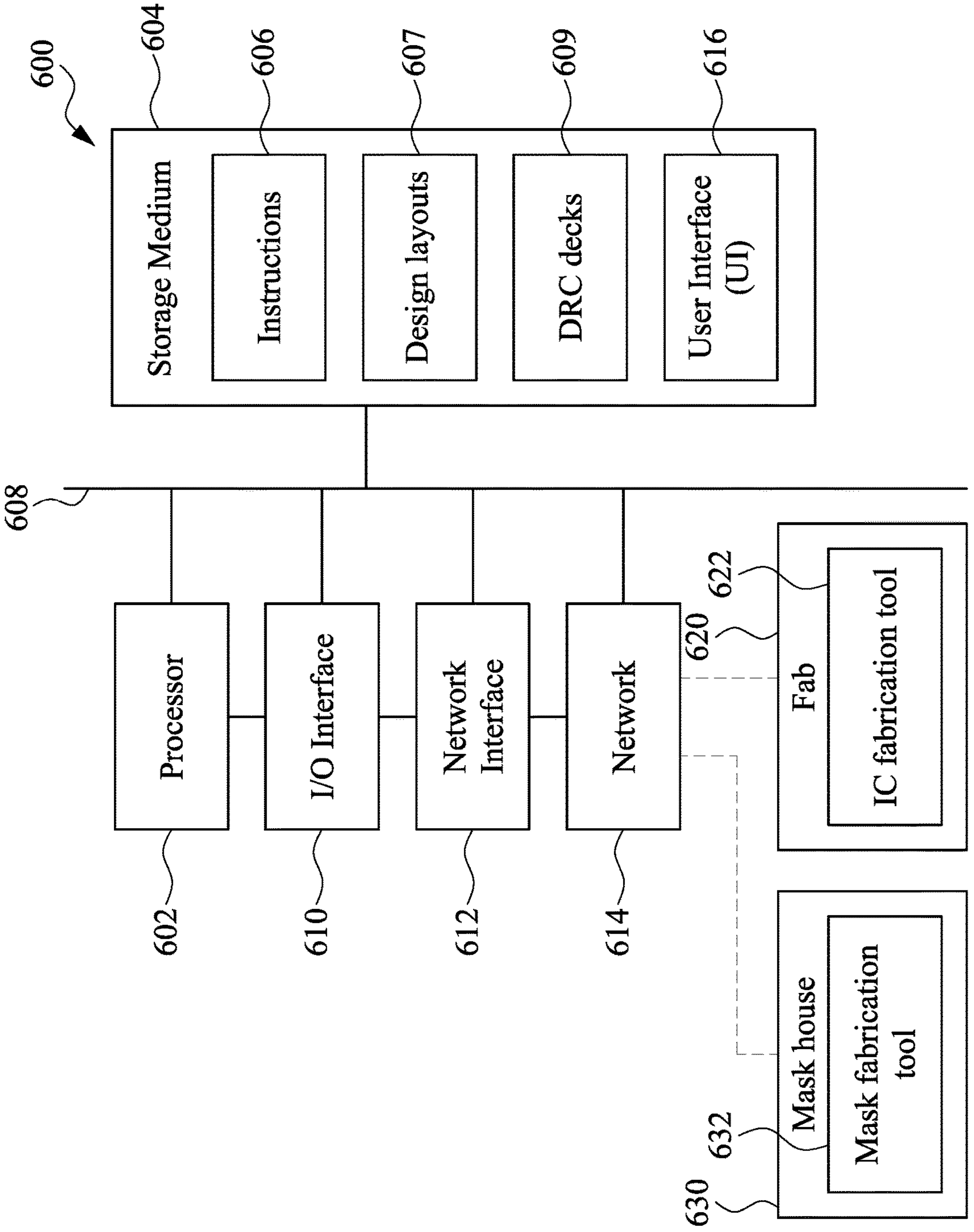
FIG. 26 is a schematic diagram of a system for designing a layout of a semiconductor device, in accordance with some embodiments.

FIG. 26 is a schematic diagram of an electronic design automation (EDA) system 600, in accordance with some embodiments. Methods described herein of generating aforementioned design layouts, e.g., layouts 100N, 100P, 200N, 200P, 300N, 400N1, 400N2, 500N1, and 500N2, in accordance with one or more embodiments, are implementable, for example, using EDA system 600, in accordance with some embodiments. In some embodiments, EDA system 600 is a general purpose computing device including a hardware processor 602 and a non-transitory, computer-readable storage medium 604. Computer-readable storage medium 604, amongst other things, is encoded with, i.e., stores, a set of executable instructions 606, design layouts 607, design rule check (DRC) decks 609 or any intermediate data for executing the set of instructions. Each design layout 607 comprises a graphical representation of an integrated chip, such as for example, a GSII file. Each DRC deck 609 comprises a list of design rules specific to a semiconductor process chosen for fabrication of a design layout 607. For example, aforementioned of the nanoscale enclosure for the tie-off contact is determined by one of the DRC rules. Execution of instructions 606, design layouts 607 and DRC decks 609 by hardware processor 602 represents (at least in part) an EDA tool which implements a portion or all of, e.g., the methods described herein in accordance with one or more (hereinafter, the noted processes and/or methods).

Processor 602 is electrically coupled to computer-readable storage medium 604 via a bus 608. Processor 602 is also electrically coupled to an I/O interface 610 by bus 608. A network interface 612 is also electrically connected to processor 602 via bus 608. Network interface 612 is connected to a network 614, so that processor 602 and computer-readable storage medium 604 are capable of connecting to external elements via network 614. Processor 602 is configured to execute instructions 606 encoded in computer-readable storage medium 604 in order to cause EDA system 600 to be usable for performing a portion or all of the noted processes and/or methods. In one or more embodiments, processor 602 is a central processing unit (CPU), a multi-processor, a distributed processing system, an application specific integrated circuit (ASIC), and/or a suitable processing unit.

In one or more embodiments, computer-readable storage medium 604 is an electronic, magnetic, optical, electromagnetic, infrared, and/or a semiconductor system (or apparatus or device). For example, computer-readable storage medium 604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 604 includes a compact disk-read only memory (CD-ROM), a compact disk-read/write (CD-R/W), and/or a digital video disc (DVD).

In one or more embodiments, computer-readable storage medium 604 stores instructions 606, design layouts 607 (e.g., layouts 100, 200, 300, 400 and 500 discussed previously) and DRC decks 609 configured to cause EDA system 600 (where such execution represents (at least in part) the EDA tool) to be usable for performing a portion or all of the noted processes and/or methods. In one or more embodiments, storage medium 604 also stores information which facilitates performing a portion or all of the noted processes and/or methods.

EDA system 600 includes I/O interface 610. I/O interface 610 is coupled to external circuitry. In one or more embodiments, I/O interface 610 includes a keyboard, keypad, mouse, trackball, trackpad, touchscreen, and/or cursor direction keys for communicating information and commands to processor 602.

EDA system 600 also includes network interface 612 coupled to processor 602. Network interface 612 allows EDA system 600 to communicate with network 614, to which one or more other computer systems are connected. Network interface 612 includes wireless network interfaces such as BLUETOOTH, WIFI, WIMAX, GPRS, or WCDMA; or wired network interfaces such as ETHERNET, USB, or IEEE-1366. In one or more embodiments, a portion or all of noted processes and/or methods, is implemented in two or more EDA systems 600.

EDA system 600 is configured to receive information through I/O interface 610. The information received through I/O interface 610 includes one or more of instructions, data, design rules, libraries of standard cells, and/or other parameters for processing by processor 602. The information is transferred to processor 602 via bus 608. EDA system 600 is configured to receive information related to a user interface (UI) 616 through I/O interface 610. The information is stored in computer-readable medium 604 as UI 616.

In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 27:
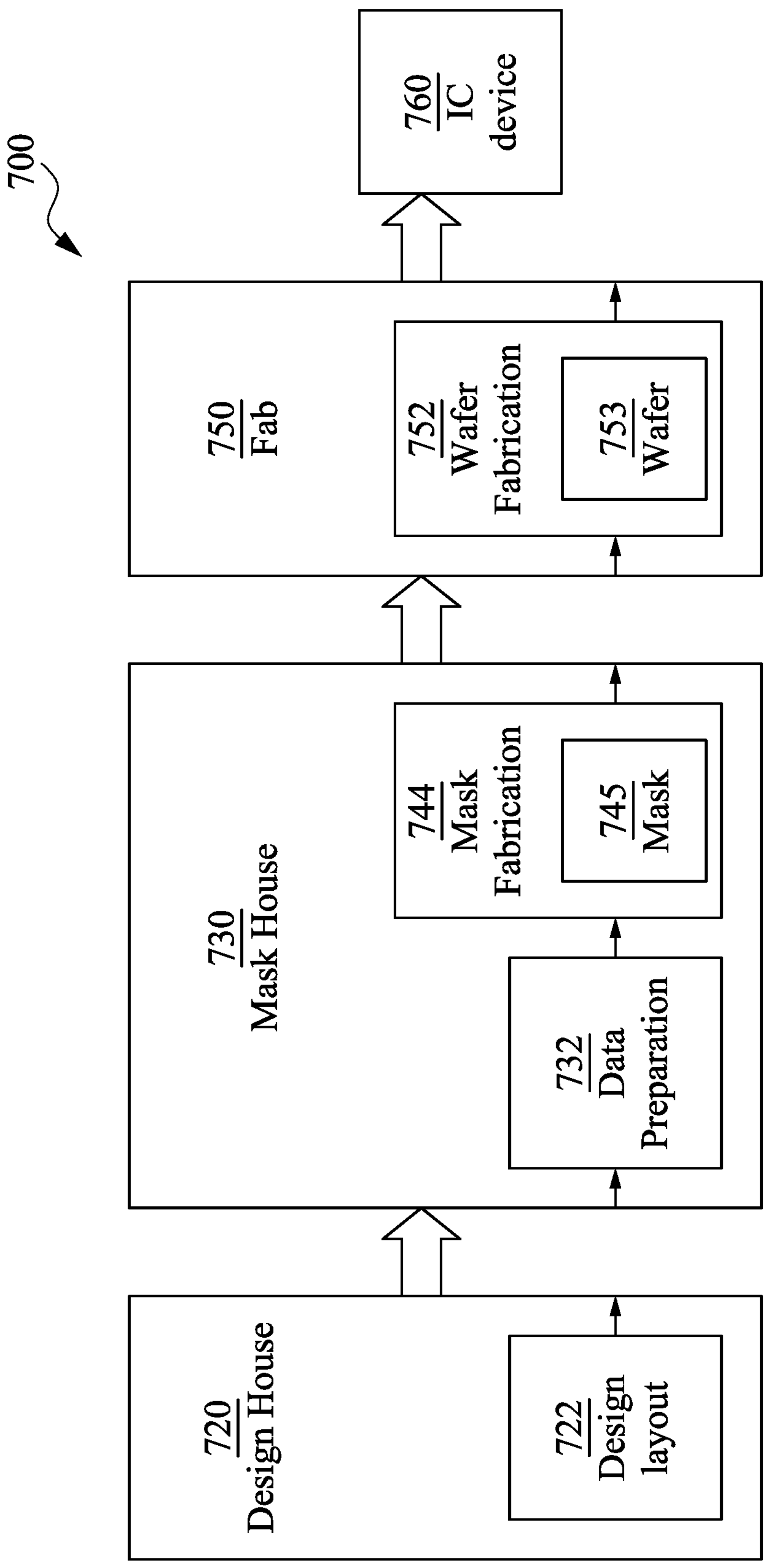
FIG. 27 is a block diagram of a semiconductor device manufacturing system, in accordance with some embodiments.

FIG. 27 is a block diagram of a semiconductor device manufacturing system 700, and a device manufacturing flow associated therewith, in accordance with some embodiments. In some embodiments, based on design layout, e.g., layouts 100N, 100P, 200N, 200P, 300N, 400N1, 400N2, 500N1, and 500N2, at least one of one or more photomasks or at least one component in a layer of a semiconductor device is fabricated using manufacturing system 700.

In FIG. 27, a device manufacturing system 700 includes entities, such as a design house 720, a mask house 730, and a semiconductor device manufacturer/fabricator ("fab") 750, that interact with one another in the design, development, and manufacturing cycles and/or services related to manufacturing semiconductor devices 760. The entities in device manufacturing system 700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 720, mask house 730, and fab 770 is owned by a single larger company. In some embodiments, two or more of design house 720, mask house 730, and fab 770 coexist in a common facility and use common resources.

Design house (or design team) 720 generates design layouts 722 (e.g., layouts 100, 200, 300, 400 and/or 500). Design layouts 722 include various geometrical patterns designed for semiconductor devices 760 (e.g., semiconductor devices 100A, 200A, 300A, 400A and/or 500A). The geometrical patterns correspond to patterns of metal, oxide, or semiconductor layers that make up the various components of semiconductor devices 760 to be fabricated. The various layers combine to form various device features. For example, a portion of design layout 722 includes various circuit features, such as semiconductor fins, gate structures, gate contacts, source/drain contacts, source/drain vias, and metal lines and/or vias of interconnection, to be formed on a substrate (such as a silicon wafer). Design house 720 implements a proper design procedure to form design layout 722. The design procedure includes one or more of logic design, physical design or place and route. Design layout 722 is presented in one or more data files having information of the geometrical patterns and a netlist of various nets. For example, design layout 722 can be expressed in a GDSII file format or DFII file format.

Mask house 730 includes data preparation 732 and mask fabrication 744. Mask house 730 uses design layout 722 (e.g., layout 100, 200, 300, 400 or 500) to manufacture one or more photomasks 745 to be used for fabricating the various layers of semiconductor device 760 according to design layout 722. Mask house 730 performs mask data preparation 732, where design layout 722 is translated into a representative data file ("RDF"). Mask data preparation 732 provides the RDF to mask fabrication 744. Mask fabrication 744 includes a mask writer. A mask writer converts the RDF to an image on a substrate, such as a photomask (reticle) 745 or a semiconductor wafer 753. Design layout 722 is manipulated by mask data preparation 732 to comply with particular characteristics of the mask writer and/or requirements of fab 750. In FIG. 27, mask data preparation 732 and mask fabrication 744 are illustrated as separate elements. In some embodiments, mask data preparation 732 and mask fabrication 744 can be collectively referred to as mask data preparation.

In some embodiments, mask data preparation 732 includes optical proximity correction (OPC) which uses lithography enhancement techniques to compensate for image errors, such as those that can arise from diffraction, interference, other process effects and the like. OPC adjusts design layout 722. In some embodiments, mask data preparation 732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 732 includes a mask rule checker (MRC) that checks design layout 722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies design layout 722 to compensate for limitations during mask fabrication 744, which may undo part of the modifications performed by OPC in order to meet mask creation rules.

In some embodiments, mask data preparation 732 includes lithography process checking (LPC) that simulates processing that will be implemented by fab 770 to fabricate semiconductor device 760. LPC simulates this processing based on design layout 722 to create a simulated manufactured device, such as semiconductor device 760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine design layout 722.

One of ordinary skill would understand that the above description of mask data preparation 732 has been simplified for the purposes of clarity. In some embodiments, data preparation 732 includes additional features such as a logic operation (LOP) to modify design layout 722 according to manufacturing rules. Additionally, the processes applied to design layout 722 during data preparation 732 may be executed in a variety of different orders.

After mask data preparation 732 and during mask fabrication 744, a photomask 745 or a group of photomasks 745 are fabricated based on the design layout 722. In some embodiments, mask fabrication 744 includes performing one or more lithographic exposures based on the design layout 722. In some embodiments, an electron-beam (e-beam) or a mechanism of multiple e-beams is used to form a pattern on a photomask 745 based on design layout 722. Photomask 745 can be formed in various technologies. In some embodiments, photomask 745 is formed using binary technology. In some embodiments, a mask pattern includes opaque regions and transparent regions. A radiation beam, such as an ultraviolet (UV) beam, used to expose the radiation sensitive material layer (e.g., photoresist) which has been coated on a wafer, is blocked by the opaque regions and transmits through the transparent regions. In one example, a binary mask version of photomask 745 includes a transparent substrate (e.g., fused quartz) and an opaque material (e.g., chromium) coated in the opaque regions of the binary mask. In another example, photomask 745 is formed using a phase shift technology. In a phase shift mask (PSM) version of photomask 745, various features in the pattern formed on the phase shift photomask are configured to have proper phase difference to enhance the resolution and imaging quality. In various examples, the phase shift photomask can be attenuated PSM or alternating PSM. The photomask(s) generated by mask fabrication 744 is used in a variety of processes. For example, such a mask(s) is used in an ion implantation process to form various doped regions in semiconductor wafer 753, in an etching process to form various etching regions in semiconductor wafer 753, and/or in other suitable processes.

Fab 750 includes wafer fabrication 752. Fab 750 is an IC fabrication business that includes one or more manufacturing facilities for the fabrication of a variety of different IC products. In some embodiments, fab 750 is a semiconductor foundry. For example, there may be a manufacturing facility for the front-end fabrication of a plurality of IC products (front-end-of-line (FEOL) fabrication), while a second manufacturing facility may provide the back-end fabrication for the interconnection and packaging of the IC products (BEOL fabrication), and a third manufacturing facility may provide other services for the foundry business.

Fab 750 uses photomask(s) 745 fabricated by mask house 730 to fabricate semiconductor devices 760. Thus, fab 750 at least indirectly uses design layout 722 to fabricate semiconductor devices 760. In some embodiments, semiconductor wafer 753 is fabricated by fab 750 using photomask(s) 745 to form semiconductor devices 760. In some embodiments, the device fabrication includes performing one or more photolithographic exposures based at least indirectly on design layout 722. Semiconductor wafer 753 includes a silicon substrate or other proper substrate having material layers formed thereon. Semiconductor wafer 753 further includes one or more of various doped regions, dielectric features, multilevel interconnects, and the like (formed at subsequent manufacturing steps).

Based on the above discussions, it can be observed that the present disclosure offers advantages. It is understood, however, that other embodiments may offer additional advantages, and not all advantages are necessarily disclosed herein, and that no particular advantage is required for all embodiments. One advantage is that by shifting the tie-off structures from a first one of the power rails (either Vdd or Vss) to one of the metal routing tracks (either top or bottom), a width of the first one of the power rails can be decreased, and a width of a second one of the power rails can be increased, thereby providing sufficient enclosure for tie-off structures present on the second one of the power rails and lowering the resistance during power delivery. Another advantage is that one of the power rails (either Vdd or Vss) can have enlarged portions for receiving the tie-off structures present with better power delivery. In addition, the advantage is that with the reduction in the width of one of the power rails, one of the metal routing tracks can be used for superior/better power supply.

In some embodiments of the present disclosure, a semiconductor device includes a first gate structure, a second gate structure, a metallization layer, a first tie-off contact, and a second tie-off contact. The first and second gate structures extend substantially along a first direction and are aligned with each other substantially along the first direction. The metallization layer is over the first and second gate structures. The metallization layer includes a Vdd line, a Vss line, metal lines extending substantially along a second direction different from the first direction. The metal lines are between the Vdd line and the Vss line. The first tie-off contact overlaps an intersection of the first gate structure and a first one of the Vdd line and the Vss line from a top view. The second tie-off contact overlaps an intersection of the second gate structure and a first one of the metal lines from the top view, wherein said first one of the metal lines is adjacent to a second one of the Vdd line and the Vss line.

In some embodiments of the present disclosure, a semiconductor device includes a first gate structure, a second gate structure, a metallization layer, a first tie-off contact, and a second tie-off contact. The first and second gate structures extend substantially along a first direction and are aligned with each other substantially along the first direction. The metallization layer is over the first and second gate structures. The metallization layer includes a first power line, a second power line, and metal lines extending substantially along a second direction different from the first direction. The first power line comprises a plurality of protruding portions facing the second power line from a top view. The metal lines are between the first power line and the second power line. The first tie-off contact overlaps an intersection of the first gate structure and the first one of the protruding portions of the first power line from the top view. The second tie-off contact overlaps an intersection of the second gate structure and the second power line from the top view.

In some embodiments of the present disclosure, a method for fabricating a semiconductor device is provided. The method includes forming a first semiconductor fin and a second semiconductor fin over a substrate, wherein the first and second semiconductor fins extend substantially along a first direction; forming a first gate structure, a second gate structure, and a third gate structure extending along a second direction different from the first direction, wherein the first and second gate structures are aligned with each other along the second direction and respectively at ends of the first and second semiconductor fins, and the third gate structure is across the first semiconductor fin; forming a first tie-off contact and a second tie-off contact over the first and second gate structures, respectively; and forming a metallization layer over the first and second tie-off contacts. The metallization layer includes a first power line overlapping the first tie-off contact from a top view, a second power line, and a plurality of metal lines between the first power line and the second power line. A width of the second power line is less than a width of the first power line. A first one of the metal lines immediately adjacent to the second power line overlaps the second tie-off contact from the top view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a first gate structure extending substantially along a first direction;

a second gate structure extending substantially along the first direction and aligned with the first gate structure substantially along the first direction;

a metallization layer over the first and second gate structures, wherein the metallization layer comprises:

a Vdd line and a Vss line extending substantially along a second direction different from the first direction; and a plurality of metal lines extending substantially along the second direction, wherein the metal lines are between the Vdd line and the Vss line;

a first tie-off contact overlapping an intersection of the first gate structure and a first one of the Vdd line and the Vss line from a top view; and a second tie-off contact overlapping an intersection of the second gate structure and a first one of the metal lines from the top view, wherein said first one of the metal lines is adjacent to a second one of the Vdd line and the Vss line.

2. The semiconductor device of claim 1, wherein a width of the first one of the Vdd line and the Vss line is greater than a width of the second one of the Vdd line and the Vss line.

3. The semiconductor device of claim 1, wherein widths of the Vdd line and the Vss line are greater than a width of the metal lines.

4. The semiconductor device of claim 1, further comprising:

a first semiconductor fin extending substantially along the second direction; and a second semiconductor fin extending substantially along the second direction, wherein the second semiconductor fin spaced apart from the first semiconductor fin along the first direction, and the first gate structure and the second gate structure are at an end of the first semiconductor fin and an end of the second semiconductor fin, respectively.

5. The semiconductor device of claim 4, further comprising:

an isolation structure surrounding the first and second semiconductor fins, wherein the isolation structure has a first portion at the end of the first semiconductor fin and in contact with the first gate structure, and a second portion at the end of the second semiconductor fin and in contact with the second gate structure.

6. The semiconductor device of claim 1, wherein the first gate structure extends beyond an edge of the first tie-off contact away from the second tie-off contact.

7. The semiconductor device of claim 1, wherein the first one of the Vdd line and the Vss line has a first line edge adjacent to the metal lines and a second line edge away from the metal lines, the first tie-off contact has a first edge adjacent to the first line edge and a second edge adjacent to the second line edge, and a first distance between the first edge of the first tie-off contact and the first line edge is less than a second distance between the second edge of the first tie-off contact and the second line edge from the top view.

8. The semiconductor device of claim 7, wherein the first distance between the first edge of the first tie-off contact and the first line edge is less than a third distance between the second edge of the first tie-off contact and an end side of the first gate structure over the first one of the Vdd line and the Vss line from the top view.

9. The semiconductor device of claim 1, wherein the first tie-off contact is between a middle line of the first one of the Vdd line and the Vss line and an edge of the first one of the Vdd line and the Vss line from the top view.

10. A method for fabricating a semiconductor device, comprising:

forming a first semiconductor fin and a second semiconductor fin over a substrate, wherein the first and second semiconductor fins extend substantially along a first direction;

forming a first gate structure, a second gate structure, and a third gate structure extending along a second direction different from the first direction, wherein the first and second gate structures are aligned with each other along the second direction and respectively at ends of the first and second semiconductor fins, and the third gate structure is across the first semiconductor fin;

forming a first tie-off contact and a second tie-off contact over the first and second gate structures, respectively; and forming a metallization layer over the first and second tie-off contacts, wherein the metallization layer comprises:

a first power line overlapping the first tie-off contact from a top view;

a second power line, wherein a width of the second power line is less than a width of the first power line; and a plurality of metal lines between the first power line and the second power line, wherein a first one of the metal lines immediately adjacent to the second power line overlaps the second tie-off contact from the top view.

11. The method of claim 10, further comprising:

forming an isolation structure surrounding the first semiconductor fin and the second semiconductor fin, wherein the isolation structure has a first portion at the end of the first semiconductor fin and in contact with the first gate structure, and a second portion at the end of the second semiconductor fin and in contact with the second gate structure.

12. A semiconductor device, comprising:

a first gate structure extending a first length along a first direction;

a second gate structure extending a second length along the first direction and aligned with the first gate structure along the first direction;

a third gate structure disposed adjacent to the first gate structure and the second gate structure, the third gate structure extending a third length along the first direction, wherein the third length is greater than the first length;

a first power line extending along a second direction across the first gate structure;

a second power line extending along the second direction across the second gate structure;

a first tie-off contact overlapping a region where the first gate structure and the first power line intersect; and a second tie-off contact displaced from a region where the second gate structure and the second power line intersect.

13. The semiconductor device of claim 12, wherein a width of the first power line in the first direction is greater than a width of the second power line in the first direction.

14. The semiconductor device of claim 12, further comprising:

a plurality of metal lines disposed between the first power line and the second power line, wherein the plurality of metal lines have a width less than a width of the second power line.

15. The semiconductor device of claim 14, wherein the second tie-off contact overlaps a region where the second gate structure and one of the plurality of metal lines intersect.

16. The semiconductor device of claim 15, wherein said one of the plurality of metal lines has a length shorter than a length of another one of the plurality of metal lines.

17. The semiconductor device of claim 15, wherein said one of the plurality of metal lines has a length shorter than a length of the first power line.

18. The semiconductor device of claim 12, wherein the first power line is a Vdd line, and the second power line is a Vss line.

19. The semiconductor device of claim 12, further comprising:

a first semiconductor fin extending lengthwise along the second direction; and a second semiconductor fin extending lengthwise along the second direction, wherein the first and second semiconductor fins are disposed between the first power line and the second power line in a top view.

20. The semiconductor device of claim 19, wherein the first gate structure overlaps a longitudinal end of the first semiconductor fin, and the second gate structure overlaps a longitudinal end of the second semiconductor fin.

* * * * *